US010586909B2

(12) United States Patent
Das et al.

(10) Patent No.: US 10,586,909 B2
(45) Date of Patent: Mar. 10, 2020

(54) CRYOGENIC ELECTRONIC PACKAGES AND ASSEMBLIES

(71) Applicant: Massachusetts Institute of Technology, Cambridge, MA (US)

(72) Inventors: Rabindra N. Das, Lexington, MA (US); Eric A. Dauler, Acton, MA (US)

(73) Assignee: MASSACHUSETTS INSTITUTE OF TECHNOLOGY, Cambridge, MA (US)

( * ) Notice: Subject to any disclaimer, the term of this patent is extended or adjusted under 35 U.S.C. 154(b) by 0 days.

(21) Appl. No.: 15/684,269

(22) Filed: Aug. 23, 2017

(65) Prior Publication Data
US 2018/0102470 A1    Apr. 12, 2018

Related U.S. Application Data

(60) Provisional application No. 62/406,510, filed on Oct. 11, 2016.

(51) Int. Cl.
*H01L 23/48* (2006.01)
*H01L 39/06* (2006.01)
(Continued)

(52) U.S. Cl.
CPC ........ *H01L 39/06* (2013.01); *H01L 23/49811* (2013.01); *H01L 23/49827* (2013.01);
(Continued)

(58) Field of Classification Search
CPC . H01L 39/06; H01L 39/045; H01L 23/49888; H01L 23/49827; H01L 25/0652;
(Continued)

(56) References Cited

U.S. PATENT DOCUMENTS 4,316,200 A     2/1982 Ames et al.
4,612,083 A     9/1986 Yasumoto et al.
(Continued)

FOREIGN PATENT DOCUMENTS

WO    WO 2016/025451 A1    2/2016
WO    WO 2016/025478 A1    2/2016
(Continued)

OTHER PUBLICATIONS

Office Action dated Jan. 11, 2018 for U.S. Appl. No. 15/327,239; 33 pages.
(Continued)

*Primary Examiner* — Cuong B Nguyen
*Assistant Examiner* — Samuel Park
(74) *Attorney, Agent, or Firm* — Daly, Crowley, Mofford & Durkee, LLP

(57) ABSTRACT

A cryogenic electronic package includes a circuitized substrate, an interposer, a superconducting multichip module (SMCM) and at least one superconducting semiconductor structure. The at least one superconducting semiconductor structure is disposed over and coupled to the SMCM, and the interposer is disposed between the SMCM and the substrate. The SMCM and the at least one superconducting semiconductor structure are electrically coupled to the substrate through the interposer. A cryogenic electronic assembly including a plurality of cryogenic electronic packages is also provided.

10 Claims, 19 Drawing Sheets

(51) Int. Cl.

| | |
|---|---|
| *H01L 39/24* | (2006.01) |
| *H01L 39/22* | (2006.01) |
| *H01L 23/00* | (2006.01) |
| *H01P 7/08* | (2006.01) |
| *H01L 39/02* | (2006.01) |
| *H01L 23/498* | (2006.01) |
| *H01L 25/065* | (2006.01) |
| *H01L 25/00* | (2006.01) |
| *H01L 39/04* | (2006.01) |
| *H01L 39/12* | (2006.01) |
| *H01L 27/18* | (2006.01) |
| *G06N 10/00* | (2019.01) |
| *H01L 23/538* | (2006.01) |
| *H01L 25/16* | (2006.01) |

(52) U.S. Cl.
CPC ........ *H01L 23/49888* (2013.01); *H01L 24/06* (2013.01); *H01L 24/14* (2013.01); *H01L 24/97* (2013.01); *H01L 25/0652* (2013.01); *H01L 25/50* (2013.01); *H01L 39/025* (2013.01); *H01L 39/045* (2013.01); *H01L 39/12* (2013.01); *H01L 39/223* (2013.01); *H01L 39/2416* (2013.01); *H01L 39/2493* (2013.01); *H01P 7/086* (2013.01); *G06N 10/00* (2019.01); *H01L 23/5386* (2013.01); *H01L 24/13* (2013.01); *H01L 24/16* (2013.01); *H01L 24/32* (2013.01); *H01L 24/48* (2013.01); *H01L 24/73* (2013.01); *H01L 24/83* (2013.01); *H01L 25/167* (2013.01); *H01L 27/18* (2013.01); *H01L 2224/10* (2013.01); *H01L 2224/13109* (2013.01); *H01L 2224/16145* (2013.01); *H01L 2224/32225* (2013.01); *H01L 2224/45014* (2013.01); *H01L 2224/45147* (2013.01); *H01L 2224/45179* (2013.01); *H01L 2224/48091* (2013.01); *H01L 2224/48106* (2013.01); *H01L 2224/48225* (2013.01); *H01L 2224/48227* (2013.01); *H01L 2224/73207* (2013.01); *H01L 2224/73265* (2013.01); *H01L 2225/0651* (2013.01); *H01L 2225/06513* (2013.01); *H01L 2225/06548* (2013.01); *H01L 2225/06589* (2013.01); *H01L 2924/1033* (2013.01); *H01L 2924/10253* (2013.01); *H01L 2924/10271* (2013.01); *H01L 2924/10272* (2013.01); *H01L 2924/10329* (2013.01); *H01L 2924/1306* (2013.01); *H01L 2924/13055* (2013.01); *H01L 2924/13064* (2013.01); *H01L 2924/13091* (2013.01)

(58) Field of Classification Search
CPC ... H01L 23/49811; H01L 39/12; H01L 25/50; H01L 39/223; H01L 24/06; H01L 24/14; H01L 39/025; H01L 39/2493; H01L 39/2416; H01L 24/97; H01L 2224/48225; H01L 2224/73207; H01L 2224/13109; H01L 2225/0651; H01L 2224/73265; H01L 2225/06513; H01L 2225/06548; H01L 2224/16145; H01L 2224/32225; H01L 2224/48091; H01L 23/5386; H01L 24/13; H01L 24/16; H01L 24/32; H01L 24/48; H01L 24/73; H01L 24/83; H01L 2224/48106; H01L 25/167; H01L 2225/06589; H01L 2224/10; H01L 27/18; H01P 7/086; G06N 99/002
See application file for complete search history.

(56) References Cited

U.S. PATENT DOCUMENTS

| | | |
|---|---|---|
| 5,057,877 A | 10/1991 | Briley et al. |
| 5,156,997 A | 10/1992 | Kumar et al. |
| 5,179,070 A | 1/1993 | Harada et al. |
| 5,371,328 A | 12/1994 | Gutierrez et al. |
| 5,650,353 A | 7/1997 | Yoshizawa et al. |
| 5,773,875 A | 6/1998 | Chan |
| 6,108,214 A | 8/2000 | Fuse |
| 6,297,551 B1 | 10/2001 | Dudderar et al. |
| 6,324,755 B1 | 12/2001 | Borkowski et al. |
| 6,346,469 B1 | 2/2002 | Greer |
| 6,355,501 B1 | 3/2002 | Fung et al. |
| 6,396,371 B2 | 5/2002 | Streeter et al. |
| 6,436,740 B1 | 8/2002 | Jen et al. |
| 6,485,565 B1 | 11/2002 | Springer |
| 6,678,167 B1 | 1/2004 | Degani et al. |
| 6,819,000 B2 | 11/2004 | Magerlein et al. |
| 6,825,534 B2 | 11/2004 | Chen et al. |
| 6,838,774 B2 | 1/2005 | Patti |
| 7,427,803 B2 | 9/2008 | Chao et al. |
| 7,589,390 B2 | 9/2009 | Yao |
| 7,624,088 B2 | 11/2009 | Johnson et al. |
| 7,932,515 B2 | 4/2011 | Bunyk |
| 7,939,926 B2 | 5/2011 | Kaskoun et al. |
| 7,993,971 B2 | 8/2011 | Chatterjee et al. |
| 8,202,785 B2 | 6/2012 | Castex et al. |
| 8,354,746 B2 | 1/2013 | Huang et al. |
| 8,466,036 B2 | 6/2013 | Brindle et al. |
| 8,487,444 B2 | 7/2013 | Law et al. |
| 8,492,911 B2 | 7/2013 | Bachman et al. |
| 8,519,543 B1 | 8/2013 | Song et al. |
| 8,546,188 B2 | 10/2013 | Liu et al. |
| 8,564,955 B2 | 10/2013 | Schmidt et al. |
| 8,736,068 B2 | 5/2014 | Bartley et al. |
| 8,754,321 B2 | 6/2014 | Schroeder et al. |
| 8,828,860 B2 | 9/2014 | Gruber et al. |
| 8,928,128 B2 | 1/2015 | Karikalan et al. |
| 8,954,125 B2 | 2/2015 | Gonzalez et al. |
| 9,076,658 B1 | 7/2015 | Brown et al. |
| 9,171,792 B2 | 10/2015 | Sun et al. |
| 9,836,699 B1 * | 12/2017 | Rigetti ............... G06N 99/002 |
| 2001/0016383 A1 | 8/2001 | Chen et al. |
| 2002/0094661 A1 | 7/2002 | Enquist et al. |
| 2003/0067073 A1 | 4/2003 | Akram et al. |
| 2004/0124538 A1 | 7/2004 | Reif et al. |
| 2004/0188845 A1 | 9/2004 | Iguchi et al. |
| 2004/0223380 A1 * | 11/2004 | Hato ..................... H01L 27/18 |
| | | 365/200 |
| 2006/0191640 A1 | 8/2006 | Johnson |
| 2007/0087544 A1 | 4/2007 | Chang et al. |
| 2007/0119812 A1 | 5/2007 | Kerdiles et al. |
| 2007/0207592 A1 | 9/2007 | Lu et al. |
| 2008/0093747 A1 | 4/2008 | Enquist et al. |
| 2008/0122115 A1 | 5/2008 | Popa et al. |
| 2008/0169559 A1 | 7/2008 | Yang |
| 2008/0230916 A1 | 9/2008 | Saito et al. |
| 2008/0290790 A1 | 11/2008 | Jin |
| 2008/0316714 A1 | 12/2008 | Eichelberger et al. |
| 2009/0078966 A1 | 3/2009 | Asai et al. |
| 2009/0173936 A1 | 7/2009 | Bunyk |
| 2009/0186446 A1 | 7/2009 | Kwon et al. |
| 2009/0233436 A1 | 9/2009 | Kim et al. |
| 2010/0001399 A1 | 1/2010 | Topacio |
| 2010/0026447 A1 | 2/2010 | Keefe et al. |
| 2010/0122762 A1 | 5/2010 | George |
| 2010/0130016 A1 | 5/2010 | DeVilliers |
| 2010/0148371 A1 | 6/2010 | Kaskoun et al. |
| 2010/0171093 A1 | 7/2010 | Kabir |
| 2011/0049675 A1 | 3/2011 | Nagai et al. |
| 2011/0089561 A1 * | 4/2011 | Kurita .................. H01L 21/561 |
| | | 257/737 |
| 2011/0140271 A1 | 6/2011 | Daubenspeck et al. |
| 2011/0189820 A1 | 8/2011 | Sasaki et al. |
| 2011/0204505 A1 | 8/2011 | Pagaila et al. |
| 2011/0237069 A1 | 9/2011 | Miyazaki |
| 2011/0248396 A1 | 10/2011 | Liu et al. |

(56) References Cited

U.S. PATENT DOCUMENTS

| | | | |
|---|---|---|---|
| 2012/0032340 A1 | 2/2012 | Choi et al. | |
| 2012/0074585 A1 | 3/2012 | Koo et al. | |
| 2012/0217642 A1 | 8/2012 | Sun et al. | |
| 2012/0228011 A1 | 9/2012 | Chang et al. | |
| 2012/0231621 A1 | 9/2012 | Chang et al. | |
| 2012/0252189 A1 | 10/2012 | Sadaka et al. | |
| 2012/0292602 A1 | 11/2012 | Guo et al. | |
| 2013/0029848 A1 | 1/2013 | Gonzalez et al. | |
| 2013/0093104 A1 | 4/2013 | Wu et al. | |
| 2013/0099235 A1 | 4/2013 | Han | |
| 2013/0147036 A1 | 6/2013 | Choi et al. | |
| 2013/0153888 A1 | 6/2013 | Inoue et al. | |
| 2013/0187265 A1 | 7/2013 | Shih et al. | |
| 2013/0244417 A1 | 9/2013 | Markunas et al. | |
| 2014/0001604 A1 | 1/2014 | Sadaka | |
| 2014/0065771 A1 | 3/2014 | Gruber et al. | |
| 2014/0113828 A1 | 4/2014 | Gilbert et al. | |
| 2014/0246763 A1* | 9/2014 | Bunyk | H01L 27/18 257/663 |
| 2014/0264890 A1 | 9/2014 | Breuer et al. | |
| 2015/0041977 A1 | 2/2015 | Daubenspeck et al. | |
| 2015/0054151 A1 | 2/2015 | Choi et al. | |
| 2015/0054167 A1 | 2/2015 | Pendse | |
| 2015/0054175 A1 | 2/2015 | Meinhold et al. | |
| 2015/0348874 A1 | 12/2015 | Tsai et al. | |
| 2016/0364653 A1 | 12/2016 | Chow et al. | |
| 2017/0040296 A1 | 2/2017 | Das et al. | |
| 2017/0092621 A1 | 3/2017 | Das et al. | |
| 2017/0098627 A1 | 4/2017 | Das et al. | |
| 2017/0125383 A1* | 5/2017 | Liu | H03K 17/145 |
| 2017/0133336 A1 | 5/2017 | Oliver et al. | |
| 2017/0162507 A1 | 6/2017 | Das et al. | |
| 2017/0162550 A1 | 6/2017 | Das et al. | |
| 2017/0194248 A1 | 7/2017 | Das | |
| 2017/0200700 A1 | 7/2017 | Das et al. | |

FOREIGN PATENT DOCUMENTS

| | | | |
|---|---|---|---|
| WO | WO 2016/073049 A1 | 5/2016 | |
| WO | WO 2017/015432 A1 | 1/2017 | |
| WO | WO 2017/079394 A1 | 5/2017 | |
| WO | WO 2017/079417 A1 | 5/2017 | |
| WO | WO 2017/079424 A1 | 5/2017 | |
| WO | WO 2017/131831 A2 | 8/2017 | |

OTHER PUBLICATIONS

PCT International Preliminary Report on Patentability dated Feb. 1, 2018 for PCT Appl. No. PCT/US2016/043266; 11 pages.
Response to Final Office Action dated Dec. 6, 2017 for U.S. Appl. No. 15/342,444; Response filed Mar. 2, 2018; 16 pages.
Response to Restriction Requirement dated Oct. 23, 2017 for U.S. Appl. No. 15/342,517, filed Dec. 22, 2017; 1 pages.
Restriction Requirement dated Jan. 3, 2018 for U.S. Appl. No. 15/342,478; 6 pages.
Response to Restriction Requirement dated Jan. 3, 2018 for U.S. Appl. No. 15/342,478, filed Mar. 2, 2018; 6 pages.
Advisory Action dated Mar. 20, 2018 for U.S. Appl. No. 15/342,444; 3 pages.
U.S. Non-Final Office Action dated Mar. 21, 2018 for U.S. Appl. No. 15/342,589; 25 pages.
U.S. Appl. No. 15/745,914, filed Jan. 18, 2018, Oliver, et al.
U.S. Appl. No. 15/342,478, filed Nov. 3, 2016, Oliver, et al.
U.S. Appl. No. 15/342,517, filed Nov. 3, 2016, Oliver, et al.
U.S. Appl. No. 15/342,589, filed Nov. 3, 2016, Oliver, et al.
Burns, et al.; "3D Circuit Integration Technology for Multiproject Fabrication;" MIT Lincoln Laboratory Presentation; Apr. 7, 2000; 15 pages.
Courtland; "Google Aims for Quantum Computing Supremacy;" Spectrum.IEEE.Org; North America; Jun. 2017; 2 pages.
Ohya, et al.; "Room Temperature Deposition of Sputtered TiN Films for Superconducting Coplanar Waveguide Resonators;" IOP Publishing—Superconductor Science and Technology; vol. 27; Mar. 26, 2014; 10 pages.
Tarniowy, et al.; "The Effect of Thermal Treatment on the Structure, Optical and Electrical Properties of Amorphous Titanium Nitride Thin Films;" Thin Solid Films 311; 1997; 8 pages.
Notice of Allowance for U.S. Appl. No. 15/327,235 dated Jun. 30, 2017; 17 pages.
PCT Search Report of the ISA for PCT Appl. No. PCT/US2015/044608 dated Dec. 31, 2015; 5 pages.
PCT Written Opinion of the ISA for PCT Appl. No. PCT/US2015/044608 dated Dec. 31, 2015; 7 pages.
International Preliminary Report dated Feb. 23, 2017 for PCT Application No. PCT/US2015/044608; 9 pages.
PCT Search Report of the ISA for PCT Appl. No. PCT/US2015/044679 dated Apr. 13, 2016; 3 pages.
PCT Written Opinion of the ISA for PCT Appl. No. PCT/US2015/044679 dated Apr. 13, 2016; 7 pages.
International Preliminary Report dated Feb. 23, 2017 for PCT Application No. PCT/US2015/044679; 9 pages.
Restriction Requirement dated May 16, 2017 for U.S. Appl. No. 15/327,249; 6 pages.
Response to Restriction Requirement dated May 16, 2017 for U.S. Appl. No. 15/327,249, filed Jun. 27, 2017; 1 page.
PCT Search Report of the ISA for PCT Appl. No. PCT/US2015/044651 dated Nov. 4, 2015; 3 pages.
PCT Written Opinion of the ISA for PCT Appl. No. PCT/US2015/044651 dated Nov. 4, 2015; 12 pages.
International Preliminary Report dated Feb. 23, 2017 for PCT Application No. PCT/US2015/044651; 10 pages.
Restriction Requirement dated Jun. 8, 2017 for U.S. Appl. No. 15/271,755, 1 page.
Response to Restriction Requirement dated Jun. 8, 2017 for U.S. Appl. No. 15/271,755, filed Jun. 19, 2017; 1 page.
Office Action dated Jul. 7, 2017 for U.S. Appl. No. 15/271,755; 26 pages.
PCT Search Report of the ISA for PCT/US2016/052824 dated Feb. 3, 2017; 6 pages.
PCT Written Opinion of the ISA for PCT/US2016/052824 dated Feb. 3, 2017; 6 pages.
Office Action dated Mar. 3, 2017 for U.S. Appl. No. 14/694,540; 16 pages.
Response to Office Action dated Mar. 3, 2017 for U.S. Appl. No. 14/694,540, filed Jun. 1, 2017; 24 pages.
Notice of Allowance for U.S. Appl. No. 14/694,540 dated Jul. 31, 2017; 9 pages.
Office Action dated Mar. 24, 2017 for U.S. Appl. No. 15/303,800, 39 pages.
Response to Office Action dated Mar. 24, 2017 for U.S. Appl. No. 15/303,800, filed Jun. 26, 2017; 22 pages.
PCT Search Report of the ISA for PCT Appl. No. PCT/US2015/059181 dated Sep. 7, 2016; 5 pages.
PCT Written Opinion of the ISA for PCT Appl. No. PCT/US2015/059181 dated Sep. 7, 2016; 12 pages.
PCT International Preliminary Report on Patentability dated May 18, 2017 for PCT Appl. No. PCT/US2015/059181; 11 pages.
Notice of Allowance for U.S. Appl. No. 15/312,063 dated Aug. 2, 2017; 17 pages.
PCT Search Report of the ISA for PCT Appl. No. PCT/US2015/059200 dated Jul. 21, 2016; 3 pages.
PCT Written Opinion of the ISA for PCT Appl. No. PCT/US2015/059200 dated Jul. 21, 2016; 13 pages.
PCT International Preliminary Report on Patentability dated May 18, 2017 for PCT Appl. No. PCT/US2015/059200; 11 pages.
PCT Search Report of the ISA for PCT/US2016/043266 dated Dec. 5, 2016; 5 pages.
PCT Written Opinion of the ISA for PCT/US2016/043266 dated Dec. 5, 2016; 9 pages.
PCT Search Report of the ISA for PCT/US2016/060296 dated Mar. 10, 2017; 5 pages.
PCT Written Opinion of the ISA for PCT/US2016/060296 dated Mar. 10, 2017; 5 pages.

(56) References Cited

OTHER PUBLICATIONS

PCT Search Report of the ISA for PCT Appl. No. PCT/US2016/060343 dated Jul. 18, 2017; 3 pages.
PCT Written Opinion of the ISA for PCT Appl. No. PCT/US2016/060343 dated Jul. 18, 2017; 12 pages.
Restriction Requirement dated Apr. 28, 2017 for U.S. Appl. No. 15/342,444; 9 pages.
Response to Restriction Requirement and Preliminary Amendment dated Apr. 28, 2017 for U.S. Appl. No. 15/342,444, filed May 19, 2017; 6 pages.
PCT Search Report of the ISA for PCT Appl. No. PCT/US2016/060263 dated Jan. 10, 2017; 3 pages.
PCT Written Opinion of the ISA for PCT Appl. No. PCT/US2016/060263 dated Jan. 10, 2017; 6 pages.
PCT Search Report of the ISA for PCT/US2016/060309 dated Mar. 24, 2017; 6 pages.
PCT Written Opinion of the ISA for PCT/US2016/060309 dated Mar. 24, 2017; 10 pages.
U.S. Non-Final Office Action dated Apr. 23, 2018 for U.S. Appl. No. 15/342,478; 11 Pages.
U.S. Non-Final Office Action dated Apr. 19, 2018 for U.S. Appl. No. 15/342,517; 8 Pages.
Response to U.S. Non-Final Office Action dated Jan. 11, 2018 for U.S. Appl. No. 15/327,239; Response filed Apr. 9, 2018; 25 Pages.
Response to U.S. Non-Final Office Action dated Oct. 20, 2017 for U.S. Appl. No. 15/327,249; Response filed Apr. 19, 2018; 19 Pages.
Response to U.S. Final Office Action dated Dec. 20, 2017 for U.S. Appl. No. 15/271,755; Response filed Apr. 23, 2018; 23 Pages.
U.S. Final Office Action dated May 9, 2018 for U.S. Appl. No. 15/327,239; 25 Pages.
Response to U.S. Final Office Action dated Dec. 6, 2017 for U.S. Appl. No. 15/342,444; Response filed May 4, 2018; 18 Pages.
U.S. Non-Final Office Action dated May 11, 2018 for U.S. Appl. No. 15/684,393; 15 Pages.
PCT International Preliminary Report dated May 17, 2018 for International Application No. PCT/US2016/060296; 7 Pages.
PCT International Preliminary Report dated May 17, 2018 for International Application No. PCT/US2016/060343; 9 Pages.
PCT International Preliminary Report dated May 17, 2018 for International Application No. PCT/US2016/060263; 8 Pages.
PCT International Preliminary Report dated May 17, 2018 for International Application No. PCT/US2016/060309; 8 Pages.
Response to Non-Final Office Action dated Apr. 23, 2018 for U.S. Appl. No. 15/342,478, filed Aug. 23, 2018; 18 Pages.
Final Office Action dated Oct. 23, 2018 for U.S. Appl. No. 15/342,478; 21 pages.
Non-Final Office Action dated Nov. 8, 2018 for U.S. Appl. No. 15/327,239; 26 pages.
Notice of Allowance dated Oct. 3, 2018 for U.S. Appl. No. 15/342,517; 13 pages.
Notice of Allowance dated Nov. 8, 2018 for U.S. Appl. No. 15/684,393; 8 pages.
Restriction Requirement dated Oct. 11, 2018 for U.S. Appl. No. 15/684,337; 8 pages.
Response to Restriction Requirement dated Oct. 11, 2018 for U.S. Appl. No. 15/684,337, filed Nov. 9, 2018; 10 pages.
Response to Office Action dated Aug. 9, 2018 for U.S. Appl. No. 15/271,755, filed Sep. 28, 2018; 16 pages.
Notice of Allowance dated Oct. 12, 2017 for U.S. Appl. No. 15/303,800; 16 pages.
Restriction Requirements for U.S. Appl. No. 15/271,755 dated Jun. 8, 2017; 6 pages.
Response to Jul. 7, 2017 Office Action for U.S. Appl. No. 15/271,755, filed Oct. 10, 2017; 33 pages.
Office Action dated Aug. 11, 2017 for U.S. Appl. No. 15/342,444; 22 pages.
Response to Aug. 11, 2017 Office Action for U.S. Appl. No. 15/342,444, filed Sep. 15, 2017; 20 pages.
U.S. Appl. No. 15/684,337, filed Aug. 23, 2017, Das, et al.
U.S. Appl. No. 15/684,393, filed Aug. 23, 2017, Das, et al.
Notice of Allowance dated Jul. 9, 2018 for U.S. Appl. No. 15/327,249; 15 Pages.
Notice of Allowance dated Jul. 18, 2018 for U.S. Appl. No. 15/342,444; 11 Pages.
Office Action dated Aug. 9, 2018 for U.S. Appl. No. 15/271,755; 29 Pages.
Response to Office Action dated Apr. 19, 2018 for U.S. Appl. No. 15/342,517, filed Jul. 17, 2018; 14 Pages.
Office Action dated Oct. 20, 2017 for U.S. Appl. No. 15/327,240: 30 pages.
Final Office Action dated Dec. 6, 2017 for U.S. Appl. No. 15/342,444; 18 pages.
Final Office Action dated Dec. 20, 2017 for U.S. Appl. No. 15/271,755, 25 pages.
Restriction Requirement dated Oct. 23, 2017 for U.S. Appl. No. 15/342,517; 6 pages.
Notice of Allowance dated May 10, 2019 for U.S. Appl. No. 15/342,478; 13 pages.
Appeal Brief filed on Mar. 28, 2019 for U.S. Appl. No. 15/327,239; 41 pages.
Non-Final Office Action dated Feb. 1, 2019 for U.S. Appl. No. 15/684,337; 10 Pages.
Response to Office Action filed on Jan. 23, 2019 for U.S. Appl. No. 15/342,478; 9 pages.
Amendment filed on Apr. 30, 2019 for U.S. Appl. No. 15/684,337; 11 pages.

* cited by examiner

CRYOGENIC ELECTRONIC PACKAGES AND ASSEMBLIES

CROSS REFERENCE TO RELATED APPLICATIONS

This application claims the benefit of and priority to U.S. Provisional Application No. 62/406,510 filed on Oct. 11, 2016 under 35 U.S.C. § 119(e) which application is hereby incorporated herein by reference in its entirety.

GOVERNMENT RIGHTS

This invention was made with Government support under Contract No. FA8721-05-C-0002 awarded by the U.S. Air Force. The Government has certain rights in the invention.

FIELD

This disclosure relates generally to electronic packages and assemblies, and more particularly, to cryogenic electronic packages and assemblies.

BACKGROUND

As is known, there is trend toward miniaturization of electronic products such as mobile phones, tablets, digital cameras, and the like. There is also a demand for development of electronic products which have an increased number of functionalities and have increased electronic capabilities (e.g., increased speed, memory, and operational life). These trends have resulted in a demand for integrated circuits which enable these and other increased capabilities (e.g., increased density, computing power and extended operational life). As is known, integrated circuits may be fabricated using a variety of technologies, including complementary metal-oxide-semiconductor (CMOS) technology.

As CMOS technology reaches the end of Moore's Law scaling and power consumption of integrated circuits fabricated using such technology continues to increase, there is a need to develop "beyond-CMOS" device technologies (e.g., to achieve high-performance exascale computing). As is known, CMOS technology may be used in fabricating processors, for example, and processors are often constructed on a chip using integrated circuit techniques. As is also known, CMOS processors are typically used logic elements in current high performance computing applications. As is additionally known, a significant amount of the power consumption of the CMOS processors is due to moving information between logic elements (e.g., CMOS processors) rather than actual logic operations performed by the processors.

As is known, superconducting technology and superconducting semiconductor structures (e.g., integrated circuits) fabricated using such technology are a leading candidate technology for high performance computing applications (e.g., due to the energy efficiency of superconducting technology). Although many studies have been conducted on superconducting semiconductor structures and their use in high performance computing applications, a major technical challenge is integrating the superconducting semiconductor structures and other components of high performance computing circuits into a cryogenic chamber. This is typically due to the large number of individual chips and associated hardware often required to build high performance computing circuits, and limited cryogenic space of the cryogenic chamber used to cool or refrigerate the circuits.

SUMMARY

Described herein are concepts, systems, circuits and techniques related to cryogenic electronic packages and assemblies including cryogenic electronic packages. The described cryogenic electronic packages and assemblies allow for integration of superconducting semiconductor structures (e.g., superconducting multichip modules (SMCMs) and integrated circuits (ICs)) with one or more non-superconducting semiconductor structures (e.g., conventional circuitized substrates). Additionally, the described cryogenic electronic packages and assemblies, and approaches used to fabricate the described cryogenic electronic packages and assemblies, allow for a maximum number of superconducting semiconductor structures to fit in a given space (e.g., a cryogenic space in a cryogenic chamber). The foregoing provides for the ability to design circuitry (e.g., high performance computing circuitry) to fit in a given cryogenic space (e.g., a conventional cryogenic space), rather than adjusting or designing the space (e.g., cryogenic space) to fit the circuitry.

In one aspect of the concepts described herein, a cryogenic electronic package according to the disclosure includes a substrate (e.g., a conventional or normal non-superconducting circuitized substrate) having first and second opposing surfaces. The substrate includes one or more interconnect pads disposed on at least one of the first and second surfaces of the substrate. The cryogenic electronic package also includes an interposer (e.g., a conventional non-superconducting interposer, or a superconducting or a partially superconducting interposer) having first and second opposing surfaces. The interposer includes one or more interconnect pads disposed on at least one of the first and second surfaces of the interposer. The first surface of the interposer is disposed over and coupled to the second surface of the substrate.

The cryogenic electronic package additionally includes a first superconducting multichip module (SMCM) having first and second opposing surfaces. The first surface of the first SMCM is disposed over and coupled to the second surface of the interposer. The cryogenic electronic package further includes at least one first superconducting semiconductor structure (e.g., a superconducting integrated circuit (IC)) having first and second opposing surfaces. The first surface of the at least one first superconducting semiconductor structure is disposed over and coupled to the second surface of the first SMCM. Additionally, the first SMCM and the at least one first superconducting semiconductor are electrically coupled to the substrate through the interposer. In embodiments, the interposer redistributes wirings of the first SMCM such that the interposer is capable of utilizing substantially all real estate of the substrate in order to miniaturize the cryogenic electronic package.

The cryogenic electronic package may also include one or more of the following features individually or in combination with other features. One or more first interconnect structures may be disposed between the second surface of the substrate and the first surface of the interposer. The first interconnect structures may be coupled to respective ones of the interconnect pads provided on the substrate and the interposer to form one or more electrical connections between the interposer and the substrate. One or more second interconnect structures may be disposed between the second surface of the first SMCM and the first surface of the at least one first superconducting semiconductor structure. The second interconnect structures may be coupled to form one or more electrical connections between the at least one first superconducting semiconductor structure and the first SMCM.

The first interconnect structures may form a ball grid array and/or electrically superconductive adhesive array and/or anisotropic adhesive array assembly on at least one of the substrate and the interposer. The second interconnect structures may form a microbump and/or micropillar and/or fusible coated micropillar assembly on at least one of the first SMCM and the at least one first superconducting semiconductor structure. At least one of the first and second interconnect structures may include at least one superconducting and/or a partially superconducting material. An adhesive layer may be disposed between the second surface of the interposer and the first surface of the first SMCM. The cryogenic electronic package may include one or more conventional and/or superconducting wire bonding and/or ribbon bonding and/or spring bonding structures. At least one of the bonding structures may have a first portion electrically coupled to the second surface of the interposer, and a second opposing portion electrically coupled to the second surface of the first SMCM to form one or more electrical connections between the interposer and the first SMCM.

A first underfill material may be disposed between the second surface of the substrate and the first surface of the interposer. A second underfill material may be disposed between the second surface of the first SMCM and the first surface of the at least one first superconducting semiconductor structure. A heat dissipation structure may be disposed beneath and coupled to the first surface of the substrate. A thermal interface structure or material may be disposed between the heat dissipation structure and the first surface of the substrate.

The cryogenic electronic package may include a second SMCM having first and second opposing surfaces. The first surface of the second SMCM may be disposed over and coupled to the second surface of the interposer. The cryogenic electronic package may include at least one second superconducting semiconductor structure having first and second opposing surfaces. The first surface of the at least one second superconducting semiconductor structure may be disposed over and coupled to the second surface of the second SMCM. The second SMCM may be electrically coupled to the first SMCM through the interposer. Additionally, the at least one second superconducting semiconductor structure may be electrically coupled to the at least one first superconducting semiconductor structure through the second SMCM, the interposer, and the first SMCM.

One or more third interconnect structures may be disposed between the second surface of the second SMCM and the first surface of the at least one second superconducting semiconductor structure. The third interconnect structures may be coupled to form one or more electrical connections between the at least one second superconducting semiconductor structure and the second SMCM. The interposer may include a multi-layer high density superconducting and/or conventional circuitized substrate (i.e. a non-superconducting circuitized substrate). Additionally, the first and second SMCMs may both include silicon (Si) based SMCMs. The at least one first superconducting semiconductor structure and the at least one second superconducting semiconductor structure may each include a plurality of single-flux-quantum (SFQ) integrated circuits (ICs). The cryogenic electronic package may be provided in a cryogenic chamber. In embodiments, the substrate may be a superconducting circuitized substrate.

The cryogenic electronic package may include a semiconductor structure joining layer disposed between the second surface of the substrate and the first surface of the interposer. The semiconductor structure joining layer may have first and second opposing surfaces and include at least one dielectric material and a plurality of thru-holes extending between selected portions of the first and second surfaces. Each of the thru-holes may be aligned with a respective one of the interconnect pads provided on the substrate and the interposer. Additionally, each of the thru-holes may have a diameter which is greater than a diameter of the respective ones of the interconnect pads to which the thru-holes are aligned with. Each of the thru-holes may include at least a portion of a laminated, electrically superconducting and/or partially superconducting interconnect disposed thereon such that the interconnect substantially fills a respective opening of the thru-hole. The interconnect may form one or more electrical connections between the interposer and the substrate. The thru-holes may include at least one superconducting and/or a partially superconducting material.

In another aspect of the concepts described herein, a cryogenic electronic assembly includes a plurality of cryogenic electronic packages. Each of the cryogenic electronic packages includes a substrate (e.g., a conventional non-superconducting circuitized substrate) having first and second opposing. The substrate includes one or more interconnect pads disposed on at least one of the first and second surfaces of the substrate. Additionally, each of the cryogenic electronic packages includes an interposer (e.g., a conventional non-superconducting interposer, or a superconducting or a partially superconducting interposer) having first and second opposing surfaces. The interposer includes one or more interconnect pads disposed on at least one of the first and second surfaces of the interposer. Each of the cryogenic electronic packages also includes a superconducting multi-chip module (SMCM) having first and second opposing surfaces. Further, each of the cryogenic electronic packages includes at least one superconducting semiconductor structure (e.g., a superconducting integrated circuit (IC)) having first and second opposing surfaces.

Each of the cryogenic electronic packages additionally includes one or more first interconnect structures. The first interconnect structures are disposed between the substrate and the interposer. Additionally, the first interconnect structures are coupled to respective ones of the interconnected pads disposed on the substrate and the interposer. Each of the cryogenic electronic packages also includes one or more second interconnect structures. The second interconnect structure are disposed between the second surface of the SMCM and the first surface of the at least one superconducting semiconductor structure. Additionally, the second interconnect structures are coupled to form one or more electrical connections between the at least one superconducting semiconductor structure and the SMCM. The at least one superconducting semiconductor structure and the SMCM are electrically coupled to the substrate through the interposer. Additionally, one or more of the cryogenic electronic packages are coupled using a means for electrically coupling the cryogenic electronic packages together.

The cryogenic electronic assembly may also include one or more of the following features individually or in combination with other features. The means for electrically coupling the cryogenic electronic packages together may include at least one connector having first and second opposing portions. The first portion of the at least one connector may be coupled to a selected one of the interconnect pads provided on the substrate of a first selected one of the cryogenic electronic packages. Additionally, the second portion of the at least one connector may be coupled to a selected one of the interconnect pads provided on the substrate of a second selected one of second cryogenic electronic packages. The at least one connector may include at least one of a flex connector, a ribbon connector, a coaxial connector, an optical connector or an optoelectronic connector.

The interconnect pads of the substrate of the cryogenic electronic packages may be disposed between the first and second surfaces of the substrate. The means for electrically coupling the cryogenic electronic packages together may include at least one conductive structure (e.g., a via) having first and second opposing portions. The first portion of the at least one conductive structure may be coupled to a selected one of the interconnect pads of the substrate of a first selected one of the cryogenic electronic packages. Additionally, the second portion of the at least one conductive structure may be coupled to a selected one of the interconnect pads of the substrate of a second selected one of second cryogenic electronic packages.

The cryogenic electronic assembly may further include a semiconductor structure (e.g., a printed circuit board or substrate) having first and second opposing surfaces. The means for electrically coupling the cryogenic electronic packages may be provided on the first surface of the semiconductor structure. Additionally, the means for electrically coupling the cryogenic electronic packages may include a plurality of connectors. Each of the connectors may have a cavity shaped to receive a respective one (or sometimes more than one) of the cryogenic electronic packages.

The cryogenic electronic packages may each include an adhesive layer disposed between the second surface of the interposer and the first surface of the SMCM. Additionally, the cryogenic electronic packages may each include one or more wire bonding structures. At least one of the wire bonding structures may have a first portion electrically coupled to the second surface of the interposer, and a second opposing portion electrically coupled to the second surface of the SMCM to form one or more electrical connections between the interposer and the SMCM. The cryogenic electronic packages may each include a heat dissipation structure disposed beneath and coupled to the first surface of the substrate. Additionally, the cryogenic electronic packages may each include a thermal interface structure or material disposed between the heat dissipation structure and the first surface of the substrate.

The plurality of cryogenic electronic packages may include four cryogenic electronic packages. The first surface of the substrate of a first one of the cryogenic electronic packages may be disposed over and coupled to the first surface of the substrate of a second one of the cryogenic electronic packages. Additionally, the first surface of the substrate of a third one of the cryogenic electronic packages may be disposed over and coupled to the first surface of the substrate of a fourth one of the cryogenic electronic packages.

The means for coupling the cryogenic electronic packages together may include a first plurality of conductive structures for coupling the first one of the cryogenic electronic packages to the second one of the cryogenic electronic packages. Additionally, the means for coupling the cryogenic electronic packages together may include a second plurality of conductive structures for coupling the third one of the cryogenic electronic packages to the fourth one of the cryogenic electronic packages. Further, the means for coupling the cryogenic electronic packages together may include and a connector for coupling the first and second ones of the cryogenic electronic packages to the third and fourth ones of the cryogenic electronic packages.

As is known, superconducting semiconductor structures (e.g., single-flux-quantum-based (SFQ) digital integrated circuits (ICs)) are a promising candidate for high speed and ultra-low energy dissipation high performance computing circuits (e.g., circuits with a characteristic switching time of about 1 picosecond (ps) and a switching energy of about $10^{-19}$ Joule) and superconducting computing circuits and systems. Semiconductor structures based on several versions of rapid single flux quantum (RSFQ) type logic, reciprocal quantum logic (RQL), and adiabatic quantum flux parametron (AQFP) logic, for example, have been demonstrated with complexities reaching up to a few tens of thousands gates. Coupling or otherwise attaching several (and sometimes many) superconducting semiconductor structures together and performing fast and nearly lossless operations between the superconducting semiconductor structures and other semiconductor structures (e.g., CMOS chips) is highly desirable for "hybrid" superconducting computing architectures and systems (i.e. superconducting computing architectures and systems comprising both super conducting and non-superconducting semiconductor structures).

According to the concepts, systems, circuits and techniques sought to be protected herein, an efficient way to achieve the aforesaid is to couple semiconductor structures in cryogenic packages and assemblies together through an interposer (e.g., a passive superconducting base). The interposer distributes signals (e.g., signals containing information) among the semiconductor structures in the cryogenic packages and assemblies. In the disclosure, various implementations of such an interposer are described. The interposer may, for example, use well defined conductive structures (e.g., vias) or impedance lines to couple the semiconductor structures together. The impedance lines may go through a microbump or correspond to bump interrupted impedance lines which maintain a characteristic impedance (e.g., about 50Ω, 30Ω, etc.). It is believed that such arrangements demonstrate example cryogenic integration approaches for possible hybrid superconducting computing architectures and systems.

Interconnect structures used to couple (e.g., electrically and mechanically couple) one or more semiconductor structures to interposers of cryogenic electronic packages and assemblies according to the disclosure are also discussed. In one embodiment, the interconnect structures take the form of microbumps (e.g., Indium (In) based microbumps). Additionally, in one embodiment, the interconnect structures are fabricated or otherwise provided on at least one of the semiconductor structures and the interposer using thermal compression bonding techniques.

As an example case study, interconnect structures taking the form of microbumps and for attaching or otherwise coupling a plurality of superconducting semiconductor structures (e.g., about 16 superconducting chips) to an interposer (e.g., an interposer having surface dimensions of about 32 mm×32 mm) were fabricated. Additionally, the structural and electrical integrity of the interconnect structures were evaluated at both room temperature and cryogenic temperatures (e.g., temperatures of about 4.2 K). It was found that the superconducting semiconductor structures and the interposer maintained their Josephson Junctions and superconducting (e.g., niobium (Nb)) line (e.g., I-V) characteristics at room temperature and cryogenic temperatures. In particular, the Josephson Junction and superconducting lines of the superconducting semiconductor structures, for example, were tested before and after bonding and the test results showed no significant change in properties. In one aspect of the disclosure, such illustrates that cryogenic electronic packages and assemblies according to disclosure including the above-described interposer and interconnect structures are suitable for use in high performance computing circuits and superconducting computing circuits and systems.

In a further aspect of the concepts described herein, a method of fabricating a cryogenic packaging architecture includes: providing at least a first circuitized substrate having first and second opposing sides; and providing first and second components on the first and second sides of the first circuitized substrate, respectively. The method also includes attaching or otherwise coupling at least a second circuitized substrate onto the first components on the first opposing side of the first circuitized substrate, the second circuitized substrate including first and second opposing sides. The method additionally includes providing first and second components on the first and second sides of the second circuitized substrate, respectively. The method also includes attaching or otherwise coupling at least a third circuitized substrate onto the first components on the first side of the second circuitized substrate, the third circuitized substrate including first and second opposing sides. The method further includes providing first and second components on the first and second sides of the third circuitized substrate, respectively;

The method also includes forming a first superconducting or partially superconducting connection between the first and second circuitized substrates; and forming a second superconducting or partial superconducting connection between the second circuitized substrate and the third circuitized substrate. At least one of the circuitized substrates of the cryogenic packaging architecture includes a plurality of superconducting multi-chip modules (MCMs) and/or superconducting integrated circuits (ICs) and/or CMOS ICs and/or photonic ICs having electrical interconnections and/or optical interconnections and/or capacitive coupling and/or inductive coupling.

In another aspect of the concepts described herein, a cryogenic electronic package includes a first substrate having first and second opposing surfaces and including one or more interconnect pads disposed on at least one of the first and second surfaces of the first substrate. The cryogenic electronic package also includes a first interposer having first and second opposing surfaces and including one or more interconnect pads disposed on at least one of the first and second surfaces of the first interposer. The first surface of the first interposer is disposed over and coupled to the second surface of the first substrate. The cryogenic electronic package additionally includes a first superconducting multichip module (SMCM) having first and second opposing surfaces. The first surface of the first SMCM is disposed over and coupled to the second surface of the first interposer.

The cryogenic electronic package further includes at least one first superconducting semiconductor structure having first and second opposing surfaces. The first surface of the at least one first superconducting semiconductor structure is disposed over and coupled to the second surface of the first SMCM, and the first SMCM and the at least one first superconducting semiconductor are electrically coupled to the first substrate through the first interposer. The cryogenic electronic package also includes a second dielectric interposer positioned on the second surface of the first substrate and the first surface of the first interposer.

A plurality of thru-holes extend through the dielectric interposer, with each of the plurality of thru-holes having a diameter greater than a predetermined interconnect pad dimension of the first substrate of the second surface and the first surface of the first interposer, resulting in the dielectric interposer thru-holes being in alignment with a respective one of the first and said second plurality of conductive features on the second surface of the first substrate and the first surface of the first interposer, respectively. The plurality of thru-holes each include a portion of laminated, electrically superconducting and/or partially superconducting interconnect disposed thereon. The laminated electrically superconducting and/or partially superconducting interconnect fills the thru-hole opening and is surrounded by a dielectric insulator of the dielectric interposer to create one or more first interconnect structures disposed between the second surface of the first substrate and the first surface of the first interposer. The first interconnect structures are coupled to respective ones of the interconnect pads provided on the first substrate and the first interposer to form one or more electrical connections between the first interposer and the first substrate.

In a further aspect of the concepts described herein, a method of fabricating a cryogenic packaging architecture includes providing at least a first circuitized substrate having first and second opposing sides; and providing first and second components on the first and second sides of the first circuitized substrate, respectively. The method also includes attaching or otherwise coupling at least a second circuitized substrate onto the first components on the first side of the first circuitized substrate, the second circuitized substrate having first and second opposing sides. The method additionally includes providing first and second components on the first and second sides of the second circuitized substrate, respectively.

The method further includes attaching at least a third circuitized substrate onto the first components on the first side of the second circuitized substrate, the third circuitized substrate having first and second opposing sides. The method also includes providing first and second components on the first and second sides of the third circuitized substrate, respectively. The method additionally includes forming a first superconducting or partial superconducting connection between the first and second circuitized substrates; and forming a second superconducting or partial superconducting connection between the second circuitized substrate and the third circuitized substrate. The first and second conductors and the first capacitive dielectric layer form a first capacitor and the first and third conductors and the second capacitive dielectric layer form a second capacitor when the capacitive substrate is operational.

In another aspect of the concepts described herein, a circuitized substrate and method of making the circuitized substrate are disclosed. The circuitized substrate includes two printed circuit board (PCB) layers which are bonded or otherwise coupled to opposing sides of a dielectric interposer (or interposer layer). The dielectric interposer includes a plurality of thru-holes formed within selected portions of the dielectric interposer. Electrically conductive features of each PCB layer are aligned with the interposer thru-holes. A resistive paste is positioned on the conductive features located adjacent the thru-holes to form controlled electrically resistive connections between the conductive features of the PCB layers. A circuitized substrate assembly and method of making the circuitized substrate are also disclosed.

In a further aspect of the concepts described herein, a circuitized substrate includes a first printed circuit board (PCB) layer having a first plurality of conductive features, each of the conductive features having a predetermined dimension. The circuitized substrate also includes a dielectric interposer positioned on the first PCB layer and a second PCB layer having a second plurality of conductive features further positioned on the dielectric interposer. The circuitized substrate additionally includes a plurality of thru-holes extending through the dielectric interposer layer. Each of the plurality of thru-holes has a diameter greater than the predetermined conductive feature dimension, resulting in a pocket of space proximate to the plurality of conductive features. Additionally, each of the plurality of thru-holes is in alignment with a respective one of the first and the second plurality of conductive features on the first and the second PCB layers, respectively. The circuitized substrate also includes a portion of a laminated, electrically resistive paste disposed on the plurality of thru-holes. The laminated electrically resistive paste is spread outside boundaries of the plurality of conductive features to fill the pockets of space. In embodiments, the electrically resistive paste has an adjustable resistivity factor.

In another aspect of the concepts described herein, a cryogenic package interconnect includes at least a nonconducting component mixture of a conventional metal, a superconducting material and an insulating material such that a nonconducting joint becomes a superconducting and/or partially superconducting joint.

In a further aspect of the concepts described herein, a cryogenic package interconnect includes an insulating component become superconducting during interconnect formation.

In another aspect of the concepts described herein, a cryogenic package interconnect includes an insulator component in which a majority of insulating materials of the insulator component are removed prior to or during interconnect formation to create a superconducting interconnect.

In a further aspect of the concepts described herein, a cryogenic electronic package includes a superconductive paste for providing electrical connections between one or more components (e.g., circuits) of the cryogenic electronic package. The paste, in one embodiment, includes a binder component and at least one conventional metal component including microparticles and/or nanoparticles. In another embodiment, the paste includes the binder and a plurality of nano-wires. Selected ones of the microparticles or nanoparticles or nano-wires may include a layer of a superconductor material disposed thereon. A method of making such a cryogenic electronic package is also provided, as are an electrical assembly and information handling system adapter for having such a cryogenic electronic package as part thereof.

In another aspect of the concepts described herein, a cryogenic packaging assembly includes a superconducting or partial superconducting interposer having at least a first surface and including at least one superconducting or partially superconducting through hole having predetermined dimensions. Circuit elements are disposed on the first surface of the interposer and a first relatively thin layer of a liquid permanent photoimageable solder mask material is disposed in the at least one through hole on the first surface of the interposer. The first thin layer of the solder mask is tack dried (or otherwise dried) at a first predetermined temperature for a first predetermined period of time for drying a solvent associated with the solder mask and cleaning the solder mask material or solvent. Additionally, the first thin layer of the solder mask is dried at the first predetermined temperature for the first predetermined period of time to define a first plurality of openings in the solder mask which expose parts of the circuit elements.

A second relatively thin layer of liquid permanent photoimageable solder mask material is subsequently disposed or otherwise positioned over (sometimes, directly over) the first thin layer of the permanent photoimaged solder mask material to help eliminate volatiles from the first solder mask, whereby the first and second layers of solder mask do not sacrifice adhesion to the circuit elements. The second thin layer of the solder mask is tack dried (or otherwise dried) at a second predetermined temperature for a second predetermined period of time, and defines a second plurality of openings. A superconducting element is secured or otherwise coupled to selected ones of the exposed parts of the interposer elements. Additionally, a superconducting or conventional metal circuitized substrate is electrically coupled to selected ones of the superconducting elements so as to electrically couple the circuitized substrate to the selected ones of said interposer elements.

In a further aspect of the concepts described herein, an information system includes a housing, an integrated superconducting circuit, a superconducting MCM; and a cryogenic packaging assembly positioned within the housing. The integrated superconducting circuit is attached or otherwise coupled to the superconducting MCM. Additionally, and the superconducting MCM is attached or otherwise coupled to an interposer (e.g., an interposer of the cryogenic packaging assembly, as will be discussed below).

In embodiments, the cryogenic packaging assembly includes a superconducting or partial superconducting interposer having a first surface and including at least one superconducting or partially superconducting through hole having predetermined dimensions. Circuit elements are disposed on the first surface of the interposer and a first relatively thin layer of a liquid permanent photoimageable solder mask material is disposed on the at least one through hole on the first surface of the interposer. The first thin layer of the solder mask is tack dried (or otherwise dried) at a first predetermined temperature for a first predetermined period of time for drying a solvent associated with the solder mask and cleaning the solder mask material or solvent. Additionally, the first thin layer of the solder mask is dried at the first predetermined temperature for the first predetermined period of time to define a first plurality of openings in the solder mask which expose parts of the circuit elements.

A second relatively thin layer of a liquid permanent photoimageable solder mask material is subsequently disposed over (sometimes, directly over) the first thin layer of the permanent photoimaged solder mask material to help eliminate volatiles from the first solder mask, whereby the first and second layers of the solder mask do not sacrifice adhesion to the circuit elements. The second thin layer of the solder mask is tack dried (or otherwise dried) at a second predetermined temperature for a second predetermined period of time, and defines a second plurality of openings. A superconducting element is secured or otherwise coupled to selected ones of the exposed parts of the interposer elements. Additionally, a superconducting or conventional metal circuitized substrate is electrically coupled to selected ones of the superconducting elements so as to electrically couple the circuitized substrate to the selected ones of the interposer elements.

In another aspect of the concepts described herein, a cryogenic electronic package includes at least four same and/or different size circuitized substrates. At least one of the substrates includes at least one interposer and at least one SMCM; Additionally, at least two of the substrates are connected with each other and are preferably perpendicular with respect to each other. At least first and second ones of the substrates (also referred to as "first and second substrates") are preferably parallel with respect to each other, and are separated with at least a third substrate. Additionally, at least the first and second substrates are connected or otherwise coupled with a fourth substrate. In embodiments, vertical assembly of the third substrate to the first substrate will provide spacing between two assembled HDI boards for liquid helium flow during system operation.

In a further aspect of the concepts described herein, an information system includes a housing and a cryogenic packaging assembly positioned or otherwise disposed within the housing. The cryogenic electronic package includes: at least four same and/or different size circuitized substrates. At least one of the substrates includes at least one interposer and at least one SMCM. Additionally, at least two of the substrates are connected or otherwise coupled with each other and are preferably perpendicular with respect to each other. At least first and second ones of the substrates (also referred to as "first and second substrates") are preferably parallel with respect to each other, and are separated with at least a third substrates. Additionally, the at least first and second substrates are connected or otherwise coupled with a fourth substrate. In embodiments, vertical assembly of the third substrate to the first substrate will provide spacing between two assembled HDI boards for liquid helium flow during system operation.

BRIEF DESCRIPTION OF THE DRAWINGS

Features and advantages of the concepts, systems, circuits and techniques disclosed herein will be apparent from the following description of the embodiments taken in conjunction with the accompanying drawings in which.

DETAILED DESCRIPTION

Figure 1:
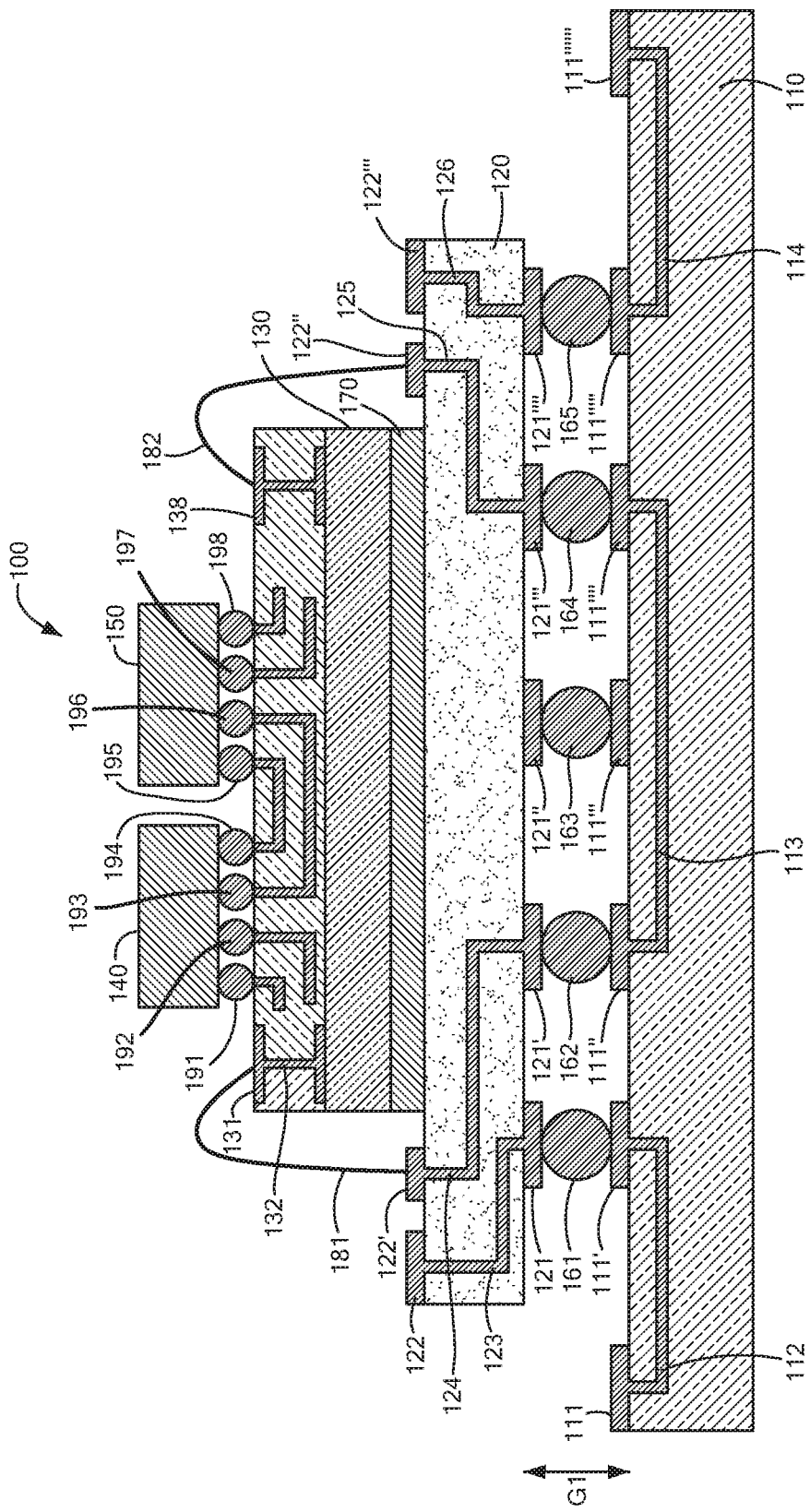
FIGS. 1-1A are block diagrams of example cryogenic electronic packages in accordance with an embodiment of the disclosure.

The features and other details of the concepts, systems, and techniques sought to be protected herein will now be more particularly described. It will be understood that any specific embodiments described herein are shown by way of illustration and not as limitations of the disclosure and the concepts described herein. Features of the subject matter described herein can be employed in various embodiments without departing from the scope of the concepts sought to be protected. Embodiments of the present disclosure and associated advantages may be best understood by referring to the drawings, where like numerals are used for like and corresponding parts throughout the various views. It should, of course, be appreciated that elements shown in the figures are not necessarily drawn to scale. For example, the dimensions of some elements may be exaggerated relative to other elements for clarity.

Definitions

For convenience, certain introductory concepts and terms used in the specification are collected here.

As used herein, a "high Q metal" or "high Q material" (or so-called "high Q metals" or "high Q materials") refers to materials in the 20-400 nm film form capable of producing a high quality factor and are defined as materials in a resonator and/or a superconducting resonator which produce a quality factor in the range of about a few thousands to several millions in the low power and/or single photon region. Illustrative materials include, but are not limited to: niobium (Nb), niobium nitride (NbN), titanium-niobium-nitride (TiNbN), titanium nitride (TiN), aluminum (Al), and rhenium (Re), diamond, graphene, etc.

The phrase "quality factor" can be used to describe how long stored energy remains in a resonator. It should be appreciated that there is a difference between a total quality factor and an internal quality factor Qi. Internal quality factor Qi is an intrinsic characteristic of a resonator. A total or loaded quality factor QL, on the other hand, also depends upon other properties, including, but not limited to, coupling to an environment (i.e., an environment external to the resonator) and a feedline. A coupling quality factor (Qc) describes how strong (or closely) the resonator is coupled to the feedline.

As used herein, the term "resonator" refers to a device or system that exhibits resonance at some frequencies. A resonator may be described by two characteristics: (1) a resonance frequency; and (2) a quality factor. Superconducting resonators play a significant role in qubit design, interqubit coupling, quantum information storage, and quantum-state dispersive readout because of their low signal-to-noise ratio and low power dissipation. In addition, as part of the concepts sought to be protected herein, it has been recognized that because superconducting qubits may be fabricated using the same materials and processes as resonators described herein, the study of the loss mechanisms limiting the qualify factor Q in these resonators may prove to be a useful and relatively simple tool for understanding the fabrication-dependent limits to qubit coherence times. Superconducting resonator is provided as any type of microwave resonator, including distributed—e.g., a coplanar waveguide (CPW) resonator, stripline resonator, microstrip resonator, coplanar strip resonator, puck resonator, and related structures,—and lumped element resonators comprising lumped capacitive and inductive elements coupled in parallel and/or in series, the capacitor formed by patterning a conductive layer deposited on a surface of a substrate.

A bit is the most basic unit of classical logic and can occupy one of two discrete states, 0 or 1. A quantum bit, or "qubit," on the other hand, can be an arbitrary superposition of the eighteen states |0> and |1>. A quantum computer is comprised of logic gates that operate on an ensemble of quantum bits.

Where n classical bits can only exist in one of the 2n possible states, a quantum processor with n qubits can be placed in a complex superposition state of any weighted combinations of all 2n permutations, containing an exponentially larger state space than a conventional processor.

"Superconducting qubits" are manifested as (e.g. an integrated circuit) electronic circuits comprising lithographically defined Josephson junctions, inductors, capacitors, transmission lines and interconnects. When cooled to dilution refrigerator temperatures, these circuits behave as quantum mechanical "artificial atoms," exhibiting quantized states of electronic charge, magnetic flux, or junction phase depending on the design parameters of the constituent circuit elements. The Josephson junction behaves as a non-linear dissipationless inductor.

Superconducting qubits are engineered to have discrete and harmonic spectra—an "artificial atom" fabricated using standard lithographic techniques.

"Superconducting artificial atoms" are electronic circuits comprising lithographically defined Josephson tunnel junctions, inductors (L), capacitors (C), and interconnects. Conceptually, they begin as linear LC resonant circuits (i.e., simple harmonic oscillators), which are then made anharmonic to varying degrees by adding a nonlinear inductive element, the Josephson junction (JJ). When cooled to dilution refrigerator temperatures (~20 millikelvin), these superconducting circuits behave as quantum mechanical oscillators (e.g., "artificial atoms") exhibiting quantized states of electronic charge, magnetic flux, or junction phase depending on the design parameters of the constituent circuit elements.

Three fundamental superconducting qubit modalities are: charge, flux, and phase. Each includes one or more Josephson junctions. The qubit comprises the two-lowest states and is addressed at a unique frequency, $f_{01}$. Qubit modalities represented include charge, quantronium, flux, capacitively shunted flux, 2D transmon, fluxonium, and 3D transmon qubits.

The term "superconducting qubit" generally refers to the ground and first-excited state of a superconducting artificial atom. Due to the anharmonicity imparted by the Josephson junction, the ground and first-excited states may be uniquely addressed at a frequency, $f_{01}$, without significantly perturbing the higher-excited states of the artificial atom. These two-lowest states thereby form an effective two-level system (i.e., a pseudo-"spin-1/2" system), and it is this degree of freedom that is used as the qubit, a quantum bit of information. Qubit participates in quantum annealing cycle and settle into one of two possible final states (0,1). Qubit used real valued constant (weight) which influences qubit's tendency to collapse into two possible final states. A "superconducting device," as defined herein, includes at least one of a superconducting trace, a superconducting interconnect, a partially superconducting interconnect, a Josephson junction, a superconducting qubit and a superconducting resonator during operation.

The term "coupler" as used herein refers to a physical device that allows one qubit to influence another qubit. An Inductor and/or a Josephson junction can be a part of coupler. A coupler may be characterized by a real valued constant (strength) that indicates controls or influence exerted by one qubit on another.

As quantum mechanical objects, superconducting qubits can be coherently controlled, placed into quantum superposition states, exhibit quantum interference effects, and become entangled with one another. The time scale over which a superconducting qubit maintains this type of quantum mechanical behavior, and thereby remains viable for quantum information applications, is generally called the "coherence time." The rate at which the qubit loses coherence is related to its interactions with the uncontrolled degrees of freedom in its environment.

The term "interposer" as used herein, refers to and includes a structure capable of electrically interconnecting and/or magnetically and/or inductively and/or capacitively coupling arrays of superconducting and/or non-superconducting conductors on two opposing circuitized substrates. An interposer may include superconductive and/or partially superconductive or conventional (non-superconducting) elements such as micro-bumps, solder paste or conductive paste, as well as conductive and/or superconductive thru-holes. Such an interposer, as defined herein, includes at least one dielectric layer (and may include many) and at least two external superconductive circuit layers (and possibly one or more internal superconductive circuit layers), with the layers each possibly including selective and/or a density array of contact locations. Examples of dielectric materials suitable for the at least one dielectric layer of the interposer include such materials as high resistive silicon, silicon oxide coated silicon, silicon nitride coated silicon, selective silicon oxide coated silicon, selective silicon nitride coated silicon, selective or entire low loss organic (e.g., BCB) coated silicon and combinations thereof. In one example, an interposer comprises a circuitized substrate. The circuitized substrate may be provided as a superconducting organic circuitized substrate and/or a conventional metal(s) organic circuitized substrate.

Example materials which may be used to provide conductive and/or superconductive thru-holes include, but are not limited to niobium (Nb), niobium nitride (NbN), titanium-niobium-nitride (TiNbN), titanium nitride (TiN), aluminum (Al), rhenium (Re), tungsten, silicide, diamond or any other possible superconducting metal and/or superconducting nitride and combinations thereof. In one example, conductive and/or superconductive thru-holes as defined herein include at least single and/or multilayer Titanium nitride where part of the Titanium nitride can be used as a silicon and titanium etch barrier. It is further possible to use titanium nitride single and/or multilayer materials with multiple composition and/or concentration gradient where at least one composition and/or concentration is superconducting during device operation.

A "substrate," as defined herein, refers to a chip carrier for flip-chip and/or wire bonding and/or 3D circuits. A substrate can be an active and/or a passive integrated circuit based carrier. Additionally, the substrate can be an active and/or passive TSV structure and/or an MCM and/or a single chip module-based chip carrier. The chip carrier can be Si based, organic based, ceramic based, Sapphire based or a combination thereof.

The term "superconducting multi-chip module (SMCM)" as used herein includes at least one dielectric layer (and may include many) and one or more superconductive circuit layers (and possibly one or more internal superconductive circuit layers) deposited or otherwise provided on a base substrate (e.g. Si or high resistive Si). Such superconductive circuit layers of the SMCM may be deposited, for example, using thin film technology. The SMCM may also include one or more superconductive vias and/or superconducting pads. In one embodiment, the superconducting pads may include one or more under bump metals. Examples of dielectric materials suitable for the at least one dielectric layer of the SMCM include, but are not limited to, such materials as silicon (Si), high resistive silicon, silicon oxide as dielectric on Si, silicon nitride as dielectric on Si, selective silicon oxide on silicon, selective silicon nitride on silicon, selective or entire low loss organic (e.g., BCB) coated silicon and combinations thereof.

In one example, SMCM circuits are fabricated on silicon wafers having a diameter of about 200 mm. The SMCMs may be fabricated using a niobium (Nb) based integrated-circuit fabrication process for integrating superconducting chips, for example.

In one embodiment, the process includes fabricating the SMCMs using a plurality of Nb metal layers (e.g., four Nb metal layers) of interconnects which are separated or otherwise spaced apart from each other a by Plasma-enhanced chemical vapor deposition (PECVD) silicon dioxide dielectric, for example. Additionally, in one embodiment the process utilizes I-line photolithography (e.g., about 365 nm) and planarization with chemical-mechanical polishing (CMP) for feature sizes down to about 0.6 μm, for example. In one embodiment, the maximum carrier chip size for the process may be about 50 mm×about 50 mm. In embodiments, wafer size and the process may limit the size of SMCM. For example, a wafer having a diameter of about 200 mm can be used to produce an SMCM having dimensions of about 50 mm×about 50 mm. Additionally, a wafer having a diameter of about 300 mm can be used to produce an SMCM having dimensions larger than about 50 mm×about 50 mm. Similarly, for an organic SMCM, the size of the SMCM will generally be larger than about 50 mm×about 50 mm.

In one embodiment, an SMCM includes four (or more) superconducting Nb layers and one or more Gold (Au)/Platinum (Pt)/Titanium (Ti) under bump metal (UBM) layers. Additionally, in one embodiment superconducting vias are fabricated between the metal layers of the UBM. In one example process, vias are etched into a PECVD silicon dioxide (SiO$_2$) dielectric of an SMCM. Additionally, in one example process, the vias are filled with a niobium metal of a subsequent superconducting layer of the SMCM. Indium bumps may be formed on top of the UBM(s) using an evaporation and lift-off process, for example.

Examples of materials which may be used to provide superconductive circuits, vias and pads include materials as niobium (Nb), niobium nitride (NbN), titanium-niobium-nitride (TiNbN), titanium nitride (TiN), aluminum (Al), rhenium (Re), or any other possible superconducting metal and/or superconducting nitride and combination. A substrate may have a Josephson junction and/or an embedded Josephson junction. It is further possible to use integrated and/or embedded capacitors, inductors, resistors. Patterned NbN can act as inductor. Capacitor may be planer, parallel plate, interdigitate and combinations thereof. Examples of materials from which resistors may be provided include, but are not limited to: platinum, molybdenum, molybdenum nitride and combinations thereof. The substrate can further have dielectric bridges, crossovers, air bridges and combinations. The term "superconducting multi-chip module (SMCM)" may be used when at least part of the circuits are superconducting during operation and used superconducting and/or conventional via between superconducting circuits for interconnects.

Superconducting multi-chip module (SMCM) can have conventional UBM conductor for heterogeneous integration as well as to protect the superconducting pad. We defined "superconducting multi-chip module (SMCM)" when at least part of the circuit is superconducting during operation. Superconducting multi-chip module (SMCM) can have active element such as various size Josephson junctions and passive elements such as inductors, resistors, transformers, and transmission lines. In one example, Superconducting multi-chip module (SMCM) is a niobium-based integrated-circuit fabrication process appropriate for integrating superconducting chips. It is based on four Nb metal layers separated by PECVD silicon oxide dielectric. It utilizes I-line (365 nm) photolithography and planarization with chemical-mechanical polishing (CMP) for feature sizes down to 0.8 micron. There are four superconducting Nb layer and used Ti—Pt—Au as under bump metal layer.

Superconducting vias are created between metal layers. In a typical process, vias are etched into PECVD SiO$_2$ dielectric and filled with niobium metal of the subsequent superconducting layer. Superconducting multi-chip module (SMCM) may be used to assemble multiple superconducting and/or conventional chips. Similarly, superconducting single-chip module (SSCM) may be used to assemble a single superconducting or conventional chip. The term "superconducting module" or "superconducting substrate" includes both superconducting multi-chip module (SMCM) and superconducting single-chip module (SSCM). We use the term "conventional module" or "conventional substrate" which includes both multi-chip module (MCM) and single-chip module (SCM). Both superconducting and conventional module able to attach superconducting and/or conventional conducting chips.

"Cryogenic electronic packaging" is defined herein as integration and packaging of electronic components for cryogenic (77° K and below) applications. It is possible cryogenic electronic package can be used for room temperature electronics as well. For example, interface electronics which need to interface between cryo and room temperature electronics may be able to operate at both temperature zones. It also possible that cryogenic electronic package can be used for specific temperature operation (e.g., 4-10° K, below 100° mK). For example, superconducting niobium electronics generally operates below 8° K and below, whereas superconducting Aluminum electronics generally operates below 500° mK.

The term "under bump metal (UBM)" (or "under bump metallization (UBM)") as used herein refers to structures which include materials which provide a relatively low resistance electrical connection to the superconducting pad. A UBM may adhere to the underlying superconducting pad and to passivation layers of surrounding superconducting circuits, hermetically sealing the superconducting circuits from the environment. In some cases, a UBM may provide a strong barrier to prevent the diffusion of other bump metals into the superconducting circuits.

A top layer of a UBM is preferably readily wettable by the bump metals, for solder reflow. In one embodiment a UBM uses multiple different metal layers, such as an adhesion layer, a diffusion barrier layer, a solderable layer, and an oxidation barrier layer. It is further possible that the UBM layers are compatible metals which in combination have low internal mechanical stresses. Example of materials from which a UBM may be provided include, but are not limited to: 20 nm Ti-50 nm Pt-150 nm Au, 10 nm Ti-50 nm Au, 5 nm Ti-5 nm Pt-5 nm Au-1000 nm Indium, 5 nm Ti-5 nm Pt-5 nm Au-1000 nm Sn, 50 nm Pt-100 nm Au, 5 nm Ti-500 nm In, 20 nm Ti-1000 nm In, Ni—Au, Ni—Pd—Au, Pd—Au, Ti—TiN, Ti—TiN—Ti—Au, Ti—TiN—Ti—In, Ti—TiN—Ti—Sn, Ti—Sn—In etc.

The term "superconducting interconnect" or "partially superconducting interconnect" as used herein refers to structures including at least one superconducting bump and at least one UBM to create electrical and/or mechanical connection between two superconducting circuits. We defined "superconducting interconnect" when superconducting bump and superconducting UBM create superconducting interconnect between two superconducting circuits during operation. We also defined "superconducting interconnect" when superconducting bump and conventional UBM conductor create superconducting interconnect between two superconducting circuits during operation. Here, a conventional UBM conductor becomes superconducting due to proximity effect.

Example compositions of superconducting interconnects include, but are not limited to: (10-400)nm Al-(3-20)nm Ti-(5-40)nm Au-(1-5)μm In-(5-40)nm Au-(5-20)nm Ti-(10-400)nm Al. In such examples, Al is used as a superconducting pad and Ti—Au or Ti—Au-thin (≤1000 nm) Indium can act as a UBM. It is possible for Au thickness in the interconnect part to be consumed by Indium and rest of the Au will superconducting based on proximity.

Additional example compositions of superconducting interconnects include: (10-400)nm Al-(3-20)nm Ti-(1-5)μm In-(5-20)nm Ti-(10-400)nm Al, (10-400)nm Al-(1-5)μm In-(10-400)nm Al, (10-400)nm Al-(3-20)nm Ti-(5-40)nm Au-(1-5)μm In-(1-5)μm Sn-(5-40)nm Au-(5-20)nm Ti-(10-400) nm Al, and (10-400)nm Nb-(3-20)nm Ti-(5-40)nm Au-(1-5)μm In-(5-40)nm Au-(5-20)nm Ti-(10-400)nm Nb.

Further example compositions of superconducting interconnects include: (10-400)nm Nb-(3-20)nm Ti-(1-5)μm In-(5-20)nm Ti-(10-400)nm Al, (10-400)nm Nb-(1-5)μm In-(10-400)nm Nb, (10-400)nm Al-(3-20)nm Ti-(5-40)nm Au-(1-5)μm In-(1-5)μm Sn-(5-40)nm Au-(5-20)nm Ti-(10-400) nm Al, and (10-400)nm Al-(3-20)nm Ti-(5-200)nm TiN-(1-5)μm In-(5-200)nm TiN-(5-20)nm Ti-(10-400)nm Al, (10-400)nm Al-(3-20)nm Ti-(5-200)nm TiN-(5-40)nm Au-(1-5) μm In-(5-40 nm) Au-(5-200)nm TiN-(5-20)nm Ti-(10-400) nm Al. Additional example compositions of superconducting interconnects include: (10-400)nm Nb-(3-20)nm Ti-(5-200)nm TiN-(1-5)μm In-(5-200)nm TiN-(5-20) nm Ti-(10-400)nm Nb, (10-400)nm Nb-(3-20)nm Ti-(5-200) nm TiN-(5-40)nm Au-(1-5)μm In-(5-40 nm) Au-(5-200)nm TiN-(5-20)nm Ti-(10-400)nm Al, and combinations thereof.

A "partially superconducting interconnect" is defined herein to describe a conductor interconnect between two superconducting circuits during operation provided from a superconducting bump and a conventional UBM conductor. Here, conventional UBM conductors dominate interconnect conductance although part of the interconnect is superconducting due to presence of a superconducting bump. In one example, superconducting interconnects include Al-UBM-Indium-UBM-Al or Nb-UBM-In-UBM-Nb. Examples of initial interconnect composition prior to bonding with second superconducting substrate include, but are not limited to: Ti(5 nm)-Au(20 nm)-8 um In, Ti(5 nm)-Au(100 nm)-8 um In, Ti(5 nm)-Au(50 nm)-8 um In, Ti(5 nm)/Pt(20 nm)/Au(20 nm)+8 um In, Ti(5 nm)/Pt(20 nm)/Au(20 nm)+8 um In, Ti(5 nm)/Pt(50 nm)/Au(100 nm)+8 um In, Ti(5 nm)/Pt (50 nm)/Au(150 nm)+8 um In, 8 um Indium-1 um tin, 4.5 um Indium-4.5 μm tin, 6 um Silver bump with 2 um In, 5 nm Ti-6 um Ag-5 nm Ti-50 nm Pt-100 nm Au-2 um In, Al—In, Pb—In, Pb—Ti—In, Pb—Sn—In, Pb—Sn—In—Au(10 nm). Nb—Pb—Sn—In, Nb—Pb—In, Nb—Ti(5 nm)-Pb(8 um)-In(2-5 um), 48Sn-52In etc. In one example, a total interconnect resistance for an Al based superconducting substrate may be calculated as: interface resistance of Al-UBM+interface resistance of (UBM-In)+interface resistance of (In-UBM)+interface resistance of UBM-Al.

In this example, it is assumed that an Al pad is used for both superconducting integrated circuits and/or modules for creating superconducting and/or partially superconducting interconnects, assuming UBM resistance negligible in the range of nano ohm and Indium, aluminum superconducting during device operation. R(Al-UBM): contact resistance and R(UBM-In):interface resistance between bump and UBM. If Indium is used as a material from which to provide a UBM, then a Total Resistance (TR) may be computed as TR=2R (Al-UBM) assuming Indium to indium mixing much better and indium is superconducting. In this case, a contact resistance [R(Al-UBM)] will be superconducting due to proximity. So, keeping same materials as UBM as well as bump has many benefits other than adding multiple materials.

A Josephson junction is defined as two superconductors allowed interacting through a so-called "weak link," where the "weak link" may be provided from a thin insulating barrier, a conventional metal, or a narrow superconducting constriction—respectively referred to as an S-I-S, S-N-S, or S-C-S junction. A supercurrent flows/tunnels through this weak link, even in the absence of a voltage. The critical current of the junction is related to the superconducting gap of the electrode materials as well as the type and thickness of the insulating barrier. It is often characterized by a critical current density Jc and the area A of the junction such that Ic=Jc×A.

Josephson tunnel junctions are formed by two superconducting electrodes separated by a very thin (~1 nm) insulating barrier. In this configuration, the collective superconducting order of one electrode (parameterized by a phase $\varphi_1$) coherently connects with that of the other electrode ($\varphi_2$) via the elastic tunneling of Cooper pairs through the barrier. The resulting supercurrent, I, and junction voltage, V, are related to the superconducting phase difference, $\varphi=\varphi_1-\varphi_2$, across the junction A circuit quantum electrodynamics (circuit QED) may be used to address and measure a superconducting qubit. Circuit QED and superconducting qubits may be coupled to the electric field in a planar transmission line resonator. For cavity QED an atom in the cavity interacts with the trapped photons, and a measurement of the photons leaking out of the cavity allows one to probe the state of the atom.

In circuit QED, the cavity is replaced by a λ/2 transmission line resonator that interacts with the outside world via two capacitors, Cin and Cout. A superconducting qubit sits at a voltage anti-node in the resonator, where the capacitance between the qubit and the resonator sets the interaction strength. Measurements may determine a maximum number of photons leaking out of the resonator (RFout) when the impinging signal (RFin) is on or near resonance with the resonator-qubit system.

Superconducting quantum interference device (SQUID) may be provided from a superconducting loop interrupted by two Josephson junctions. The net critical current of the SQUID can be tuned by threading a magnetic flux through the loop. SQUID is a tunable Josephson junction, and this feature is used to make "tunable" superconducting qubits, i.e., qubits with a parameter related to the junction Ic that is tunable by the magnetic field that threads the SQUID loop.

As used herein, the term "Superconductive single-flux-quantum (SFQ) integrated circuit" is used to describe a circuit which operates at a cryogenic temperature of about 4 degrees Kelvin (K). The circuit is based on switching flux quanta in and out of superconducting loops containing Josephson junctions (JJs), for example. In embodiments, building circuits and logic gates exploiting SFQ operation involves combining loops and inductors for storing flux along with transformers and JJs for control and switching. In one relatively simple example SFQ circuit, a superconducting ring is interrupted by a single Josephson junction. Additionally, a transformer may couple an amount of magnetic flux into the superconducting ring which is proportional to an externally applied control current, for example. In embodiments in which the control current results in a loop current $I_L$ of the superconducting ring exceeding $I_c$, for example, a relatively short voltage pulse may result across the junction along with a 2*pi phase shift. Such corresponds to a single quantum of flux passing through the junction. In one embodiment, a characteristic switching time of the junction is about 1 picosecond (ps) and a switching energy of the junction is about $10^{-19}$ Joule (J).

Another example SFQ circuit includes a D flip-flop which has a storage loop formed by first and second junctions $J_1$ and $J_2$, and an inductor $L_2$. With a bias current applied to keep junction $J_1$ close to its critical current, an input 'D' pulse entering through a junction $J_0$ may switch junction $J_1$ and inject an SFQ pulse into a storage loop of the circuit. The foregoing may result in an increase in a circulating current Is passing through junction $J_2$. Readout of the circuit (and portions thereof) may be performed with an incoming clock (CLK) pulse. In a presence of a stored pulse Is, for example, an incoming CLK pulse may cause junction $J_2$ to switch, resulting in an output pulse at an output 'Q' of the circuit. With no stored pulse, the CLK pulse may be insufficient to switch junction $J_2$ and there may be no output pulse at output 'Q'.

In one embodiment, superconducting SFQ circuits are fabricated using a niobium-based superconducting integrated-circuit fabrication process for superconducting circuits. In one embodiment, the process includes fabricating the SFQ circuits using one or more Niobium (Nb)/(Aluminum-Aluminum Oxide) Al—$AlO_x$/Nb Josephson junction trilayers, for example, with a junction current $J_c$ of about 10 Killoamps (kA)/$cm^2$. The process may utilize about 248-nm photolithography and planarization with chemical-mechanical polishing (CMP) for wiring-layer feature sizes down to about 350 nm and Josephson junction diameters (and/or other dimensions) down to about 500 nm, for example. In embodiments, the SFQ circuits are fabricated using the process with Nb superconducting layers, molybdenum (Mo)-based resistance layers and Nb-based superconducting interconnects between substantially all metal layers. The process may support superconducting circuits with a single Josephson junction layer, for example. In embodiments, metal wiring layers (or metal layers) of the SFQ circuits are separated by a silica-based dielectric. Additionally, in embodiments microvias are used to interconnect the metal layers to form superconducting circuits.

As used here, the term "chemically activated surface" is used to describe a surface which is minimally etched and/or damaged. The hydrophilicity or hydrophobicity of the surface may be changed with appropriate plasma and/or chemical treatment by changing or modifying surface chemistry.

As used herein, the term "circuitized substrate" is used to describe a semiconductor structure including at least one dielectric layer, the at least one dielectric layer having at least one surface on which at least one circuit is disposed. Examples of dielectric materials suitable for the at least one dielectric layer include low temperature co-fired ceramic (LTCC), ceramic (alumina), fiberglass-reinforced or non-reinforced epoxy resins (sometimes referred to simply as FR4 material, meaning its Flame Retardant rating), polytetrafluoroethylene (Teflon), polyimides, polyamides, cyanate resins, photoimagable materials, and other like materials, or combinations thereof. Examples of electrically conductive materials suitable for the at least one circuit include copper and copper alloy. If the dielectric layer is provided from a photoimagable material, it is photoimaged or photopatterned, and developed to reveal the desired circuit pattern, including the desired opening(s) as defined herein, if required. The dielectric layer may be curtain coated or screen applied, or it may be supplied as a dry film or in other sheet form.

As used herein, the term "conductive fusible metal" is used to describe a metal including one or more of tin-lead, bismuth-tin, bismuth-tin-iron, tin, indium, tin-indium, indium-gold, tin-indium-gold, tin-silver, tin-gold, indium, tin-silver-zinc, tin-silver-zinc-copper, tin-bismuth-silver, tin-copper, tin-copper-silver, tin-indium-silver, tin-antimony, tin-zinc, tin-zinc-indium, copper-based solders, and alloys thereof. The metals may change forms (e.g., from a solid to a liquid) during a bonding or during post bonding annealing or reflow process.

As used herein, the term "conductive structure" is used to describe an interconnect structure for electrically coupling one or more interconnect pads, electrical connections, components, devices, modules, and semiconductor structures and devices. The conductive structure may include at least one of a micro via having a diameter which is between about one micrometer (μm) and about one-hundred fifty μm's and a sub-micron via having a diameter of less than about one μm.

As used herein, the term "via first" may be used to describe a micro via and/or a submicro via used to make at least one electrical connection between a first device layer and second device layer in a semiconductor structure including at least two device layers. Additionally, as described here, the term "via" first may also be used to describe a micro via and/or a submicro via passing through a dielectric material or layer (in some embodiments, only the dielectric material or layer) to make at least one electrical connection between a first device layer and a second device layer in a semiconductor structure including at least two device layers. For a via first process, the first device layer and the second device layer are completed separately. As one example, a partial via material is added on first and/or second opposing surfaces (i.e., top and/or bottom surfaces) of the first second device layers and subsequent bonding and/or post bonding process create a via first between the first and second device layers.

The via first may be filled with at least one metal or alloy having a high Coefficient of Thermal Expansion (CTE) to produce a rigid, robust, and conductive via first joint between the at least two device layers during the composite bonding process. High temperatures and/or high pressures may be applied and used to bond the two device layers and provide a three-dimensional (3D) interconnection (i.e., interconnect) among the device layers. The high CTE metal or alloy are expanded at relatively high temperatures and interdiffuse with each other to produce the 3D interconnect. Alternatively, the via first may be filled with a low temperature fusible metal which melts and interdiffuse during bonding or post bonding processes.

As used herein, the term "via last" is used to describe a micro via and/or a submicro via used to make at least one electrical connection between a first device layer and a second device layer in a semiconductor structure including at least two device layers. Fabrication of the first device layer is completed first, and the second device layer is deposited over the first device layer. The second device layer is completed with via last process. A pad layer which includes one or more interconnect pads may be added after via last process. In one embodiment, via last is filled. Additionally, in one embodiment, the via last can be unfilled or partially filled. Via last may pass through the device layers (e.g., second device layers) and, in some embodiments, one or more isolation layers or materials. A titanium (Ti) material having a thickness of about ten nanometers (nm), a metal organic chemical vapor deposition (MOCVD) Titanium Nitride (TiN) liner having a thickness of about five nm, and tungsten plugs may be used for via lasts. A MOCVD or chemical vapor deposition (CVD) $TiN_X$, with X less than or equal to 1, is preferred for better conformal coating.

As used herein, the term "CMOS (Complementary Metal Oxide Semiconductor)" is used to describe a semiconductor technology for constructing integrated circuits (which are also sometimes referred to herein as "chips"). Examples CMOS circuits include microprocessors, microcontrollers, static random access memory (RAM) and other digital logic circuits. Example CMOS circuits also include image sensors (or CMOS sensors), data converters and highly integrated transceivers for many types of communication applications. In one embodiment, CMOS circuits use complementary and symmetrical pairs of p-type and n-type metal oxide semiconductor field effect transistors (MOSFETs). CMOS circuits can include NMOS and/or PMOS transistors. The transistor can have a gate-source threshold voltage, below which the current (or sub threshold current) through the device drops exponentially, for example. In one embodiment, CMOS circuits may operate at supply voltages which are much larger than their threshold voltages. In another embodiment, a CMOS transistor can have a near zero threshold voltage (e.g., native transistor).

Operating temperatures of CMOS circuits and devices may be determined by a number of factors, including the properties of the basic semiconductor material (e.g., Si, gallium arsenide (GaAs), gallium nitride (GaN), silicon carbide (SiC), silicon germanium (SiGe), etc.) and the type of CMOS device (diode, bipolar transistor, field-effect transistor, etc.). Operating temperatures of CMOS circuits and devices may also be determined by circuit design of the device (e.g., materials, geometry and dimensions, interconnections), CMOS packaging and type of CMOS circuit (analog or digital). In one example, CMOS circuits and devices (e.g., Si MOSFETs, enhancement type MOSFETs, etc.) can operate at relatively low cryogenic temperatures because carriers needed for conduction in a channel of the devices can be ionized by an electric field from a gate terminal (or terminals) of the devices.

In embodiments, CMOS circuits (e.g., Si MOSFETs) can operate at deep (i.e., low) cryogenic temperatures, below the freeze-out of Si, for example. Additionally, in embodiments CMOS circuits may include various types of heterostructure FETs (HEMTs or MODFETs based on III-V semiconductors) which may not need thermal energy to ionize dopants of the FETs. In embodiments, the FETs can be used over substantially the entire cryogenic temperature range down to the lowest cryogenic temperatures. In one embodiment, CMOS circuits can include a Fin Field Effect Transistor (FinFET) and/or multiple-gate field-effect transistor (MuGFET) and/or FlexFET and/or multiple-independent-gate field-effect transistor (MIGFET) and/or heterojunction bipolar transistors (HBTs) and/or insulated-gate bipolar transistor (IGBT). In another embodiment, a CMOS device including homojunction (e.g., Ge and GaAs) and/or heterojunction bipolar transistors can operate to relatively low cryogenic temperatures and show increased performance on cooling compared, for example, to conventional transistors.

As used herein, the term "photonic integrated circuit or integrated optical circuit" is used to describe a device that integrates multiple (i.e., at least two) photonic functions into a chip and provides functions for information signals imposed on optical wavelengths (e.g., visible spectrum or near infrared about 850 nm-about 1650 nm). In one example, photonic integrated circuits are based on an indium phosphide and/or a indium gallium arsenide (InGaAs) substrate having optically active and passive functions on a same chip. In one embodiment, a photonic integrated circuit uses silicon photonics where Si is used as an optical medium. It is further possible to use $SiN_x$ based waveguide in a photonic integrated circuit. In another example, a photonic integrated circuit uses silicon electro-photonic circuits. In one example, the circuits use a $SiN_x$ based waveguide in $SiO_2$. Examples of photonic integrated circuits include monolithic tunable lasers, widely tunable lasers, externally modulated lasers and transmitters, integrated receivers, optical transceivers, etc.

As used herein, the term "superconductive adhesive" is used to describe a composite material including a nonconductive organic binder and one or more superconductive filler particles. In embodiments, the adhesive layer may also include one or more conventional metal particles. Electrical connections may be achieved using the adhesive primarily by inter-particle conduction, for example. When superconductive filler content of the adhesive is sufficiently high, for example, the adhesive may be transformed into a relatively good superconducting conductor. For electrical conduction, particles of the adhesive should make intimate contact (e.g., physical and/or tunneling contact) and form a network or conductive chain, which may help in the transfer of electrons. A conductive path may be formed at a threshold volume fraction of the superconductive filler which can be calculated using percolation theory of spherical particles, for example. In embodiments, an anisotropic conductive adhesive (ASA) may be suitable, for example, when a relatively narrow distribution superconductive spherical filler is used is and filler concentration is substantially below the threshold volume fraction.

As used herein, the term "through silicon via" (TSV) is used to describe a vertical interconnect which passes substantially through one or more of a silicon wafer, a silicon die, a silicon interposer, silicon active circuits, silicon passive circuits, or other silicon circuits, components or layers. TSVs can be fabricated by different methods and approaches. In silicon (Si) via-first approaches, for example, TSVs are fabricated prior to fabrication of active devices (i.e. bipolar or MOSFET devices) to which the TSVs may be coupled. The approach includes patterning the TSVs, lining the TSVs with a high temperature dielectric (thermal oxide or chemical vapor deposition), filling the TSVs with doped polysilicon and using chemical mechanical polishing (CMP) techniques to remove excess polysilicon from one or more surfaces of the TSVs. Si via-first approaches allow for the use of high temperature processes to insulate and fill the TSVs.

In Si via-middle approaches, TSVs are fabricated after forming the active devices to which the TSVs may be coupled, but before back end of line (BEOL) stack fabrication. The approach includes patterning the TSVs after a contact process, lining the TSVs with a low temperature dielectric deposition, and then filling the TSVs with single/multiple barrier metals. Typically the TSVs are filled with Copper (Cu) and/or W. For TSVs filled with Cu, a Cu seed layer is disposed on top of a barrier layer and a subsequent Cu electroplating fills the TSVs. The TSVs are then planarized using CMP techniques. For W, chemical vapor depositing (CVD) processes are used to fill the TSVs, and CMP techniques are used to remove excess polysilicon from one or more surfaces of the TSV. W is preferred for filling high aspect ratio TSVs (e.g., TSVs with aspect ratio of height-to-width>10:1). In general, Cu is used to fill low aspect ratio TSVs (e.g., TSVs with aspect ratio<10:1). Si via-middle process are useful for fabricating TSVs with a small via pitch, TSVs having minimal blockage of wiring channels, and TSVs having a low via resistance, for example.

In front side Si via-last approaches, TSVs are fabricated at the end of the BEOL processing of the wafer. Si via-last approaches are similar to Si via middle approaches, but Si via-last approaches use low temperature dielectric depositions (<400 C) compared to higher temperature dielectric compositions (<600 C) in Si via middle approaches. Front side Si via-last approaches may be suitable for their coarse TSV feature size, which simplifies the process of integrating TSVs into semiconductor structures. The front side Si via-last approaches may also useful for wafer-to-wafer bonding. In such approaches, TSVs can be formed at the end of the wafer-to-wafer bonding process, connecting multiple layers in the multi-layer (e.g., three-dimensional (3D)) stack of wafers or semiconductor structures.

Front side Si via-last approaches may use TSV etch as well as the entire BEOL dielectric stack. Backside Si via-last approaches also use wafer to wafer (or semiconductor structure to semiconductor structure) stacking. The wafers can be bonded together using oxide bonding or polymer adhesive bonding, either front-to-front or front-to-back. The wafers can be thinned by etching and/or polishing. Additionally, a TSV may be formed in the wafers by etching a via down to bond pads on a top wafer and a bottom wafer. The process includes patterning the TSVs after the contact process, lining the TSVs with a low temperature dielectric deposition, and then filling the TSVs with a single/multiple barrier metal (e.g., Cu and/or W). The TSVs are then planarized through a subsequent CMP process.

A number of inorganic and/or organic dielectric materials having a thickness in a range of about one hundred nanometers (nm) to about one thousand nm can be used to insulate the TSVs. TSV dielectrics may be required to have good step coverage (at least 50% through the depth of the trench), good thickness uniformity (<3% variation across the wafer), high deposition rate (>100 nm/min), low stress (<200 MPa), low leakage current (<1 nA/cm2), and high breakdown voltage (>5 MV/cm).

Plasma-enhanced chemical vapor deposition (PECVD) of SiO2 or SiN, or sub-atmospheric chemical vapor depositions (SACVD) of SiO2, are some examples of insulator deposition. The most commonly used conductors to fill TSVs are doped polysilicon (180 1ohm-cm), tungsten (5.6 1ohm-cm), or copper (1.7 1ohm-cm). W deposited by CVD has a good fill of the TSV and can be integrated with the contacts to which the TSVs are to be coupled. A TiN liner is required to ensure that the WF6 precursor does not attack the Si substrate in the TSV. A disadvantage of W compared to Cu is that it has a high intrinsic stress (1400 MPa for W, 20 MPa for Cu). TSV can be superconducting during qubit operation. A superconducting TSV comprises a Titanium Nitride (TiN) and/or poly Si and/or Al and/or high Q metal. TSV can be provided as a combination of titanium-titanium nitride-tungsten and/or titanium-titanium nitride-high Q materials-tungsten and/or titanium-titanium nitride-high Q materials and/or titanium-high Q materials-tungsten and/or high Q materials-tungsten and/or high Q materials, etc.

Reactive-ion-etching (RIE) may be used to create high aspect ratio TSVs and deep trench structures in the Si (i.e., for capacitors or for isolation) in which the TSVs are provided. In one embodiment, a TSV RIE Bosch process may be used to fabricate the TSVs, with process alternating between deposition and etching steps to fabricate deep vias. SF6 isotropic etching of Si may not be suitable for forming TSVs (which require a highly anisotropic etch). Fluorocarbon chemistry (e.g., C4F8) may be used for anisotropic etching achieved through the deposition of a chemically inert passivation on the sidewall of the TSVs.

Chemical mechanical polishing (CMP) may be used for planarization of metal filled vias (e.g., micro vias), for example. Additionally, a metal contact (i.e. pad) in an upper device layer (e.g., the second device layer) may be an annulus with an about a one point five micrometer (μm) opening that also functions as a self-aligned mask (e.g., hard mask) during the plasma etch of the oxide beneath it to reach a corresponding metal contact in a lower device layer (e.g., the first device layer). In order to fully dispose and electrically couple the via, the size of the metal contacts, and thus the pitch of the vertical interconnect, is made proportional to about twice the wafer-wafer misalignment of the wafers including the first and second device layers.

As used herein, the term "superconducting organic circuitized substrate" is used to describe a substrate structure including one or more dielectric layers and one or more conductive layers (e.g., external conductive layer). The conductive layers may be positioned or otherwise disposed on the dielectric layer. Additionally, the conductive layers may include a plurality of conductor pads as part thereof. The dielectric layers may include one or more of the following dielectric materials: fiberglass-reinforced epoxy resin ("FR-4") and polytetrafluoroethylene (e.g., Teflon), including polytetrafluoroethylene filled with inorganic particles (e.g., silica), for example, as a means of controlling the coefficient of thermal expansion of the dielectric material. The dielectric layers may also include polyimide (e.g., Kapton); polyamide, cyanate resin, photo-imageable material and other like materials. One example suitable material for the dielectric layers is currently sold under the product name "RO2800" by Rogers Corporation, Rogers, Conn. ("RO2800" is a trademark of the Rogers Corporation.)

The conductive layers, which may be provided as superconductive layer(s), preferably serve to superconduct or conduct electrical signals in the circuitized substrate. In one embodiment, the conductive layers preferably include metals such as Pb, Pb plated Cu, Pb plated Al, tin-lead or tin-lead plated copper. The conductive layers may also include or comprise additional superconducting or conventional metals (e.g., niobium, aluminum, titanium, platinum, gold etc.) or alloys thereof, example. In embodiments in which the conductive layers include conventional metals (e.g., Cu, Ni, Pt, Au, etc.) and/or alloy layers but no superconducting metals or materials, for example, a circuitized substrate may be referred to as a "conventional metal circuitized substrate."

One example superconducting circuitized substrate includes multiple superconducting and/or partial signal and/or power paths separated by an organic dielectric. The paths may be interconnected with each other by superconducting and/or partially superconducting vias, for example. In embodiments, superconducting building blocks of superconducting circuitized substrates can be laminated to achieve an electrical interconnection between adjacent blocks. Each superconducting building block can have signal, voltage, and ground planes, for example. It is also possible to use signal, voltage, and ground features on ae same plane of the circuitized substrate.

Two building blocks may be used to fabricate a superconducting circuitized substrate in one embodiment. One example building block (i.e., a first building block) is a signal core that is prepared by lamination and plating approaches. A lead (Pb) and/or tin-lead plated Cu based power plane (P) may be sandwiched or otherwise disposed between two (or more) layers of a relatively low dielectric constant (Dk) and relatively low loss (Df) dielectric. Alternatively the power plane can include a High Q metal or foil or High Q metal coated Cu plane. In embodiments, the dielectric is typically filled with low Dk particles to achieve a comparable coefficient of thermal expansion (CTE) with Cu. The low dielectric constant (Dk) and low loss (Df) dielectric may be favorable for electrical, mechanical, and thermal properties in some embodiments. Example low dielectric constant and low loss materials include: liquid crystal polymer (LCP), silica particle filled polytetrafluoroethylene (PTFE) and polyphenylene ether (PPE) superconducting circuitized substrate technology.

In one embodiment, signal (S) traces of the superconducting circuitized substrate are developed using a subtractive and/or additive and/or semi-additive (pattern plating) process. Such processes have been demonstrated to produce relatively fine lines (about 1-100 um) and spaces (about 2-100 um), along with laser or mechanical drilled or etched via in the range of about 1-200 µm, and an about 10-350 um plated capture pad around the via. A Pb and/or tin-lead plated Cu based signal trace is possible in some embodiments. Additionally, single or multiple high Q metal or high Q metal coated Cu based signal trace can be used in some embodiments. Dimensions of the signal trace may be selected, for example, to allow wiring designs to have one line per channel in densely populated areas of the chip site.

Another building block (i.e., a second building block) of the example superconducting circuitized substrate may include a so-called "joining layer," as defined below. In the second building block, a Pb and/or tin-lead plated Cu copper power plane may be sandwiched or otherwise disposed between layers of a dielectric. Examples of suitable dielectric materials for the dielectric can include resin coated conventional and/or superconducting material. In embodiments, laser or mechanical drilled through holes which may be formed in the dielectric, for example, may be filled with an electrically superconducting and/or partially superconducting paste. The paste may include conventional metals and/or superconducting metals and/or low melting point superconducting nano and/or micro size particles dispersed in a polymer matrix. The polymer matrix can include a mixture of a monomer and/or an oligomer which may become polymer during lamination. It is further possible to use at least one chemical cleaning agent or flowing agent or purifying agent which become part of polymer matrix during lamination. In embodiments, the paste may form one or more superconducting and/or partially superconducting connections between adjacent blocks (e.g., first and second blocks of the circuitized substrate) during lamination.

In embodiments, by alternating signal and joining portions in lays of the circuitized substrate prior to lamination, a superconducting adhesive formed from the paste may electrically connect pads of signal paths. The superconducting paste-filled interconnect technology may require the addition of a joining layer or core between each portion to be joined in some embodiments. For example, joining three structures or sub-composites (e.g., top, middle and bottom structures) together using interconnects may require at least two joining layers having superconducting paste-filled interconnects. The superconducting paste-filled interconnects may protrude above a surface of the circuitized substrate dielectric by about 5-10 µm in some embodiments. In one embodiment, lamination may be used to melt and attach or otherwise couple the protruding interconnects to circuitized sub-composites or portions adjacent to circuitized substrate joining layers.

One example advantage of this superconducting paste-filled interconnect approach is the ability to attach multiple, multilayer, substrates having different sizes. In embodiments, superconducting paste-filled interconnection methodology may be used to fabricate large area, high density rigid substrates for chips having a relatively tight pad pitch requirement. Different size rigid substrates may be laminated together with a superconducting paste-filled filled joining layer to achieve a superconducting and/or partially superconducting interconnection in a rigid structure or substrate. Electrical connections can be formed during lamination using superconducting paste-filled interconnects. As a result, one is able to fabricate structures with different sub-composites or portions of arbitrary size and shape. In embodiments, the interconnect technology offers many advantages over the more conventional structures, for example: a reduction in total processing steps, maximum possible metal layer counts, placement of multiple size rigid structures, opportunity for joining multiple rigid and/or flex layers, and the ability to grow individual 3-D structures from a same base substrate. Several different size rigid structures can be laminated with each other to produce a single packaging substrate working as one system.

As used herein, the term "miniaturized cryogenic packaging" is used to describe a package including multi-level assembly of a superconducting IC, a superconducting MCM (SMCM), interposer, dielectric interposer, circuitized circuit, etc. In embodiments, larger SMCMs and microbump technology favor convergence of chip carrier and board, and also eliminates multilevel assembly to provide unique miniaturized solutions for complex cryogenic packaging. Relatively large passive superconducting modules may horizontally connect multiple superconducting chips, for example, with IC-scale electrical routing between chips and MCM. Superconducting MCMs may be used to route power and signals from a multilayer superconducting MCM to chips through microbumps. In an example package, one or a few superconducting chips may be attached or otherwise coupled to an MCM and subsequently attached to a board or substrate through a BGA/wirebonding connection, for example.

In embodiments, a relatively high-density, finer pitch approach is capable of reducing connections and associated parasitic resistance and capacitance values between two given points on chips to enhance data throughput and functionality within a given footprint, for example. Cryogenic package miniaturization addresses multiple challenges including component footprint reduction, integration of active and passive components, I/O miniaturization, and high density (e.g., about 0.8-μm lines, about 2 μm spacing and about 2 μm via) superconducting interconnects. The advanced cryogenic packaging solution described herein may be found useful to achieve significant reductions in size and weight in cryogenic electronic packages.

In one embodiment, an example design feature enabling the most significant size and weight reduction is component footprint reduction. A typical backplane board assembly incorporates components such as actives, passives, and I/O components. Superconducting active components may be available in bare die flip-chip format, which provides the most leverage for size and weight reduction. However, the associated benefit can be severely limited without an enabling high-density superconducting module technology.

In some embodiments, superconducting modules are available in wirebond attached format. Wirebonding a high-density superconducting module directly to a high-density card may, for example, generally still require a footprint substantially larger than the die itself. Passive discrete components can be manipulated for miniaturization. A bill of materials review can identify surface mount capacitors, resistors, inductors, etc., where package size reduction and enhanced electrical performance is possible by replacing surface passive components with internally embedded components.

Connectors that are classified as I/O components can occupy significant volume and mass in an assembly in some embodiments. Replacing pin-in-hole connectors with relatively low-profile surface mount connectors may, for example, be used as a miniaturization technique for cryogenic packaging (e.g., to reduce the significant volume and mass associated with I/O component connectors).

An electronic component (also sometimes referred to herein as a "component") can include a discrete device or physical entity in an electronic system used to affect system operation. Components can be classified as passive, active, or electromechanical. Example components include a connector, a capacitor, a resistor, an inductor, a battery, integrated circuits, modules, bare and packaged die, etc.

As used herein, the term "electroplating" is used to describe a process by which a metal in its ionic form is supplied with electrons to form a non-ionic coating on a desired substrate. The process may use an electroplating system including a chemical solution which contains the ionic form of the metal, an anode (positively charged) which may consist of the metal being plated (a soluble anode) or an insoluble anode (usually carbon, platinum, titanium, lead, or steel). The electroplating system may also include a cathode (negatively charged) where electrons are supplied to produce a film of non-ionic metal.

As used herein, the term "electroless plating" (also known as chemical or auto-catalytic plating) is used to describe a non-galvanic type of plating method that involves several simultaneous reactions in an aqueous solution, which occur without the use of external electrical power. The reactions may be accomplished or otherwise occur when hydrogen is released by a reducing agent (e.g., sodium hypophosphite) and oxidized, producing a negative charge on a respective surface of a part or component on which the electroplating process is applied.

As used herein, the term "joining layer" is used to describe a structure capable of forming superconducting and partially superconducting contacts between devices (e.g., integrated circuits, MCM, interposers) and circuitized substrates such as PCBs. In embodiments, the joining layer may use extremely small superconductive or partially superconductive elements such as bump or microbumps, plated vias or superconductive conductive paste quantities. A joining layer may include at least one dielectric layer. Additionally, a joining layer may include at least one superconductive and/or conventional metal conductive circuit layer. The circuit layer may include a relatively high density array of contact locations, for example. Example suitable dielectric materials for the at least one dielectric layer include such materials as fiberglass-reinforced epoxy resins and polytetrafluoroethylene, including polytetrafluoroethylene filled with inorganic particles (e.g., silica), for example, as a means of controlling the coefficient of thermal expansion of the dielectric material. Example suitable dielectric materials also include polyimides, polyamides, cyanate resins, polyphenylene ether resins, liquid crystal polymers, photo-imageable materials, and other like materials.

In embodiments in which the dielectric material(s) for the at least one dielectric layer are photo-imageable, the material(s) may be photo-imaged (or photo-patterned) and developed to reveal a desired pattern of openings in the dielectric layer. The dielectric material(s) may be curtain-coated, spin-coated or screen-applied, or supplied as dry film, for example.

In one embodiment, the joining layer is fabricated through a process including drilling or otherwise forming openings or thru-holes in the dielectric layer(s). The joining layer may be capable of forming a containment structure between an interposer and a PCB or substrate as part of a larger multilayered circuitized substrate, for example. Thru-holes in the dielectric layer(s) (e.g., an organic insulator) may be positioned or formed such that a superconducting paste may be disposed therein. The paste may include normal conventional metal and superconducting metal and/or alloy and be used to form respective superconducting and/or partially superconducting interconnects in the dielectric layer openings. In one embodiment, the interconnects each extend between conventional metal or conventional metal coated conductors in a cryogenic electronic package in which the joining layer is provided (e.g., to provide a conductor-superconductor-conductor coupling arrangement). In one embodiment, the superconducting paste is substantially constrained during lamination, for example, while the openings in the dielectric layer(s) surround the interconnects formed from the paste, without adversely affecting the superconducting and/or partially superconducting connection formed.

Referring to FIGS. 1-8A, example cryogenic electronic packages according to the disclosure and example cryogenic electronic assemblies which may use the cryogenic electronic packages are shown. It should be appreciated that the example cryogenic electronic packages described below (e.g., 100, shown in FIG. 1) are but several of many potential configurations of cryogenic electronic packages in accordance with the concepts, systems, circuits and techniques described herein. Additionally, it should be appreciated that the example cryogenic electronic assemblies described below (e.g., 200, shown in FIG. 2) are but several of many representative cryogenic electronic assemblies which may use the cryogenic electronic packages.

Referring to FIG. 1, a first example cryogenic electronic package 100 according to the disclosure includes a substrate 110, an interposer 120 and a superconducting multichip module (SMCM) 130. The cryogenic electronic package 100 also includes a first superconducting semiconductor structure 140 and a second superconducting semiconductor structure 150.

Substrate 110 (e.g., a conventional non-superconducting circuitized substrate) has first and second opposing surfaces and includes a plurality of electrical connections (e.g., vias) (not shown) extending between selected portions of the first and second surfaces. The substrate 110 also includes a plurality of interconnect pads (here, interconnect pads 111, 111', 111'', 111''', 111'''', 111''''', 111'''''') which have first and second opposing surfaces. Interconnect pads 111, 111', 111'', 111''', 111'''', 111''''', 111'''''' (e.g., conventional Aluminum (Al) or Gold (Au) interconnect pads) each have a surface (e.g., a first surface) disposed over or otherwise coupled to selected portions of the second surface of the substrate 110.

In the illustrated embodiment, interconnect pad 111 is electrically coupled to interconnect pad 111' through a conductive structure 112, interconnect pad 111'' is electrically coupled to interconnect pad 111''' through a conductive structure 113, and interconnect pad 111'''' is electrically coupled to interconnect pad 111''''' through a conductive structure 114 (e.g. a conductive and/or superconductive trace coupled to one or more of the pads through a conductive and/or superconductive via). One or more of the interconnect pads (e.g., 111) and/or the conductive structures (e.g., 112) may be coupled to one or more of the electrical connections in the substrate 110. Additionally, one or more of the conductive structures (e.g., 112) may be a conductive or superconductive via.

Interposer 120 (e.g., a multi-layer high density substrate or passive superconducting base), which electrically couples one or more semiconductor structures (e.g., 130) to the substrate 110 and/or to each other, as will be discussed further below, has first and second opposing surfaces. The interposer 120 includes a first plurality of interconnect pads (here, interconnect pads 121, 121', 121'', 121''', 121'''') and a second plurality of interconnect pads (here, interconnect pads 122, 122', 122'', 122''') which have first and second opposing surfaces.

The first plurality of interconnect pads 121, 121', 121'', 121''', 121'''' each have a surface disposed over or otherwise coupled to selected portions of the second surface of the first surface of the interposer 120. Additionally, the second plurality of interconnect pads 122, 122', 122'', 122''' each have a surface disposed over or otherwise coupled to selected portions of the second surface of the interposer 120.

In the illustrated embodiment, interconnect pad 121 is electrically coupled to interconnect pad 122 through a conductive structure 123 (e.g., a via), and interconnect pad 121' is electrically coupled to interconnect pad 122' through a conductive structure 124. Additionally, in the illustrated embodiment, interconnect pad 121'' is electrically coupled to interconnect pad 122'' through a conductive structure 125, and interconnect pad 121'' is electrically coupled to interconnect pad 122''' through a conductive structure 126.

The interconnect pads (e.g., 121) and conductive structures (e.g., 123) of interposer 120 (e.g., a conventional or superconducting interposer) each include one or more electrically conductive materials. In embodiments in which the interposer 120 is a conventional interposer (i.e., a non-superconducting interposer), for example, the electrically conductive materials of the interconnect pads and conductive structures may be conventional conductive materials (e.g., Au). Additionally, in embodiments in which the interposer 120 is a superconducting and/or a partially superconducting interposer, and the electrically conductive materials of the interconnect pads and conductive structures may be superconducting and/or partially superconducting conductive materials (e.g., Indium (In) or Niobium (Nb)).

Superconducting multichip module (SMCM) 130 has first and second opposing surfaces and includes a plurality of electrical connections (e.g., 132) extending between selected portions of the first and second surfaces. In embodiments, the SMCM 130 is a silicon (Si) based SMCM. For example, the SMCM 130 may fabricated on a Si wafer (e.g., a 4-layer Nb based superconducting substrate) through a Niobium (Nb) based integrated circuit (IC) fabrication process appropriate for integrating superconducting semiconductor structures or chips. The Nb based IC fabrication process may include fabricating a plurality of interconnects (e.g., superconducting interconnects or vias), with the interconnects including a plurality (e.g., four) of metal (e.g., Nb) layers. In one embodiment, SMCM 130 has an about 0.6-1 μm minimum superconducting line, an about 1-2 μm minimum superconducting line space and an about 1.5-2.5 μm minimum superconducting via connecting or otherwise coupling the superconducting lines. The interconnects may, for example, be separated from each other by a silicon oxide dielectric fabricated by a plasma-enhanced chemical vapor deposition (PECVD) process.

In some embodiments, the SMCM 130 can also be an organic superconducting circuitized substrate. For an organic SMCM 130, for example, it is possible to use flip-chip bonding between SMCM 130 and interposer 120. Additionally, for an organic SMCM 130 it is possible to eliminate interposer 120 and associated interconnects and directly bond or otherwise couple the SMCM 130 with substrate 110 using a BGA (e.g., 165) connection, for example.

First superconducting semiconductor structure 140 (e.g., a superconducting integrated circuit (IC)) has first and second opposing surfaces and includes at least one first superconducting component.

In embodiments, the first superconducting semiconductor structure 140 is or includes a single flux quantum (SFQ) IC or chip such as a rapid single flux quantum (RSFQ) chip or an efficient rapid single flux quantum (ERSFQ) chip. The SFQ IC may be or include a multi-layer (e.g., an 8-layer) Niobium (Nb) based SFQ IC. Additionally, in embodiments, the first superconducting semiconductor structure 140 may be or include a reciprocal quantum logic (RQL) chip, a adiabatic quantum flux parametron (AQFP) chip or a complementary metal-oxide-semiconductor (CMOS) chip.

In embodiments, the at least one first superconducting component of the first superconducting semiconductor structure 140 includes one or more shunted or unshunted Josephson Junctions (JJs) and/or shunted resistors, capacitors, inductors, etc. In embodiments, the JJs include multiple different size JJs. The JJs may also include oxide coated Josephson Junctions and the at least one first superconducting component may include a same oxide layer or at least part of an oxide layer used to create embedded and/or integrated capacitors.

Second superconducting semiconductor structure 150, which may be the same as or similar to the first superconducting semiconductor structure 140 in some embodiments, has first and second opposing surfaces and includes at least one second superconducting component. In embodiments, the at least one second superconducting component of second superconducting semiconductor structure 150 is substantially the same as the at least one first superconducting component of first superconducting semiconductor structure 140.

In one embodiment, first superconducting semiconductor structure 140 can be or include a SFQ chip and second superconducting semiconductor structure 150 can be or include a qubit chip. In another embodiment, first superconducting semiconductor structure 140 and second superconducting semiconductor structure 150 can be or include a qubit chip and SMCM 130 can have or include SFQ circuits. In a further embodiment, first superconducting semiconductor structure 140 can be or include a face down flip chip and second superconducting semiconductor structure 150 can be or include a face up wirebondable chip. In embodiments in which second superconducting semiconductor structure 150 is a faceup wirebondable chip 150, for example, interconnects structures (e.g., 195, 198) used for coupling second superconducting semiconductor structure 150 to first SMCM 130, may be replaced by conductive and/or nonconductive paste bumps which allow liquid helium or an exchange gas to go inside the second superconducting semiconductor structure 150. The conductive and/or nonconductive paste bumps may also eliminate possible hotspots between second superconducting semiconductor structure 150 and first SMCM 130 and maintain low temperature superconductivity.

In one embodiment, first superconducting semiconductor structure 140 has CMOS transistors which operate at temperatures of about 4.2K and second superconducting semiconductor structure 150 has one or more Josephson Junctions. In another embodiment, first superconducting semiconductor structure 140 has CMOS transistors and second superconducting semiconductor structure 150 has at least one Josephson Junction structure to create hybrid memory structure. In a further embodiment, second superconducting semiconductor structure 150 has Josephson Junctions, and the Josephson Junctions can be used to measure propagation delays of first superconducting semiconductor structure 140. It is also possible that first superconducting semiconductor structure 140 chip works or functions differently at room temperature when attached to SMCM 130.

Interposer 120 of cryogenic electronic package 100 is coupled (e.g., electrically and mechanically coupled) to substrate 110 through interconnect structures 161, 162, 163, 164, 165. In particular, the interconnect structures (e.g., 161) are disposed between selected surfaces (e.g., first and second surfaces) of the substrate 110 and the interposer 120. Additionally, the interconnect structures are coupled to respective ones of the interconnect pads provided on the substrate 110 and the interposer 120 to form one or more electrical connections between the interposer 110 and the substrate 120.

SMCM 130 of cryogenic electronic package 100 is coupled to interposer 120 through an adhesive layer 170 and through wire bonding structures 181, 182. In particular, adhesive layer 170 is disposed between selected surfaces (e.g., first and second surfaces) of the interposer 120 and the SMCM 130. Additionally, wire bonding structure 181 has a first portion coupled to interconnect pad 122' of interposer 120 and a second opposing portion coupled to SMCM 130 (e.g., electrical connection 131 of SMCM 130). Further, wire bonding structure 182 has a first portion coupled to interconnect pad 122" of interposer 120 and a second opposing portion coupled to SMCM 130 (e.g., electrical connection 138 of SMCM 130).

First superconducting semiconductor structure 140 of cryogenic electronic package 100 is coupled to SMCM 130 through interconnect structures 191, 192, 193, 194. Additionally, second superconducting semiconductor structure 150 is coupled to SMCM 130 through interconnect structures 195, 196, 197, 198. In particular, the interconnect structures (e.g., 191) are disposed between selected surfaces (e.g., first and second surfaces) of the SMCM 130, first superconducting semiconductor structure 140 and second superconducting semiconductor structure 150. Additionally, the interconnect structures are coupled to selected portions (here, interconnect pads) of the SMCM 130, first superconducting semiconductor structure 140 and second superconducting semiconductor structure 150.

In one embodiment, the interconnect structures (e.g., 191) include Indium (In) microbumps and the In microbumps couple the first and second superconducting semiconductor structures 140, 150 to the SMCM 130 through a thermocompression bonding process, for example. In one embodiment, the In microbumps perform at least three functions. For example, the microbumps may: provide adhesion between the first and second superconducting semiconductor structures 140, 150 and SMCM 130. Additionally, the microbumps may provide a low-resistance and/or substantially no resistance electrical interconnect. Further, the microbumps may provide minimum spacing between the first and second superconducting semiconductor structures 140, 150 and SMCM 130.

In another embodiment, the interconnect structures (e.g., 191) include adhesive-bonded microbumps or consist of indium or solder coated microbumps or solder coated micropillars surrounded by a polymer resin. In some embodiments, both superconducting semiconductor structures 140, 150 and SMCM 130 include at least a portion of the interconnect structures and are bonded together to interconnect structure 191, for example (i.e., a complete interconnect structure).

It is further possible for the interconnect structures to be disposed on the SMCM 130 before bonding or coupling the first and second superconducting semiconductor structures 140, 150 to the SMCM 130. In one embodiment, the interconnect structures each have a height (i.e., a distance between first and second opposing portions) ranging from about 5 micron to about 100 micron after bonding and an initial height before bonding ranging from about 5 micron to about 100 micron. As one example, an about 5-15 micron tall 15 micron diameter indium microbump after bonding may create an about 2-4 micron tall interconnect (e.g., 191). As another example, an about 6-50 micron tall 30-50 micron diameter indium microbump after bonding may create about 2-30 micron tall interconnect. In some embodiments, it is also possible to create an interconnect pitch in the range of about 5-150 microns. In embodiments, the interconnect structure (e.g., 191, 198, 195, etc.) are each coupled to respective pads (e.g., interconnect pads) of first and second superconducting semiconductor structures 140, 150 and respective pads of the SMCM 130. The pads of the first and second superconducting semiconductor structures 140, 150 and the pads of the SMCM 130 may each include a superconducting metal and/or conventional metal pad covered with a UBM in some embodiments.

The interconnect structures (e.g., 161) used to couple interposer 120 to substrate 110 may, for example, be conventional interconnect structures in embodiments in which at least one of the interposer 120 and the substrate 110 is a conventional semiconductor structure (i.e., a non-superconducting semiconductor structure). The conventional interconnect structures may include one or more non-superconducting materials (e.g., Copper (Cu)).

Additionally, the interconnect structures used to couple interposer 120 to substrate 110 may be superconducting or partially superconducting interconnect structures, for example, in embodiments in which at least one of the interposer 120 and the substrate 110 is a superconducting or partially superconducting semiconductor structure. The superconducting or partially superconducting interconnect structures may include one or more superconducting and/or partially superconducting materials (e.g., Niobium (Nb) or Indium (In)).

In embodiments, the interconnect structures used to couple interposer 120 to substrate 110 are the same as or similar to those which are described in co-pending U.S. patent application Ser. No. 15/342,444 entitled "Interconnect Structures And Methods For Fabricating Interconnect Structures," which is assigned to the assignee of the present disclosure and incorporated herein by reference in its entirety.

Additionally, in embodiments the interconnect structures used to couple interposer 120 to substrate 110 may form a ball grid array (BGA) type assembly or another type of assembly on at least one of the substrate 110 and the interposer 120. In one embodiment, the BGA type assembly may be replaced with a solder coated Cu pillar assembly, for example. Additionally, in one embodiment the BGA type assembly can be replaced with LGA (land grid array) connection.

In one embodiment, at least one of interposer 120 and substrate 110 has an associated semiconductor package pitch, and the interconnect structures (e.g., 161) used to couple interposer 120 to substrate 110 have one or more characteristics (e.g., dimensions) selected in accordance with the package pitch. For example, in one embodiment, the size and shape of the interconnect structures may be selected to achieve a desired pitch (e.g., a pitch requirement of substrate 110 or interposer 120). Additionally, the size and shape of the interconnect structures may be selected to achieve a desired spacing or gap G1 (e.g., about 8 mm) between substrate 110 and interposer 120. The gap G1 may be selected, for example, to achieve a low resistance and/or predetermined inductive coupling between substrate 110 and interposer 120. In one embodiment, interposer 120 has a minimum pitch of about 500 µm, for example. Additionally, in one embodiment, SMCM 130 has a minimum pitch of about 35 µm. The pitch may determine wiring density of the SMCM 130. In general, the pitch increases as you go from interconnect structures (e.g., 191) used to couple superconducting semiconductor structures 140, 150 to SMCM 130, for example, to the interconnect structures (e.g., 161) used to couple first interposer 120 to substrate 110.

The interconnect structures (e.g., 191) used to couple superconducting semiconductor structures 140, 150 to SMCM 130, similar to the interconnect structures (e.g., 161) used to couple interposer 120 to substrate 110, may be superconducting or partially superconducting interconnect structures.

Additionally, in embodiments, the interconnect structures used to couple superconducting semiconductor structures 140, 150 to SMCM 130 may form a microbump type assembly or another type of assembly on at least one of the SMCM 130, the first superconducting semiconductor structure 140, and the second superconducting semiconductor structure 150. An example advantage of microbump technology is the ability to attach or otherwise couple a plurality of multilayer superconducting semiconductor structures or chips (e.g., multi-layer semiconductor structures) on a superconducting semiconductor structure (e.g., SMCM 130). The superconducting semiconductor structures (e.g., 140, 150) may be same or different sizes from each other.

In embodiments, superconducting semiconductor structures 140, 150 are coupled to SMCM 130 through the interconnect structures 191, 192, 193, 194, 195, 196, 197, 198 using a flip chip bonding process. Additionally, in embodiments, superconducting semiconductor structures 140, 150 include one or more under bump metal (UBM) pads (not shown) disposed on at least one of the first and second surfaces of the superconducting semiconductor structures 140, 150 (e.g., for coupling to the interconnect structures during the flip chip bonding process). The UBM pads may include multiple layers and/or multiple materials. For example, the UBM pads may include 20 nm of Ti (e.g., an adhesion layer), 50 nm of Pt (e.g., a barrier layer) and 150 nm of Au (e.g., a solder wettable surface).

The adhesive layer 170 used to couple SMCM 130 to interposer 120 may include one or more adhesive materials such as glues, pastes, epoxies and adhesive tapes. Additionally, the wire bonding structures 181, 182 used to couple SMCM 130 to interposer 120 may be conventional wire bonding structures (e.g., comprising Aluminum (Al) or Gold (Au)), for example, in embodiments in which the SMCM 130 is alternatively provided as a conventional (i.e., no-superconducting MCM). Further, the wire bonding structures 181, 182 may be superconducting and/or partially superconducting wire bonding structures (e.g., comprising Indium (In)) in embodiments, such as the illustrated embodiment, in which the MCM 130 and superconducting semiconductor structures 140, 150 are each superconducting and/or partially superconducting semiconductor structures. Alternatively, the wire bonding structures 181, 182 can be ribbon bonding and/or spring bonding and/or gold coated Cu bonding structures, and/or solder coated gold bonding structures, etc.

The adhesive layer 170 is optional in some embodiments. In such embodiments, the SMCM 130 may be substantially directly attached or otherwise coupled to the interposer 120. In some embodiments, adhesive layer 170 is made with filled silicone or a filled epoxy based system. For example, in one embodiment, adhesive layer 170 is made of a silver filled epoxy. In another embodiment, an adhesive dot (e.g., an individual adhesive dot) may be used instead of adhesive layer 170. The adhesive dot may, for example, be used as a spacer and form channels that allow liquid helium to flow inside the MCM during system operation, for example, helping to dissipate heat efficiently between SMCM 130 and interposer 120.

With the above-described coupling arrangement of cryogenic electronic package 100, SMCM 130 is capable of distributing electrical signals (which may contain information or data) among the fourth and fifth superconducting semiconductor structures 140, 150 (e.g., superconducting ICs). Additionally, with the above-described coupling arrangement, the SMCM 130, fourth superconducting semiconductor structure 140, and second superconducting semiconductor structure 150 may be electrically coupled to the substrate 110 through the interposer 120 (e.g., a "fan-out" layer). For example, the interposer 120 may be used to route power and signals to/from substrate 110 and the SMCM 130, fourth superconducting semiconductor structure 140, and second superconducting semiconductor structure 150. In one embodiment, the interposer 120 redistributes wirings (e.g., signal, power, ground routings) of SMCM 130 in such a way that interposer 120 is capable of utilizing substantially all real estate of circuitized substrate 110 in order to miniaturize cryogenic electronic package 100. For example, in one embodiment interposer 120 is capable of utilizing real estate of circuitized substrate 110 just underneath of SMCM 130 (i.e., underneath the first surface of SMCM 130). This way it is possible to miniaturize circuitized substrate 110 and/or increase a number of SMCM 130 within a given space of circuitized substrate 110.

In one aspect of the disclosure, by providing interposer 120 between substrate 110 and other semiconductor structures of cryogenic electronic package 100 (e.g., SMCM 130), an increased number of SMCMs and superconducting semiconductor structures (e.g., superconducting ICs) may be coupled to substrate 110 (i.e., a non-superconducting circuitized substrate) than would otherwise be possible without the interposer 120. The foregoing may, for example, lead to the cryogenic electronic package 100 having an increased density of SMCMs and superconducting ICs in comparison to conventional cryogenic electronic packages. Such may result in cryogenic systems including the cryogenic electronic package 100 occupying less space (i.e., physical space) than cryogenic systems including conventional cryogenic electronic packages which have a reduced density of superconducting ICs and SMCMs. For example, in one embodiment in which substrate 110 has dimensions (e.g., surface dimensions) of about 1 m$^2$, with a fan-out approach using an interposer 120 having dimensions (e.g., surface dimensions) of about 36 mm×36 mm the substrate 110 can accommodate over 500 SMCMs (e.g., SMCMs having dimensions of about 32 mm×32 mm) and/or components.

In one embodiment, the SMCMs have dimensions (e.g., surface dimensions) of about 32 mm×32 mm and a minimum pitch of about 35 um. Additionally, in one embodiment the SMCMs have a capacity of about 16 chips and include about 1280 pinouts. Further, in one embodiment interposer 120 is a multilayer high density interposer having dimensions (e.g., surface dimensions) of about 36 mm×36 mm. A cryogenic electronic package (e.g., 100) can include a plurality of interposers (e.g., 120), with there being about 6 mm spacing between interposers (e.g., between edges of interposers), for example. In one embodiment, the interposers have a minimum pitch of about 500 um.

In a single sided assembly, a substrate (e.g., 110) having dimensions (e.g., surface dimensions) of about 1 m×1 m can assemble more than about 500 SMCM keeping approximately 10 cm around edges of the substrate for connectors in some embodiments, for example. Similarly, in a double sided assembly a substrate having dimensions (e.g., surface dimensions) of about 1 m×1 m can assemble more than 1000 SMCMs keeping approximately 10 cm around edges of the substrate for connectors in some embodiments.

In one aspect of the disclosure, by increasing the number of SMCMs and superconducting semiconductor structures that may be coupled to substrate 110 through interposer 120, such may result in cryogenic systems including the cryogenic electronic package 100 requiring a reduced amount of cryogenic cooling than cryogenic systems including conventional cryogenic electronic packages. This may, for example, be due to the cryogenic electronic package 100 occupying less space than conventional cryogenic electronic packages. For example, in embodiments in which cryogenic systems including the cryogenic electronic package 100 (or other cryogenic electronic packages according to the disclosure) operate in cryogenic refrigerants (e.g., liquid Helium) and use liquid cooling, the cryogenic systems may not need separate thermal management systems, as may be required for cryogenic systems including conventional cryogenic electronic packages.

While cryogenic electronic package 100 is shown as including two superconducting semiconductor structures (here, first and second superconducting semiconductor structures 140, 150) in the illustrated embodiment, it should be appreciated that the cryogenic electronic package 100 may include more than or fewer than two superconducting semiconductor structures in some embodiments. For example, cryogenic electronic package 100 may include more than two superconducting semiconductor structures in some embodiments by disposing or otherwise providing additional interposers (e.g., similar to interposer 120) on substrate 110 of cryogenic electronic package 100. Additionally, the cryogenic electronic package 100 may include more than two superconducting semiconductor structures in some embodiments by having an interposer and/or an SMCM that is capable of supporting more than two superconducting semiconductor structures. The interposer may, for example, have a larger surface area than that which is shown for interposer 120.

Large SMCMs and microbump technology favor convergence of the chip carrier and board, and also may eliminate multilevel assembly to provide unique miniaturized solutions for complex cryogenic packaging for computing. In the proposed arrangement, large passive superconducting modules (e.g., 130) horizontally connect multiple superconducting chips (e.g., 140, 150), with IC-scale electrical routing between the chips and MCM. In one embodiment, superconducting MCMs are used to route power and signals from a multilayer superconducting MCM to the chips through microbumps. In a typical package, one or a few superconducting chips are attached to the MCM and subsequently attached to the board through BGA/wirebonding connections, for example. A large superconducting MCM with 2-24 superconducting chips and an interposer (e.g., 120) would eliminate a significant number of substrates (e.g., 110) and their assembly. A high-density, finer pitch, fan-out approach using the interposer (e.g., 120) is capable of reducing the connection and associated parasitic resistance and capacitance value between any two given points of chips to enhance data throughput and functionality within a given footprint.

Additional aspects and example advantages associated with cryogenic electronic packages and assemblies according to the disclosure are discussed in connection with figures below.

Figure 1A:
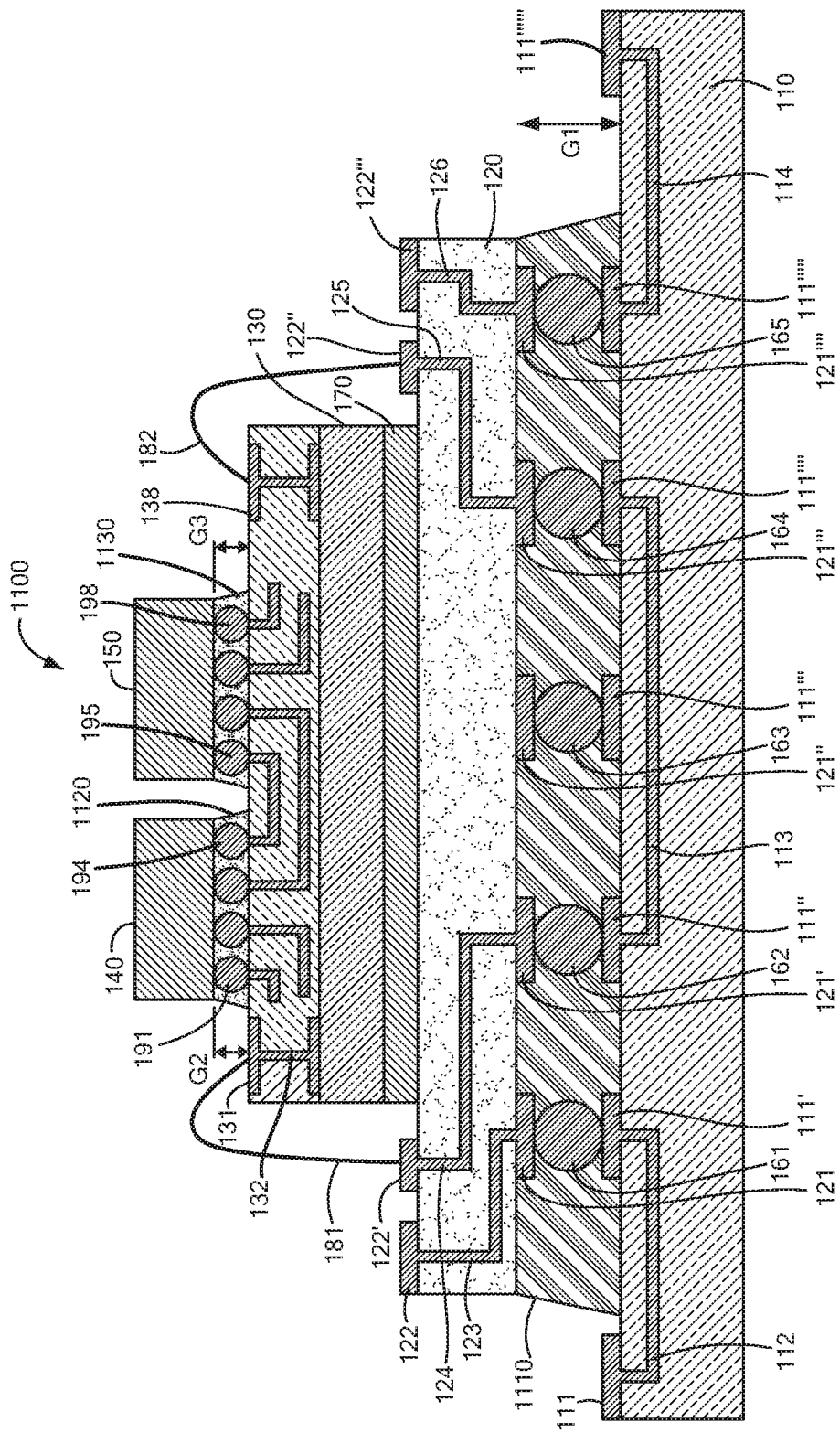

Referring now to FIG. 1A, in which like elements of FIG. 1 are shown having like reference designations, a cryogenic electronic package 1100 similar to cryogenic electronic package 100 of FIG. 1 is shown having an "underfill" material 1110 (e.g., a cryogenically stable underfill material) disposed between the first surface of interposer 120 and the second surface of substrate 110. Cryogenic electronic package 100 is also shown having an underfill material 1120 disposed between the first surface of superconducting semiconductor structure 140 and the second surface of SMCM 130. Cryogenic electronic package 100 is additionally shown having an underfill material 1130 disposed between the first surface of superconducting semiconductor structure 150 and the second surface of SMCM 130.

In particular, the underfill material 1110 fills selected portions of a first space or gap G1 existing between the first surface of interposer 120 and the second surface of substrate 110. Additionally, the underfill material 1120 fills selected portions of a second space or gap G2 existing between the first surface of superconducting semiconductor structure 140 and the second surface of SMCM 130. Further, the underfill material 1130 fills selected portions of a third space or gap G3 existing between the first surface of superconducting semiconductor structure 150 and the second surface of SMCM 130. In one embodiment, an about 5-15 micron tall 15 micron diameter indium microbump (e.g., 191) after bonding may create an about 2-4 micron gap (G2, G3). Additionally, in one embodiment an about 6-50 micron tall 30-50 micron diameter indium microbump after bonding may create an about 2-30 micron gap (G2, G3). In one embodiment, an about 90 μm SAC BGA (e.g., 161) can create an about 10-25 μm gap (G1). Additionally, in one embodiment an about 50 μm gold BGA can create an about 10-20 μm gap (G1).

In embodiments, the underfill materials 1110, 1120, 1130 may increase reliability of and reduce stress on the interconnect structures (e.g., 161) disposed between the semiconductor structures (e.g., 110, 120), for example, during bonding of the semiconductor structures to one or more other semiconductor structures (e.g., 130). For example, in embodiments in which the underfill material 1110 substantially surrounds the interconnect structures (e.g., 161), the underfill material 1110 may substantially reduce, or ideally eliminate, deformation of (i.e., increase stability of) the interconnect structures during bonding of the interposer 120 to the SMCM 130 by curing and/or freezing one or more portions of the interconnect structures. As is known, underfill materials (e.g., 1110) typically contact more at cryogenic temperatures (e.g., in cryogenic refrigerants, such a liquid Helium) than at room temperatures. The foregoing tends to result in the underfill materials providing more support at cryogenic temperatures (e.g., in cryogenic refrigerants, such a liquid Helium) than at room temperatures.

The underfill materials 1110, 1120, 1130 may also protect the interconnect structures (e.g., 161), for example, during Indium (In) lithography in embodiments in which one or more of the interconnect structures include In.

In one embodiment, the SMCM 130 is flip-chip bonded with superconducting semiconductor structures 140, 150 using reflowed interconnect structures (e.g., 191, 195, 198) and underfilled with the underfill materials 1110, 1120, 1130 (e.g., a cryogenically stable adhesive). The underfill materials 1110, 1120, 1130 may shrink the interconnect structures (e.g., 191) at low temperatures (e.g., 77K, 4.2K) and help to hold the interconnect structures firmly during system operation.

In one embodiment, the underfill materials 1110, 1120, 1130 can be pre-applied (e.g., before coupling interposer 120 to substrate 110). Additionally, in one embodiment, the underfill materials 1110, 1120, 1130 can be post-applied (e.g., after coupling interposer 120 to substrate 110). In some embodiments, post applying of the underfill materials 1110, 1120, 1130 is suitable for relatively low temperature (RT-110C) bonding approaches where the underfill materials 1110, 1120, 1130 may create a resistive open for pre-applying underfill materials 1110, 1120, 1130. Additionally, in some embodiments relatively high temperature bonding favors pre-applying underfill materials 1110, 1120, 1130. The underfill materials 1110, 1120, 1130 may be applied using conventional or modified approaches that favor underfill flow better, for example.

In embodiments, the underfill materials 1110, 1120, 1130 are low temperature heat cured epoxy materials suitable for cryogenic applications, such as Master Bond Polymer System EP29LPSP. Other cryogenically stable underfill materials are, of course, possible. For example, in some embodiments EPO-TEK 353ND A/B, TRA-BOND 2115 and/or Henkel FP5201 may be used. Additionally, in some embodiments a reworkable underfill (e.g., LOCTITE ECCOBOND UF 2800A, LOCTITE UF3810) may be used. It is further possible to pre-apply the underfill materials 1110, 1120, 1130 where part of underfill materials 1110, 1120, 1130 has a flux component which is consumed during an underfill curing process. In another example, it is possible to pre-apply an anisotropic superconductive adhesive (ASA) for replacing the underfill materials 1110, 1120, 1130 and the interconnect structures (e.g., 161-165, 191-198 etc.). An ASA made with a superconducting metal/alloy and/or superconducting metal/alloy coated metal and/or superconducting metal/alloy coated polymer sphere may be dispersed in a polymer matrix (e.g., Epoxy matrix), for example.

In some embodiments, at least one of the underfill materials 1110, 1120, 1130 is optional.

Additionally, in some embodiments at least one of the SMCM 130, first superconducting semiconductor structure 140 and second superconducting semiconductor structure 150 has embedded resistors, inductors and/or capacitors. Such may, for example, substantially reduce (or ideally eliminate) the need for surface mounted components, enabling further miniaturization of the cryogenic package 1100 and assemblies or systems in which the cryogenic package 1100 is used.

Further, in some embodiments, in addition to having first and second opposing surfaces, at least one of the semiconductor structures (e.g., 110) in cryogenic electronic package 100 has a thickness corresponding to a distance between the respective first and second surfaces of the semiconductor structures. In one embodiment, interposer 120, for example, has a thickness of about 100-1000 μm. In one embodiment, a thicker interposer or redistribution/fan-out layer may, for example, be suitable LGA type connection, for example.

Additionally, in embodiments in which the semiconductor structures (e.g., 120) of cryogenic electronic package 100 have first and/or second surfaces that take the form of a square or a rectangle, for example, the semiconductor structures may have an associated length and width. For example, in embodiments in which the second surface of the interposer 120 takes the form of a square or a rectangle, the interposer 120 may have a length corresponding to a first dimension extending from a first vertex of the first surface to a second vertex of the first surface that is substantially parallel to the first vertex. Additionally, the interposer 120 may have a width corresponding to a second dimension extending from the first vertex of the first surface to a third vertex of the first surface that is different from the first vertex and the second vertex, such that the second dimension is substantially perpendicular to the first dimension.

The length and width values of a semiconductor structure (e.g., 120) may impact a number of other semiconductor structures (e.g., 130) which may be disposed or otherwise provided on the semiconductor structure. For example, in embodiments in which the SMCM 130 has a first length (e.g., about 32.3 mm) and a first width (e.g., about 32.2 mm), the SMCM 130 may be capable of supporting a first predetermined number of semiconductor structures (e.g., about sixteen superconducting semiconductor structures having dimensions of about 5 mm by 5 mm). Additionally, in embodiments in which the SMCM 130 has a second length that is greater than the first length and a second width that is greater than the first width, the SMCM 130 may be capable of supporting a second predetermined number of semiconductor structures that is greater than the first predetermined number of semiconductor structures.

Figure 2:
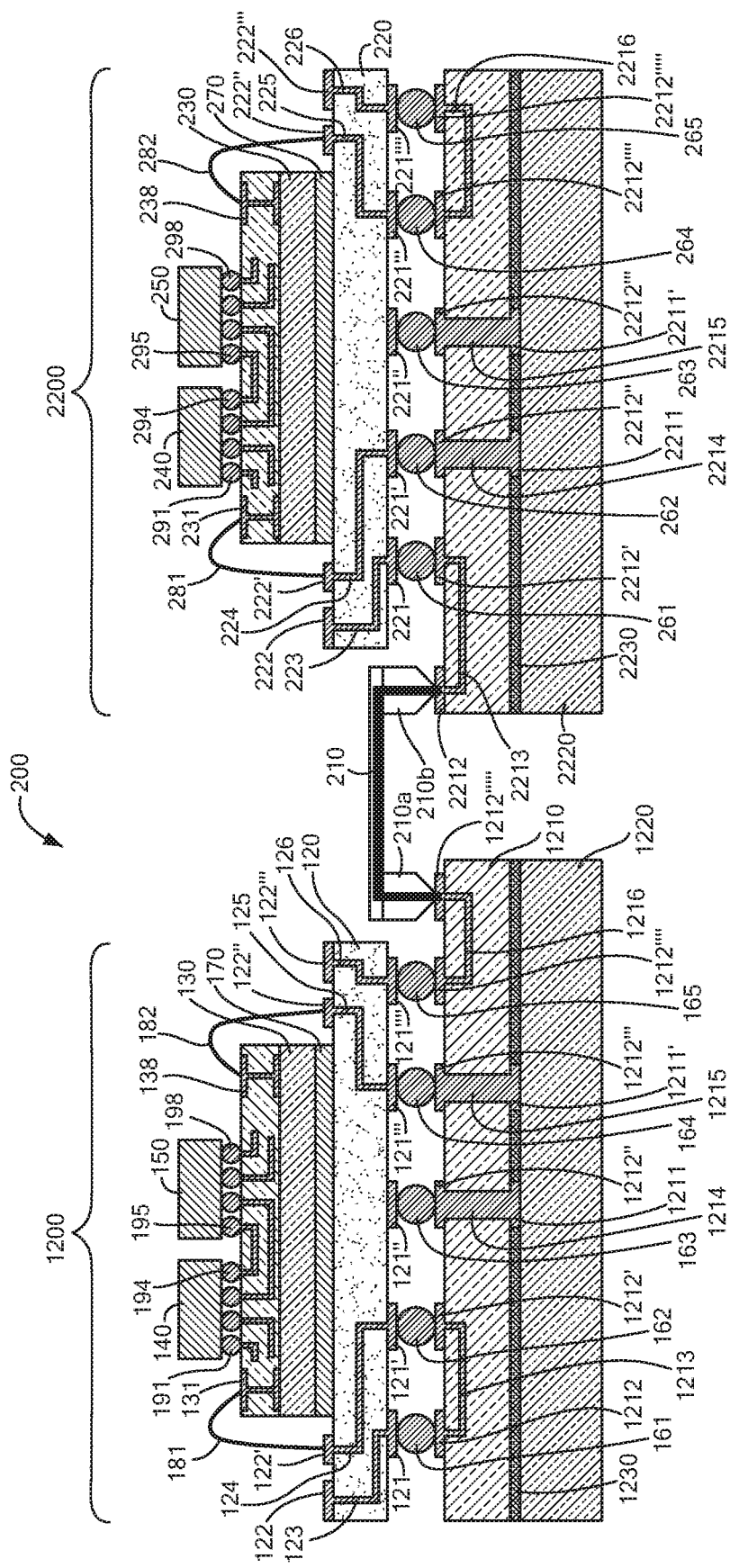
FIG. 2 is a block diagram of an example cryogenic electronic assembly in accordance with an embodiment of the disclosure.

Additionally, whether a semiconductor structure (e.g., 110) is a single or double sided semiconductor structure (i.e., a single or double sided assembly) may also impact the number of other semiconductor structures (e.g., 130) which may be disposed or otherwise provided on the semiconductor structure. For example, in embodiments in which the substrate 110 is a single sided substrate having a length of about 1 meter and a width of about 1 meter, the substrate 110 may be capable of supporting over 500SMCMs (keeping around 10 cm edge from connectors on the substrate 110, e.g., due to space considerations for the connectors). Connectors may be used to attach multiple substrates (e.g., 110) together, for example, as shown and described below in connection with FIGS. 2, 7 and 7A, for example. FIG. 2 shows a connector 210, for example. In embodiments in which the substrate 110 is a double sided substrate having a length of about 1 meter and a width of about 1 meter, the substrate 110 may be capable of supporting about 1012 SMCMs (keeping around 10 cm edge from connector). The SMCMs may have about 1280 pinouts in embodiments. In general, MCM pinouts increase with an increasing number of chips (e.g., SFQs). This is applicable for a few chips and after that the MCM may reach its maximum number of pinouts. For a large number of chips, internal MCM routing and MCM interconnect may be needed so that the MCM has a same or similar number of MCM pinouts for wirebonding. MCM pinouts can be increased by adding multiple rows of bonding pads, by reducing pad pitch etc.

Figure 1B:
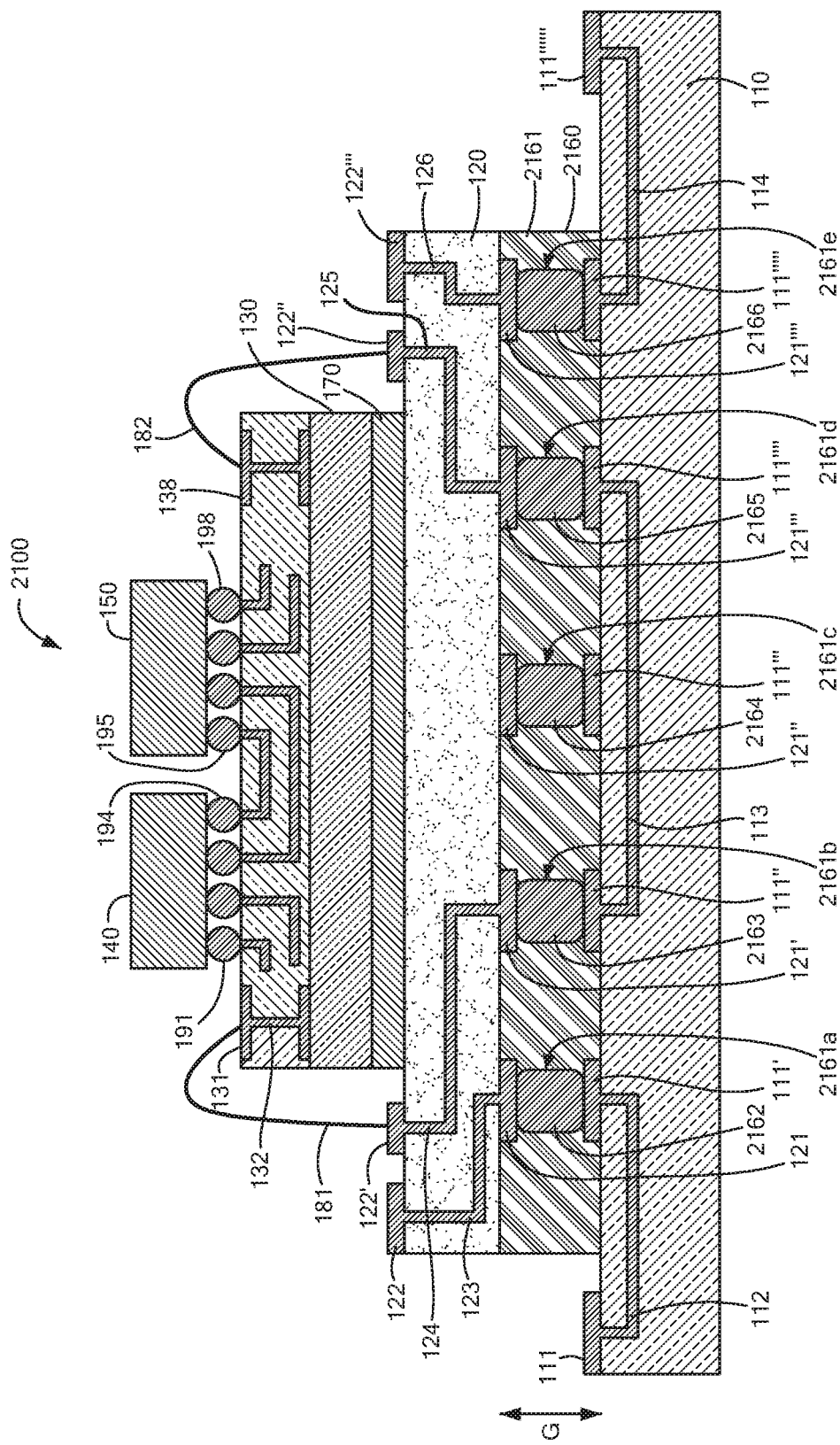
FIG. 1B is a block diagram of an example cryogenic electronic package including a superconducting joint structure in accordance with an embodiment of the disclosure.

Referring now to FIG. 1B, in which like elements of FIG. 1 are shown having like reference designations, a cryogenic electronic package 2100 similar to cryogenic electronic package 100 of FIG. 1 is shown having a so-called "superconducting joint structure" 2160 disposed between the first surface of interposer 120 and the second surface of substrate 110.

Superconducting joint structure 2160 (e.g., a superconducting interposer) has first and second opposing surfaces and includes an organic bonding layer or material 2161 disposed between selected portions of the first and second surfaces of superconducting joint structure 2160. Superconducting joint structure 2160 also includes a plurality of superconducting joints (here, five superconducting joints 2162, 2163, 2164, 2165, 2166) extending between selected portions of the first and second surfaces of superconducting joint structure 2160.

Organic Bonding layer 2161 has first and second opposing surfaces and includes at least one dielectric layer including one or more dielectric materials. Examples of suitable dielectric materials for the at least one dielectric layer include such materials as fiberglass-reinforced epoxy resins (some referred to as "FR-4" dielectric materials in the art) and polytetrafluoroethylene (e.g., Teflon), including polytetrafluoroethylene filled with inorganic particles (e.g., silica) as a means of controlling the coefficient of thermal expansion of the dielectric material. Further example dielectric materials for the at least one dielectric layer include polyimides (e.g., Kapton), polyamides, cyanate resins, polyphenylene ether resins, liquid crystal polymers, photo-imageable materials, and other like materials. In embodiments in which the dielectric materials for the at least one dielectric layer of the organic bonding layer 2161 are photo-imageable, for example, the dielectric materials may be photo-imaged (or photo-patterned) and developed to reveal a desired pattern of openings in the dielectric layer. The dielectric materials may also be curtain-coated, spin-coated or screen-applied, or supplied as dry film.

Organic bonding layer 2161 may also include at least one conductive circuit layer in some embodiments. In one embodiment, the conductive circuit layer includes a high density array of contact locations (or circuit traces). Additionally, in one embodiment the dielectric layer includes one or more circuit traces which are couplable to the contact locations.

Superconducting joints 2162, 2163, 2164, 2165, 2166 (e.g., conductive structures or vias) of the superconducting joint structure 2160 each have first and second opposing portions and include one or more superconducting materials (e.g., Niobium (Nb), Tin-Lead (SnPb), Lead (Pb), Lead Indium (PbIn), etc.).

In the illustrated embodiment, the superconducting joints 2162, 2163, 2164, 2165, 2166 are each disposed or otherwise formed in respective openings or thru-holes in the organic bonding layer 2161.

In particular, superconducting joint 2162 is disposed in an opening 2161a in organic bonding layer 2161 and superconducting joint 2163 is disposed in an opening 2161b in organic bonding layer 2161. Additionally, superconducting joint 2164 is disposed in an opening 2161c in organic bonding layer 2161 and superconducting joint 2165 is disposed in an opening 2161d in organic bonding layer 2161. Further, superconducting joint 2166 is disposed in an opening 2161e in organic bonding layer 2161.

In the illustrated embodiment, the superconducting joints 2162, 2163, 2164, 2165, 2166 are also each coupled to respective ones of the interconnect pads of substrate 110 and interposer 120.

In particular, superconducting joint 2162 has a first portion coupled (e.g., electrically and mechanically coupled) to interconnect pad 111' of substrate 110 and a second opposing portion coupled to interconnect pad 121 of interposer 120. Additionally, superconducting joint 2163 has a first portion coupled to interconnect pad 111" of substrate 110 and a second opposing portion coupled to interconnect pad 121' of interposer 120. Further, superconducting joint 2164 has a first portion coupled to interconnect pad 111''' of substrate 110 and a second opposing portion coupled to interconnect pad 121" of interposer 120.

Superconducting joint 2165 has a first portion coupled to interconnect pad 111'''' of substrate 110 and a second opposing portion coupled to interconnect pad 121''' of interposer 120. Additionally, superconducting joint 2166 has a first portion coupled to interconnect pad 111''''' of substrate 110 and a second opposing portion coupled to interconnect pad 121'''' of interposer 120.

With the above-described coupling arrangement, superconducting joints 2162, 2163, 2164, 2165, 2166 (and, thus, superconducting joint structure 2160) is/are capable of coupling (e.g., electrically and mechanically coupling) substrate 110 and interposer 120 together. Additionally, with the above-described coupling arrangement, superconducting joints 2162, 2163, 2164, 2165, 2166 (and, thus, superconducting joint structure 2160) is/are capable of coupling one or more electrically connections (e.g., 112) in substrate 110 to one or more electrical connections (e.g., 123) in interposer 120.

In embodiments, the openings or thru-holes 2161a, 2161b, 2161c, 2161d, 2161e in organic bonding layer 2161 are created using techniques such as laser ablation, ion milling, and mechanical drilling to create a void in the bonding layer 2161 that is then cleaned by reactive ion etching (RIE), chemical etching, and/or other etching techniques well known in the art. In one embodiment, a seed layer of an electrically conductive or superconductive material is deposited within each of the thru-holes 2161a, 2161b, 2161c, 2161d, 2161e to create the superconducting joints 2162, 2163, 2164, 2165, 2166. In embodiments, a preferred conductor for the conductive material is copper or tin or niobium or tin-lead or indium lead alloy. Deposition thereof may be accomplished using two deposition procedures, for example, the first being conventional sputtering processing. During such sputtering, a thin layer of the copper or niobium or lead metal may be vacuum deposited within each of the thru-holes 2161a, 2161b, 2161c, 2161d, 2161e. Such sputtering may also include depositing a barrier metal layer prior to the copper layer, such a barrier layer typically comprising chrome or titanium with a thickness of about 50 angstroms to about 500 angstroms. The sputtered copper or niobium or lead metal layer may then be used as a seed layer for a subsequent electroplating deposition procedure, in which more copper is formed in the thru-holes 2161a, 2161b, 2161c, 2161d, 2161e.

Other methods may be used for depositing the copper or copper alloy or niobium or lead metal material, for example, including a combined electroless and electroplating process in which the initial copper or copper alloy is deposited using electroless plating (defined above), following which an electroplating procedure (e.g., similar to that above used following the sputtering procedure) is used. Conventional sputtering, electroless and electroplating processes known in the PCB art may additionally or alternatively be utilized to accomplish the above deposition.

In some embodiments, superconducting paste filled Plated thru-holes (PTHs) can be laminated to create superconducting joints 2162, 2163, 2164, 2165, 2166. In embodiments, superconducting materials can be applied in paste form using a screen-printing, stencil, dispensing operation, or in an ink form using an ink-jet printing operation, for example, to place a predetermined amount of paste on the interconnects pads (e.g., 111' and 121). In alternate embodiments, a superconducting paste could be applied to microvias and circuitized substrate pads (not shown). In embodiments, the superconducting paste is typically a lead-based paste and is potentially able to combine nanoparticle, carbon nanotube, metallic nanotube, mixed metal, alloy, and metal-ceramic paste or combinations thereof. The paste can use an epoxy or substantially any other polymer system or materials. Examples of suitable polymer materials include epoxy resins, polytetrafluoroethylene (e.g., Teflon), polyimides, polyamides, cyanate resins, polyphenylene ether resins, photoimageable materials, and other like materials.

In some embodiments, at least one of interposer 120 and substrate 110 has an associated semiconductor package pitch and at least one of the organic bonding layer 2161 and/or the superconducting joints 2162, 2163, 2164, 2165, 2166 of superconducting joint structure 2160 has one or more characteristics (e.g., dimensions) selected in accordance with the package pitch. For example, in one embodiment, the size and shape of the superconducting joints 2162, 2163, 2164, 2165, 2166 may be selected to achieve a desired pitch (e.g., a pitch requirement of substrate 110, interposer 120 and/or cryogenic electronic package 2100). Additionally, the size and shape of the superconducting joints 2162, 2163, 2164, 2165, 2166 may be selected to achieve a predetermined spacing or gap G between substrate 110 and interposer 120. In embodiments, the predetermined gap G is selected to achieve a predetermined resistance and/or inductive coupling (e.g., a relatively low resistance coupling) between substrate 110 and interposer 120. The predetermined gap G may, for example, correspond to a height or thickness of the superconducting joint structure 2160 and a height or depth of the superconducting joints 2162, 2163, 2164, 2165, 2166.

Additionally, in some embodiments superconducting joint structure 2160 is formed on the second surface of substrate 110. Further, in some embodiments superconducting joint structure 2160 is formed on the first surface of interposer 120. Additionally, in some embodiments superconducting joint structure 2160 is formed on both the second surface of substrate 110 and the first surface of interposer 120. For example, in one embodiment organic bonding layer 2161 of superconducting joint structure 2160 is formed on the second surface of substrate 110 and superconducting joints 2162, 2163, 2164, 2165, 2166 of superconducting joint structure 2160 are formed on the first surface of interposer 120. In such embodiment, the superconducting joints 2162, 2163, 2164, 2165, 2166 may each be received in a respective one of the organic layer openings 2161a, 2161b, 2161c, 2161d, 2161e, for example, during coupling of the interposer 120 to the substrate 110.

In embodiments in which the superconducting joint structure 2160 is formed on a respective one of the substrate 110 and interposer 120, the superconducting joints 2162, 2163, 2164, 2165, 2166 may formed by disposing one or more superconducting materials in the organic bonding layer openings 2161a, 2161b, 2161c, 2161d, 2161e and developing the conductive materials to form the superconducting joints 2162, 2163, 2164, 2165, 2166. Additionally, in embodiments the superconducting joints 2162, 2163, 2164, 2165, 2166 are formed using one or more physical (e.g., sputter) and chemical (e.g., electroless) processes.

The superconducting joints 2162, 2163, 2164, 2165, 2166 may also be formed using a 3D-Via lithography process in some embodiments. The 3D-Via lithography process may include etching the oxide and/or organic bonding layer 2161 using a CF4 plasma, dry and/or wet resist strip, a resist clean using Aleg-380, a IMP+CVD Ti/TiN liner deposition, CVD W and/or Ni and/or a low temperature melt metal and/or alloy fill and CMP planarization and chemical activation for bonding.

Organic bonding layer 2161 substantially surrounds the superconducting joints 2162, 2163, 2164, 2165, 2166 in the illustrated embodiment, for example, to electrically insulate the superconducting joints 2162, 2163, 2164, 2165, 2166 from each other. In embodiments, at least one of the superconducting joints 2162, 2163, 2164, 2165, 2166 is a thermally conductive via.

Further aspects of superconducting joint structures according to the disclosure are shown and described in connection with figures below.

Figure 1C:
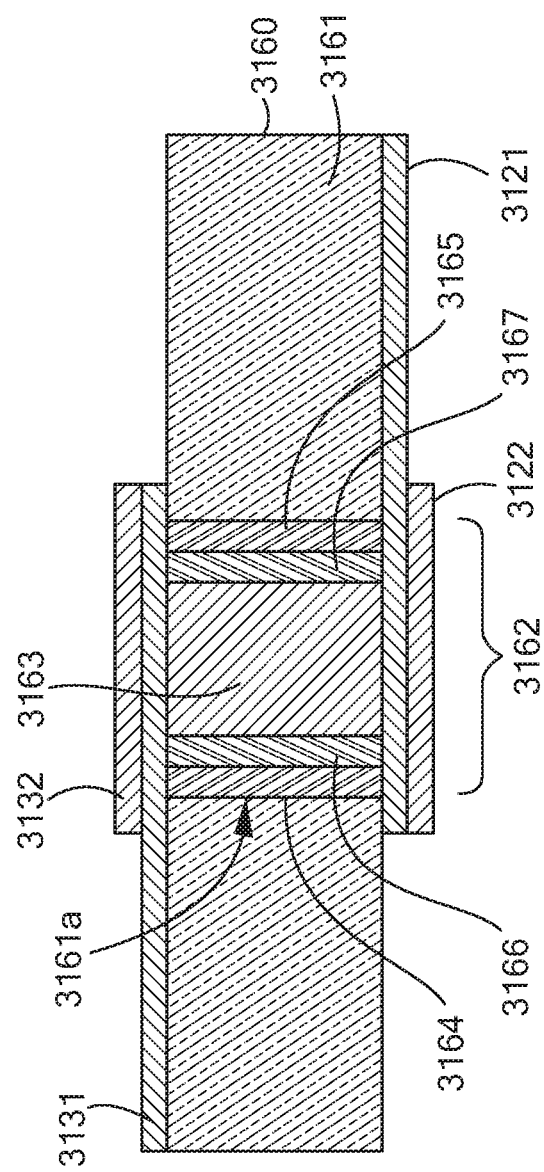
FIG. 1C shows a cross-section of an example superconducting joint structure in accordance with an embodiment of the disclosure.

Referring to FIG. 1C, a cross-section of another example superconducting joint structure 3160 according to the disclosure is shown coupled to superconducting traces or interconnect pads 3121, 3131 and to UBM structures 3122, 3132. In embodiments, the interconnect pads 3121, 3131 may be interconnect pads of respective semiconductor structures (e.g., substrate 110 and interposer 120, shown in FIG. 1B) in a cryogenic electronic package (e.g., 2100, shown in FIG. 1B). Additionally, in embodiments the UBM structures 3122, 3132 may be UBM structures of the respective semiconductor structures. In embodiments, superconducting joint structure 3160 may be used to couple (e.g., electrically and/or mechanically couple) the respective semiconductor structures together.

Referring in closer detail to FIG. 1C, superconducting joint structure 3160 has first and second opposing surfaces and includes an organic bonding layer 3161 which also has first and second opposing surfaces. In the illustrated embodiment, the first surface of the organic bonding layer 3161 corresponds to the first surface of the superconducting joint structure 3160. Additionally, in the illustrated embodiment the second surface of the organic bonding layer 3161 corresponds to the second surface of the superconducting joint structure 3160. Organic bonding layer 3161 includes one or more organic materials (e.g., SiO$_x$).

Superconducting joint structure 3160 also includes a superconducting joint 3162 extending between selected portions of the first and second surfaces of the superconducting joint structure 3160. In the illustrated embodiment, superconducting joint 3162 is provided or otherwise formed in an opening 3161a in organic bonding layer 3161. In embodiments, the opening 3161a is formed by a "subtractive" process in which the opening 3161a is etched away, or subtracted, from selected portions of organic bonding layer 3161. In embodiments, dimensions of the opening 3161a are based upon dimensions of the superconducting joint 3162.

The superconducting joint 3162 includes a conductive structure (e.g., a via) 3163 and a plurality of conductive layers (here, four conductive layers 3164, 3165, 3166, 3167). Conductive layers 3166, 3167 are disposed between conductive layers 3164, 3165 in the illustrated embodiment. Additionally, conductive structure 3163 is disposed between conductive layers 3166, 3167 in the illustrated embodiment.

Conductive layer 3164 (also sometimes referred to herein as a "first conductive layer 3164") has a surface (e.g., a first surface) disposed over a first portion (e.g., a first side) of the organic layer opening 3161a. Additionally, first conductive layer 3164 extends from a first selected portion of the first surface of the superconducting joint structure 3160 to a first selected portion of the second surface of the superconducting joint structure 3160.

Conductive layer 3165 (also sometimes referred to herein as a "second conductive layer 3165") has a surface (e.g., a first surface) disposed over a second opposing portion (e.g., a second side) of the organic layer opening 3161a. Additionally, second conductive layer 3165 extends from a second selected portion of the first surface of the superconducting joint structure 3160 to a second selected portion of the second surface of the superconducting joint structure 3160.

Conductive layer 3166 (also sometimes referred to herein as a "third conductive layer 3166") has a surface (e.g., a first surface) disposed over a surface (e.g., a second opposing surface) of the first conductive layer 3164. Additionally, third conductive layer 3166 extends from a third selected portion of the first surface of the superconducting joint structure 3160 to a third selected portion of the second surface of the superconducting joint structure 3160.

Conductive layer 3167 (also sometimes referred to herein as a "fourth conductive layer 3167") has a surface (e.g., a first surface) disposed over a surface (e.g., a second opposing surface) of the second conductive layer 3165. Additionally, fourth conductive layer 3167 extends from a fourth selected portion of the first surface of the superconducting joint structure 3160 to a fourth selected portion of the second surface of the superconducting joint structure 3160.

Conductive structure 3163 is disposed between and coupled to a respective surface (e.g., a second opposing surface) of third conductive layer 3166 and a respective surface (e.g., a second opposing surface) of fourth conductive layer 3167 in the illustrated embodiment. Conductive structure 3163 extends from a fifth selected portion of the first surface of the superconducting joint structure 3160 to a fifth selected portion of the second surface of the superconducting joint structure 3160.

In embodiments, first portions of conductive structure 3163 and conductive layers 3164, 3165, 3166, 3167 proximate to first surface of superconducting joint structure 3160 correspond to a first portion of the superconducting joint 3162. Additionally, in embodiments second portions of conductive structure 3163 and conductive layers 3164, 3165, 3166, 3167 proximate to second surface of superconducting joint structure 3160 correspond to a second opposing portion of the superconducting joint 3162.

Conductive structure 3163 includes one or more first electrically conductive materials (e.g., superconducting metals). Additionally, the first conductive layer 3162 and second conductive layer 3163 each include one or more second electrically conductive materials (e.g., conventional metals). Further, the third conductive layer 3164 and fourth conductive layer 3165 each include one or more third electrically conductive materials (e.g., superconducting metals).

In one embodiments, the first, second and third electrically conductive materials each include a different, respective metal or alloy material or combination of materials (i.e., the superconducting joint 3162 may have a multiple melt composition). As one example, the first conductive material may include one or more materials (e.g., Ti, Pb, Sn—Pb, In—Pb) having a first melting point, the second conductive material may include one or more materials (e.g., Sn, Cu, Ag) having a second melting point, and the third conductive material may include one or more materials (e.g., Au, In) having a third melting point. In embodiments, interfaces of the first, second and third conductive materials react with each other during a bonding and/or a post bonding process (i.e., a coupling process), for example, in which interconnect pads 3121, 3131 are coupled together via superconducting joint 3162.

During the coupling process, the superconducting joint 3162 may, for example, melt and/or soften and/or deform to form an electrical connection (e.g., a "low" resistance electrical connection) between interconnect pad 3121 and interconnect pad 3131. In particular, during the coupling process, a plurality of melt interfaces or surfaces may form between conductive structure 3161 and conductive layers 3162, 3163, 3164, 3165 of the superconducting joint 3162 to produce an electrical connection between interconnect structure 3121 and interconnect pad 3131.

In one embodiment, the melt interfaces form due to the conductive structure 3161 and conductive layers 3162, 3163, 3164, 3165 of the superconducting joint melting at plurality of different temperatures. For example, conductive structure 3161 and conductive layers 3162, 3163, 3164, 3165 may melt at two or more different temperatures during the coupling process due to the layers and sections including materials having different melting points. Such multi-melt interface may, for example, provide for a more robust electrical connection than conventional electrical connections. In some embodiments, conductive structure 3161 may react with first and second conductive layers 3162, 3163, and first and second conductive layers 3162, 3163 may react with third and fourth conductive layers 3164, 3165, to create a lower melt interface than the individual metal(s) and/or alloys of conductive structure 3161 and conductive layers 3162, 3163, 3164, 3165. Such may provide for a more robust interconnect at lower bonding temperature(s) than at individual element melt temperature(s).

The interconnect pads 3121, 3131 to which the superconducting joint structure 3160 is coupled each have first and second opposing surfaces and include one or more superconducting and/or partially superconducting and/or conventional metal materials. In the illustrated embodiment, interconnect pad 3121 has a surface (e.g., a first surface) disposed over and coupled to a selected portion or surface (e.g., a first surface) of superconducting joint structure 3160. Additionally, in the illustrated embodiment interconnect pad 3131 has a surface (e.g., a first surface) disposed over and coupled to a selected portion or surface (e.g., a second surface) of superconducting joint structure 3160. Interconnect pad 3121 is coupled to a first portion of superconducting joint 3162 and interconnect pad 3131 is coupled to a second opposing portion of superconducting joint 3162.

The UBM structures 3122, 3132 to which the superconducting joint structure 3160 is coupled (here, through interconnect pads 3121, 3131, respectively) each have first and second opposing surfaces and include one or more electrically conductive materials (e.g., Titanium (Ti), Platinum (Pt) and/or Gold (Au)). In the illustrated embodiment, UBM structure 3122 has a surface (e.g., a first surface) disposed over a selected portion or surface (e.g., a second surface) of interconnect pad 3121. Additionally, in the illustrated embodiment UBM structure 3132 has a surface (e.g., a first surface) disposed over a selected portion or surface (e.g., a second surface) of interconnect pad 3131. In embodiments, UBM structure 3122 may also have a surface (e.g., a second surface) disposed over a selected portion or surface (e.g., a second surface) of a first respective semiconductor structure (e.g., substrate 110, shown in FIG. 1B) in a cryogenic electronic package (e.g., 2100, shown in FIG. 1B). Additionally, in embodiments UBM structure 3132 may have a surface (e.g., a second surface) disposed over a selected portion or surface of a second respective semiconductor structure (e.g., interposer 120, shown in FIG. 1B) in the cryogenic electronic package. In embodiments, UBM structures 3122, 3132 may each be coupled to one or more electrical connections or components (i.e., circuitry) of the respective semiconductor structures.

In some embodiments, superconducting joint 3162 may be provided as a shielded through via structure. In such embodiments, conductive structure 3163 of superconducting joint 3162 may be provided as a through via (e.g., a through organic via) of the shielded through via structure. Additionally, first conductive layer 3164 and third conductive layer 3166 of superconducting joint 3162 may be provided as a first shielding portion of the shielded through via structure. Further, second conductive layer 3165 and fourth conductive layer 3167 of superconducting joint 3162 may be provided as a second shielding portion of the shielded through via structure. The first and second shielding portions of the through via structure may, for example, provide "shielding" to the through via by the first and second shielding portions having a ground connection and the through via having a signal connection. In other words, the through via may have ground shielding by means of the first and second shielding portions. In preferred embodiments, the first and second shielding portions are substantially the same.

In embodiments, the UBM structures 3122, 3132 each include one or more electrically conductive materials. In one embodiment, the electrically conductive materials of the UBM structures 3122, 3132 include Titanium (Ti), Platinum (Pt) and Gold (Au).

While the superconducting joint 3162 is shown and described as including four conductive layers (here, conductive layers 3164, 3165, 3166, 3167) in the illustrated embodiment, it should be appreciated that the superconducting joint 3162 may include more than or fewer than four conductive layers in some embodiments. For example, in some embodiments at least one of the above-described first conductive layer 3164, the second conductive layer 3165, the third conductive layer 3166 and the fourth conductive layer 3167 is optional.

Additionally, in embodiments in which the superconducting joint 3162 includes more than four conductive layers, the additional conductive layers (i.e., fifth, sixth, etc. conductive layers) may be disposed over respective surfaces of at least one of the first conductive layer 3164, the second conductive layer 3165, the third conductive layer 3166 and the fourth conductive layer 3167. As one example, a fifth conductive layer may be disposed between first conductive layer 3164 and third conductive layer 3166, and have a surface (e.g., a first surface) disposed over a surface (e.g., a second surface) of first conductive layer 3164 and have a surface (e.g., a second surface) disposed over a surface (e.g., a first surface) of third conductive layer 3166. Additionally, a sixth conductive layer may be disposed between second conductive layer 3165 and fourth conductive layer 3167, and have a surface (e.g., a first surface) disposed over a surface (e.g., a second surface) of second conductive layer 3165 and have a surface (e.g., a second surface) disposed over a surface (e.g., a first surface) of fourth conductive layer 3167. The fifth and sixth conductive layers may be the same as or similar to at least one of the first conductive layer 3164, the second conductive layer 3165, the third conductive layer 3166 and the fourth conductive layer 3167 in embodiments.

Further, while first conductive layer 3164 and second conductive layer 3165 of superconducting joint 3162 are shown and described as being substantially the same in the illustrated embodiment, it should be appreciated that first conductive layer 3164 may be different from second conductive layer 3165 in some embodiments. Similarly, while third conductive layer 3166 and fourth conductive layer 3167 of superconducting joint 3167 are shown and described as being substantially the same in the illustrated embodiment, it should be appreciated that third conductive layer 3166 may be different from fourth conductive layer 3167 in some embodiments. For example, in some embodiments first conductive layer 3164 may have one or more characteristics (e.g., dimensions, materials, etc.) that are different from corresponding characteristics of second conductive layer 3165. Additionally, in some embodiments third conductive layer 3166 may have one or more characteristics (e.g., dimensions, materials, etc.) that are different from corresponding characteristics of fourth conductive layer 3167.

In one embodiment, first conductive layer 3164 and second conductive layer 3165 include a superconducting metal. Additionally, in one embodiment third conductive layer 3166 and fourth conductive layer 3167 include a conventional metal. Further, in one embodiment conductive structure 3163 includes a cured superconducting paste. In some embodiments, the superconducting paste is a lead-based paste which may combinable with nanoparticles, carbon nanotubes, metallic nanotubes, mixed metals, alloys, and metal-ceramic pastes or combinations thereof. The metals can be conventional and/or superconducting metals. In embodiments, the paste can use an epoxy or substantially any other polymer system or materials. Examples of suitable polymer materials include epoxy resins, polytetrafluoroethylene (e.g., Teflon), polyimides, polyamides, cyanate resins, polyphenylene ether resins, photo-imageable materials, and other like materials. In one embodiment, conductive structure 3163 reacts with conductive layers 3166 and 3167 (and/or conductive layers 3164 and 3165) to produce a new composition. In one embodiment, conductive layers 3166 and 3167 are the same (or substantially the same). Additionally, in one embodiment, conductive layers 3164 and 3165 are the same (or substantially the same). Further, in one embodiment, conductive structure 3163 includes a cured superconducting paste. The paste may be cured using a lamination (heat and pressure) process, for example.

In one embodiment, the superconducting joint 3162 shown in FIG. 1C represents a superconducting paste filled via which provides a superconducting path between interconnect pads 3121, 3131. In one embodiment, the superconducting paste filled via can include multiple metal layers or coatings (e.g., 3164, 3165, 3166, 3167) which are applied or formed prior to via fill.

Referring now to FIG. 2, in which like elements of FIGS. 1 and 1A are shown having like reference designations, a first example cryogenic electronic assembly 200 according to the disclosure is shown. The cryogenic electronic assembly 200 (e.g., a cryogenic assembly with cold plates for efficient heat dissipation) includes a first cryogenic electronic package 1200 and a second cryogenic electronic package 2200. Cryogenic electronic assembly 200 also includes a coupling means 210 for coupling the first cryogenic electronic package (also referred to herein as a "first cryogenic package") 1200 to the second cryogenic electronic package (also referred to herein as a "second cryogenic package") 2200.

The first cryogenic package 1200 includes a substrate 1210, interposer 120 and SMCM 130. Additionally, the first cryogenic package 1200 includes first superconducting semiconductor structure 140, second superconductor semiconductor structure 150 and a heat dissipation structure 1220.

The substrate 1210 (e.g., a conventional non-superconducting circuitized substrate) has first and second opposing surfaces and includes a plurality of electrical connections (e.g., vias) (not shown) extending between selected portions of the first and second surfaces. The substrate 1210 also includes a plurality of interconnect pads (here, interconnect pads 1211, 1211', 1212, 1212', 1212", 1212''', 1212'''', 1212''''') which have first and second opposing surfaces.

Interconnect pads 1211, 1211' each have a surface disposed over or otherwise coupled to selected portions of the first surface of the substrate 1210. Additionally, interconnect pads 1212, 1212', 1212", 1212''', 1212'''', 1212''''' each have a surface disposed over or otherwise coupled to selected portions of the second surface of the first surface of the substrate 1210.

In the illustrated embodiment, interconnect pad 1212 is electrically coupled to interconnect pad 1212' through a conductive structure 1213 (e.g., a via), and interconnect pad 1212" is electrically coupled to interconnect pad 1211 through a conductive structure 1214. Additionally, in the illustrated embodiment, interconnect pad 1212''' is electrically coupled to interconnect pad 1211" through a conductive structure 1215, and interconnect pad 1212'''' is electrically coupled to interconnect pad 1212''''' through a conductive structure 1216. One or more of the interconnect pads (e.g., 1212) and/or the conductive structures (e.g., 1213) may be coupled to one or more of the electrical connections in the substrate 1210.

Interposer 120 of first cryogenic package 1200 is disposed over and coupled (e.g., electrically and mechanically coupled) to substrate 1210 through interconnect structures 161, 162, 163, 164, 165. Additionally, SMCM 130 is disposed over and coupled to interposer 120 through adhesive layer 170 and wire bonding structures 181, 182. Further, first superconducting semiconductor structure 140 and second superconducting semiconductor structure 150 are disposed over and coupled to SMCM 130 through interconnect structures 191, 192, 193, 194, 195, 196, 197, 198.

Heat dissipation structure 1220 (e.g., a heat sink device or cold pate) has a surface (e.g., a second surface) which is disposed beneath and thermally coupled to the first surface of substrate 1210. Additionally, an optional thermal interface structure or material (e.g., Indium (In) preform) 1230 is disposed between the heat dissipation structure 1220 and the first surface of substrate 1210 in the illustrated embodiment. The thermal interface structure 1230 may, for example, provide mechanical strength to the bond(s) formed between the heat dissipation structure 1220 and the substrate 1210 (i.e., resulting from the coupling). Additionally, the thermal interface structure 1230 may reduce air gaps or spaces which may form between the heat dissipation structure 1220 and the substrate 1210. Such may, for example, provide for increased heat dissipation between the substrate 1210 and the heat dissipation structure 1220. In embodiments in which the thermal interface structure 1230 is optional, substrate 1210 may substantially directly attached with the heat dissipation structure 1220 using screws or another suitable fastening means well known to those of ordinary skill in the art, for example.

In one embodiment, in first cryogenic package 1200 heat may be dissipated from the substrate 1210 (and other semiconductor structures coupled to the substrate 1210) to heat dissipation structure 1220 via conductive structures 1214, 1215 of substrate 1210, interconnect pads 1211, 1211' of substrate 1210, and thermal interface structure 1230.

The second cryogenic electronic package 2200, which is similar to the first cryogenic electronic package 1200 in the illustrated embodiment, includes a substrate 2210, an interposer 220 and a SMCM 230. Additionally, the second cryogenic electronic package 2200 includes a first superconducting semiconductor structure 240, a second superconducting semiconductor structure 250 and a heat dissipation structure 2220.

In embodiments, substrate 2210 may be the same as or similar to substrate 1210, interposer 220 may be the same as or similar to interposer 120, and SMCM 230 may be the same as or similar to SMCM 130. Additionally, in embodiments, superconducting semiconductor structure 240 may be the same as or similar to superconducting semiconductor structure 140, and superconducting semiconductor structure 250 may be the same as or similar to superconducting semiconductor structure 150. Further, heat dissipation structure 2220 may be the same as or similar to heat dissipation structure 1220.

In the illustrated embodiment, interposer 220 of second cryogenic package 2200 is disposed over and coupled (e.g., electrically and mechanically coupled) to substrate 2210 through interconnect structures 261, 262, 263, 264, 265. Additionally, SMCM 230 is disposed over and coupled to interposer 220 through adhesive layer 270 and wire bonding structures 281, 282. Further, first superconducting semiconductor structure 240 and second superconducting semiconductor structure 250 are disposed over and coupled to SMCM 230 through interconnect structures 291, 292, 293, 294, 295, 296, 297, 298.

Heat dissipation structure 2220 is disposed beneath and thermally coupled to first semiconductor structure 2210. Additionally, an optional thermal interface structure or material (e.g., Indium (In) preform) 2230 is disposed between the heat dissipation structure 2220 and the substrate 2210 in the illustrated embodiment. In embodiments in which the thermal interface structure 2230 is optional, substrate 2210 may substantially directly attached with the heat dissipation structure 2220 using screws or another suitable fastening means, for example.

Second cryogenic electronic package 2200 of cryogenic electronic assembly 200 is coupled to the first cryogenic electronic package 1200 of cryogenic electronic assembly 200 through a coupling means 210 (e.g., to form a daisy chain type cryogenic electronic assembly 200). In particular, coupling means 210 has a first portion 210a (e.g., a first end) coupled to first cryogenic package 1200 (here, interconnect pad 1212'''' of substrate 1210 of first cryogenic package 1200). Additionally, coupling means 210 has a second opposing portion 210b (e.g., a second opposing end) coupled to second cryogenic package 2200 (here, interconnect pad 2212 of substrate 2210 of second cryogenic package 2200).

It is understood that the coupling means 210 can take a variety of forms, for example, depending upon the application(s) (e.g., communications applications) in which the first and second cryogenic packages 1200, 2200 are to be used. For example, in one embodiment, coupling means 210 can take the form of a flex connector and/or a ribbon connector. Additionally, in one embodiment, coupling means 210 can take the form of a coaxial connector, an optical fiber based connector and/or an optoelectronic connector. In one embodiments, optical fiber based connectors are better than flex and other types of connectors. In general, optical fiber connectors include or are used in connection with a transmitter and receiver. For example, in one embodiment connector 210 represents a transmitter which modulates and amplifies signals which go through an optical fiber to a receiver which amplifies and demodulates the signals.

Although first cryogenic electronic package 1200 is shown as only coupled to second cryogenic electronic package 2200 in the illustrated embodiment, in one embodiment first cryogenic electronic package 1200 (and second cryogenic electronic package 2200) can be further coupled to one or more additional cryogenic electronic packages. In some embodiments, the additional cryogenic electronic packages may be the same as or similar to the first cryogenic electronic package 1200 and/or the second cryogenic electronic package 2200. In other embodiments, the additional cryogenic electronic packages may be different from the first cryogenic electronic package 1200 and/or the second cryogenic electronic package 2200.

Figure 3:
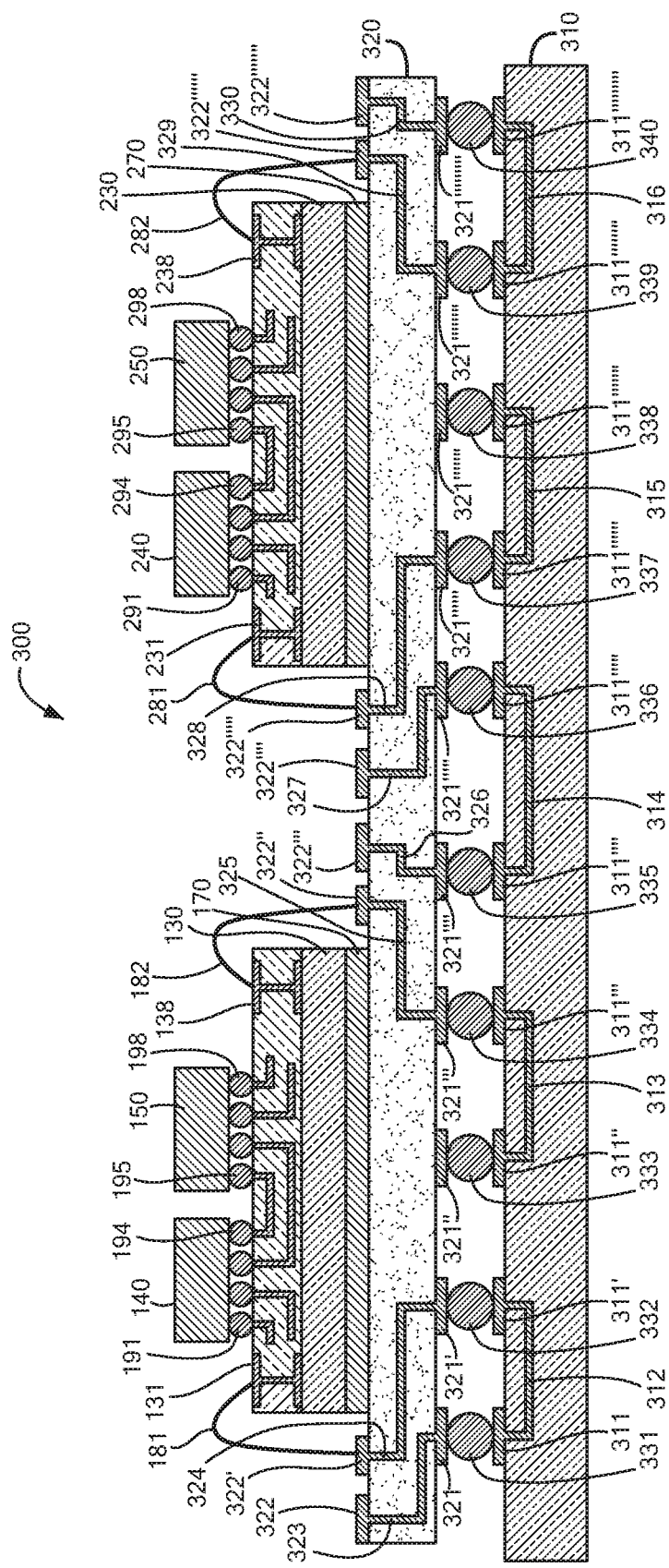
FIGS. 3-3A are block diagrams of further example cryogenic electronic packages in accordance with an embodiment of the disclosure.

Referring to FIG. 3, in which like elements of FIG. 1 are shown having like reference designations, another example cryogenic electronic package 300 includes a substrate 310 and an interposer 320. The cryogenic electronic package 300 also includes SMCM 130 (here, a first SMCM 130) and superconducting semiconductor structures 140, 150 (here, first superconducting semiconductor structures 140, 150). The cryogenic electronic package 300 additionally includes SMCM 230 (here, a second SMCM 230) and superconducting semiconductor structures 240, 250 (here, second superconducting semiconductor structures 240, 250).

Substrate 310 (e.g., a conventional non-superconducting circuitized substrate) has first and second opposing surfaces and includes a plurality of electrical connections (e.g., vias) (not shown) extending between selected portions of the first and second surfaces. The substrate 310 also includes a plurality of interconnect pads (here, interconnect pads 311, 311', 311'', 311''', 311'''', 311''''', 311'''''', 311''''''', 311'''''''') which have first and second opposing surfaces.

Interconnect pads 311, 311', 311'', 311''', 311'''', 311''''', 311'''''', 311''''''', 311'''''''' (e.g., conventional Aluminum (Al) or Gold (Au) interconnect pads) each have a surface disposed over or otherwise coupled to selected portions of the second surface of the substrate 310.

In the illustrated embodiment, interconnect pad 311 is electrically coupled to interconnect pad 311' through a conductive structure 312 (e.g., a via), interconnect pad 311'' is electrically coupled to interconnect pad 311''' through a conductive structure 313, and interconnect pad 311'''' is electrically coupled to interconnect pad 311''''' through conductive structure 314. Additionally, interconnect pad 311''''' is electrically coupled to interconnect pad 311'''''' through a conductive structure 315 and interconnect pad 311'''''' is electrically coupled to interconnect pad 311''''''' through a conductive structure 316. One or more of the interconnect pads (e.g., 311) and/or the conductive structures (e.g., 312) may be coupled to one or more of the electrical connections in the substrate 310.

Interposer 320 (e.g., a multi-layer high density substrate) has first and second opposing surfaces. Interposer 320 includes a first plurality of interconnect pads (here, interconnect pads 321, 321', 321'', 321''', 321'''', 321''''', 321'''''', 321''''''', 321'''''''') and a second plurality of interconnect pads (322, 322', 322'', 322''', 322'''', 322''''', 322'''''', 322''''''') which have first and second opposing surfaces. The first plurality of interconnect pads 321, 321', 321'', 321''', 321'''', 321''''', 321'''''', 321''''''', 321'''''''' each have a surface disposed over or otherwise coupled to selected portions of the first surface of the interposer 320. Additionally, the second plurality of interconnect pads 322, 322', 322'', 322''', 322'''', 322''''', 322'''''', 322''''''' each have a surface disposed over or otherwise coupled to selected portions of the second surface of the interposer 320.

In the illustrated embodiment, interconnect pad 321 is electrically coupled to interconnect pad 322 through a conductive structure 323 (e.g., a via), and interconnect pad 321' is electrically coupled to interconnect pad 322' through a conductive structure 324. Additionally, in the illustrated embodiment, interconnect pad 321''' is electrically coupled to interconnect pad 322'' through a conductive structure 325, and interconnect pad 321'''' is electrically coupled to interconnect pad 322''' through a conductive structure 326.

Additionally, in the illustrated embodiment, interconnect pad 321''''' is electrically coupled to interconnect pad 322'''' through a conductive structure 327, and interconnect pad 321'''''' is electrically coupled to interconnect pad 322''''' through a conductive structure 328. Further, in the illustrated embodiment, interconnect pad 322'''''' is electrically coupled to interconnect pad 322''''''' through a conductive structure 329, and interconnect pad 321''''''' is electrically coupled to interconnect pad 322'''''' through a conductive structure 330.

Interposer 320 of cryogenic electronic package 300 is coupled to substrate 310 through interconnect structures 331, 332, 333, 334, 335, 336, 337, 338, 399, 340. Additionally, first SMCM 130 is coupled to interposer 320 through adhesive layer 170 and through wire bonding structures 181, 182. Further, first superconducting semiconductor structures 140, 150 are coupled to first SMCM 130 through interconnect structures 191, 192, 193, 194, 195, 196, 197, 198.

Second SMCM 230 of cryogenic electronic package 300 is coupled to interposer 320 through adhesive layer 270 and through wire bonding structures 281, 282. Additionally, the second superconducting semiconductor structures 240, 250 are coupled to second SMCM 230 through interconnect structures 291, 292, 293, 294, 295, 296, 297, 298.

In the illustrated embodiment, interposer 320 electrically couples first SMCM 130 and first semiconducting semiconductor structures 140, 150 to substrate 310. Additionally, interposer 320 electrically couples second SMCM 230 and second semiconductor structures 240, 250 to substrate 310. Further, interposer 320 may electrically couple at least one of first SMCM 130 and first semiconducting semiconductor structures 140, 150 to at least one of second SMCM 230 and second semiconducting semiconductor structures 240, 250. For example, first SMCM 130 may be electrically coupled to second SMCM 230 through interposer 320. Additionally, first superconducting semiconductor structures 140, 150 (e.g., SFQ ICs) may be electrically coupled to second superconducting semiconductor structures 240, 250 (e.g., SFQ ICs) through first SMCM 130, interposer 320 and second SMCM 230.

Figure 3A:
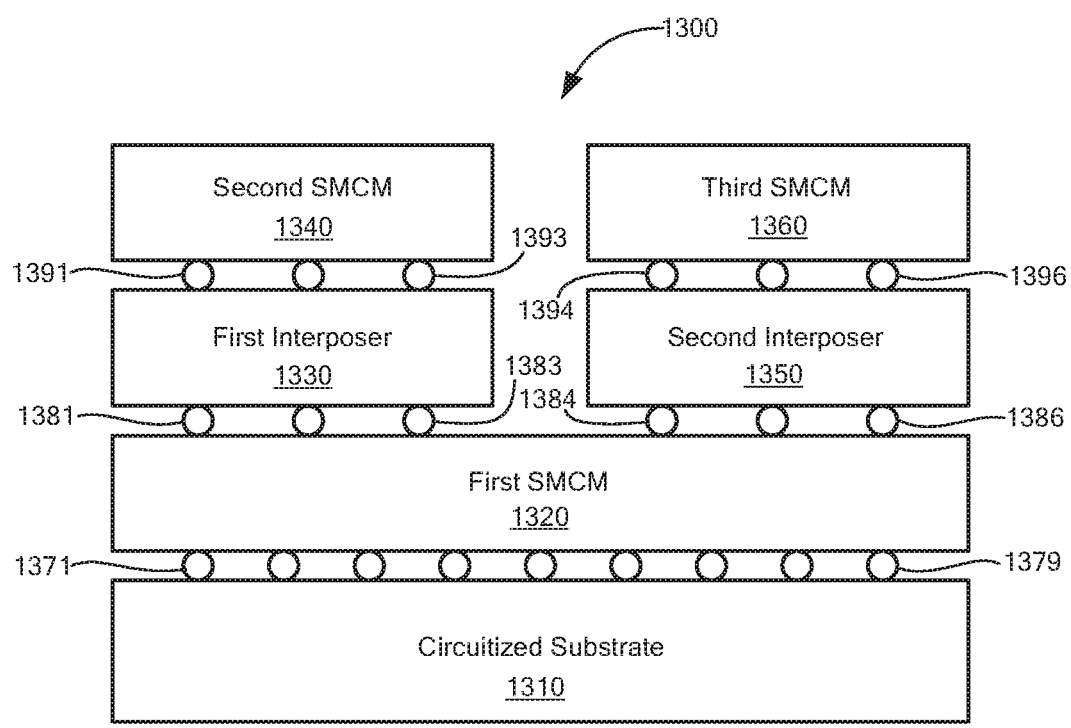

Referring to FIG. 3A, another example cryogenic electronic package 1300 includes a substrate 1310, a first SMCM 1320 and a first interposer 1330. The cryogenic electronic package 1300 also includes a second SMCM 1340, a second interposer 1350 and a third SMCM 1360.

Substrate 1310 (e.g., a conventional non-superconducting circuitized substrate) is coupled to the first SMCM 1320 through interconnect structures 1371, 1372, 1373, 1374, 1375, 1376, 1377, 1378, 1379. Additionally, first interposer 1330 is coupled to the first SMCM 1320 through interconnect structures 1381, 1382, 1383. Further, second SMCM 1340 is coupled to the first interposer 1330 through interconnect structures 1391, 1392, 1393.

Additionally, second interposer 1350 is coupled to the first SMCM 1320 through interconnect structures 1384, 1385, 1386. Further, third SMCM 1360 is coupled to the second interposer 1350 through interconnect structures 1394, 1395, 1396. In embodiments, at least one of interconnect structures (e.g., 1371) is a superconducting or a partially superconducting interconnect structure.

The second SMCM 1340 includes at least one first superconducting component and the third SMCM 1360 includes at least one second superconducting component. In one embodiment, second SMCM 1340 includes CMOS transistors which operate at temperatures of about 4.2K and third SMCM 1360 includes one or more Josephson Junctions. In another embodiment, second SMCM 1340 and third SMCM 1360 can create hybrid memory. In a further embodiment, third SMCM 1360 can be used to measure propagation delay of second SMCM 1340. The propagation delay may correspond to a propagation delay of signals between the second SMCM 1340 and the third SMCM 1360, for example. It is also possible that second SMCM 1340 works differently at room temperature when attached to first superconducting MCM 1320. In the illustrated embodiment, the at least one first superconducting component of the second SMCM 1340 is electrically coupled to the at least one second superconducting component of the third SMCM 1360 through the first interposer 1330, first SMCM 1320 and second interposer 1350. Additionally, the at least one first superconducting component of the second SMCM 1340 is electrically coupled to the substrate 1310 through first interposer 1330 and first SMCM 1320. Further, the at least one second superconducting component of the third SMCM 1360 is electrically coupled to the substrate 1310 through second interposer 1350 and first SMCM 1320.

In embodiments, at least one of the first interposer 1330 and the second interposer 1350 is a superconducting and/or a partially superconducting interposer.

While substrate 1310 is shown as a circuited substrate, first, second and third SMCMs 1320, 1340, 1360 are shown as SMCMs, and first and second interposers 1330, 1350 are shown as interposers, it should be appreciated that in embodiments at least one of the semiconductor structures (e.g., first interposer 1330) may be a different type of semiconductor structure from that which is shown. For example, first interposer 1330 can be an Si based interposer and second interposer 1350 can be an organic based interposer in some embodiments. Additionally, first interposer 1330 can be a superconducting interposer and second interposer 1350 can be a conventional metal interposer in some embodiments. Further, in one embodiment, second and third SMCMs 1320, 1340 can include at least one through via (e.g. TSV).

Figure 4:
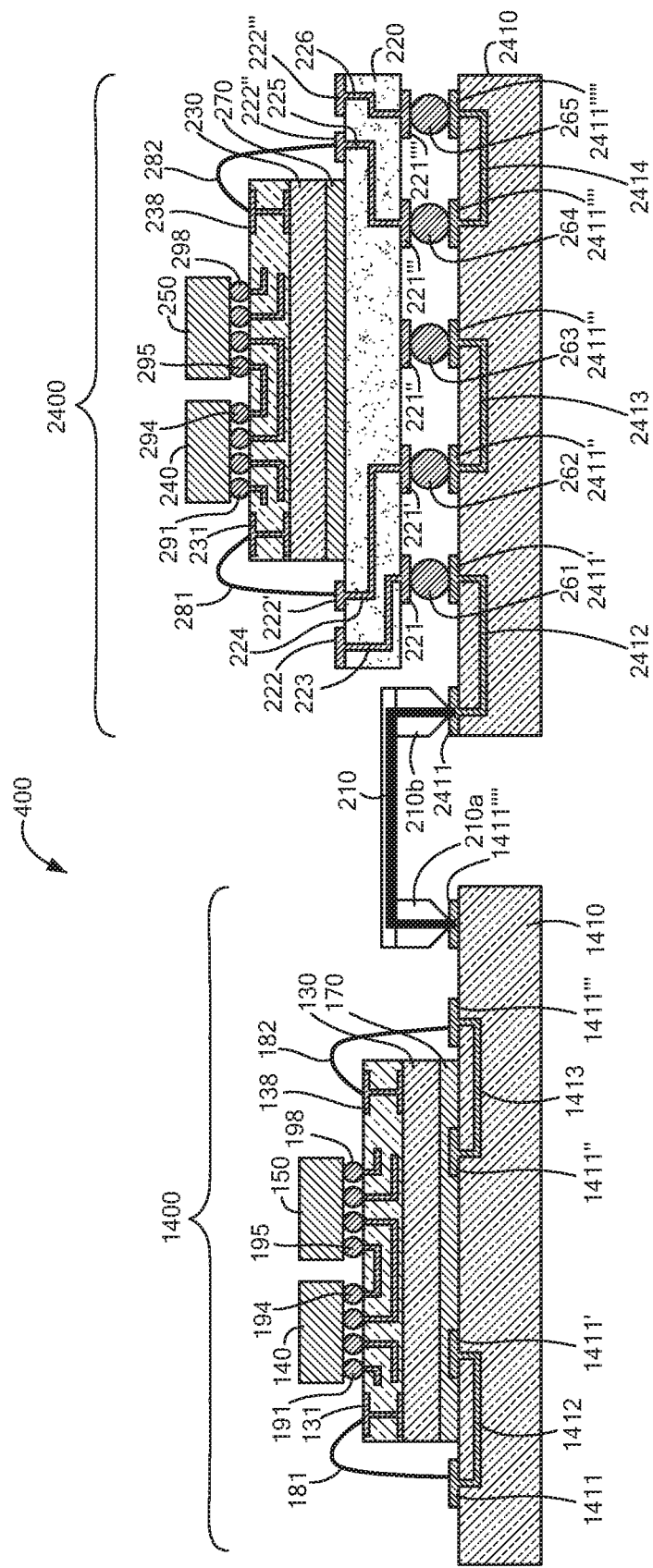
FIG. 4 is a block diagram of another example cryogenic electronic assembly in accordance with an embodiment of the disclosure.

Referring now to FIG. 4, in which like elements of FIG. 2 are shown having like reference designations, another example cryogenic electronic assembly 400 (e.g., an assembly of at least two different cryogenic electronic packages) includes a first cryogenic electronic package 1400 and a second cryogenic electronic package 2400. Cryogenic electronic assembly 400 also includes a coupling means 210 for coupling the first cryogenic electronic package structure (also referred to herein as a "first cryogenic package") 1400 to the second cryogenic electronic package structure (also referred to herein as a "second cryogenic package") 2400.

The first cryogenic package 1400 includes a substrate 1410 and SMCM 130. The first cryogenic package 1400 also includes superconducting semiconductor structures 140, 150.

The substrate 1410 (e.g., a conventional non-superconducting circuitized substrate) has first and second opposing surfaces and includes a plurality of interconnect pads (here, interconnect pads 1411, 1411', 1411", 1411''', 1411'''') which also have first and second opposing surfaces. Interconnect pads 1411, 1411', 1411", 1411''', 1411'''' each have a surface disposed over or otherwise coupled to selected portions of the first surface of the substrate 1410.

In the illustrated embodiment, interconnect pad 1411 is electrically coupled to interconnect pad 1411' through a conductive structure 1412 (e.g., a via), and interconnect pad 1411" is electrically coupled to interconnect pad 1411''' through a conductive structure 1413.

SMCM 130 of first cryogenic package 1400 is disposed over and coupled to substrate 1410 through adhesive layer 170 and wire bonding structures 181, 182. Additionally, superconducting semiconductor structures 140, 150 are disposed over and coupled to SMCM 130 through interconnect structures 191, 192, 193, 194, 195, 196, 197, 198.

The second cryogenic package 2400, which is similar to second cryogenic package 2200 shown in FIG. 2 in the illustrated embodiment, includes a substrate 2410, interposer 220 and SMCM 230. The second cryogenic package 2400 also includes superconducting semiconductor structures 240, 250.

The substrate 2410 (e.g., a conventional non-superconducting circuitized substrate) has first and second opposing surfaces and includes a plurality of interconnect pads (here, interconnect pads 2411, 2411', 2411", 2411''', 2411'''') which also have first and second opposing surfaces. Interconnect pads 2411, 2411', 2411", 2411''', 2411'''' each have a surface disposed over or otherwise coupled to selected portions of the first surface of the first semiconductor structure 2410.

In the illustrated embodiment, interconnect pad 2411 is electrically coupled to interconnect pad 2411' through a conductive structure 2412 (e.g., a via), and interconnect pad 2411" is electrically coupled to interconnect pad 2411''' through a conductive structure 2413. Additionally, interconnect pad 2411'''' is electrically coupled to interconnect pad 2411''''' through a conductive structure 2414.

Interposer 220 of second cryogenic package 2400 is disposed over and coupled to substrate 2410 through interconnect structures 261, 262, 263, 264, 265. Additionally, SMCM 230 is disposed over and coupled to interposer 220 through adhesive layer 270 and wire bonding structures 281, 282. Further, superconducting semiconductor structures 240, 250 are disposed over and coupled to SMCM 230 through interconnect structures 291, 292, 293, 294, 295, 296, 297, 298.

Second cryogenic package 2400 of cryogenic electronic assembly 400 is coupled to first cryogenic package 1400 of cryogenic electronic assembly 400 through coupling means 210 (e.g., to form a daisy chain type cryogenic electronic assembly 400). In particular, coupling means 210 has a first portion 210a (e.g., a first end) coupled to first cryogenic package 1400 (here, interconnect pad 1411"" of substrate 1410 of first cryogenic package 1400). Additionally, coupling means 210 has a second opposing portion 210b (e.g., a second opposing end) coupled to second cryogenic package 2400 (here, interconnect pad 2411 of substrate 2410 of second cryogenic package 2400).

With the above-described arrangement, two or more different cryogenic electronic packages may be coupled together to form a cryogenic electronic assembly 400 having at least some of the various advantages (e.g., an increased number of SMCMs and superconducting ICs) associated with cryogenic electronic packages and assemblies according to the disclosure. Additionally, in embodiments the above-described arrangement illustrates that two or more different level assembled packages may be coupled together to form a cryogenic electronic assembly 400.

Figure 5:
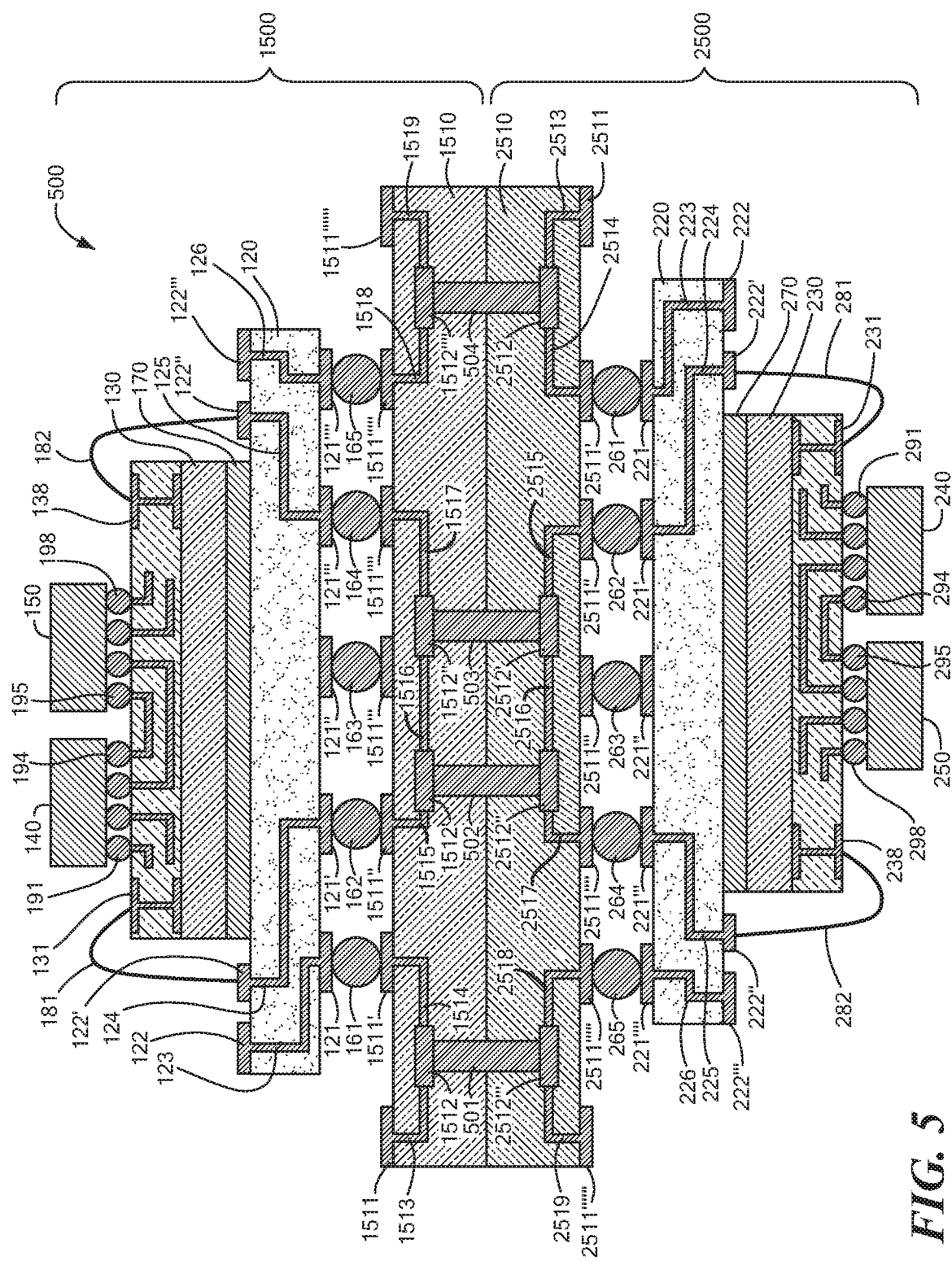
FIG. 5 is a block diagram of a further example cryogenic electronic assembly in accordance with an embodiment of the disclosure.

Referring to FIG. 5, a cryogenic electronic assembly 500 (e.g., a double sided cryogenic electronic assembly) includes a first cryogenic electronic package 1500 and a second cryogenic electronic package 2500. Cryogenic electronic assembly 500 also includes a coupling means (here, conductive structures 501, 502, 503, 504) for coupling the first cryogenic electronic package (also referred to herein as a "first cryogenic package") 1500 to the second cryogenic electronic package (also referred to herein as a "second cryogenic package") 2500.

First cryogenic package 1500 includes a substrate 1510, interposer 120 and SMCM 130. First cryogenic package 1500 also includes superconducting semiconductor structures 140, 150.

The substrate 1510 (e.g., a conventional non-superconducting circuitized substrate) has first and second opposing surfaces. The substrate 1510 also includes a first plurality of interconnect pads (here, interconnect pads 1511, 1511', 1511", 1511''', 1511'''', 1511''''', 1511'''''') and a second plurality of interconnect pads (1512, 1512', 1512", 1512''') which have first and second opposing surfaces. The first plurality of interconnect pads 1511, 1511', 1511", 1511''', 1511'''', 1511''''', 1511'''''' each have a surface disposed over or otherwise coupled to selected portions of the second surface of the substrate 1510. Additionally, the second plurality of interconnect pads 1512, 1512', 1512", 1512''' are each disposed between the first and second surfaces of the substrate 1510.

In the illustrated embodiment, interconnect pad 1511 is electrically coupled to interconnect pad 1512 through a conductive structure 1513 (e.g., a via), and interconnect pad 1511' is electrically coupled to interconnect pad 1512 through a conductive structure 1514. Additionally, interconnect pad 1511" is electrically coupled to interconnect pad 1512' through a conductive structure 1515, and interconnect pad 1512" is electrically coupled to interconnect pad 1512' through a conductive structure 1516.

Additionally, interconnect pad 1511''' is electrically coupled to interconnect pad 1512" through a conductive structure 1517. Further, interconnect pad 1511'''' is electrically coupled to interconnect pad 1512''' through a conductive structure 1518, and interconnect pad 1511''''' is electrically coupled to interconnect pad 1512''' through a conductive structure 1519.

Interposer 120 of first cryogenic package 1500 is disposed over and coupled to substrate 1510 through interconnect structures 161, 162, 163, 164, 165. Additionally, SMCM 130 is disposed over and coupled to interposer 120 through adhesive layer 170 and wire bonding structures 181, 182. Further, superconducting semiconductor structures 140, 150 are disposed over and coupled to SMCM 130 through interconnect structures 191, 192, 193, 194, 195, 196, 197, 198.

Second cryogenic package 2500, which is similar to first cryogenic package 1500 in the illustrated embodiment, includes a substrate 2510, interposer 220 and SMCM 230. Second cryogenic structure 2500 also includes superconducting semiconductor structures 240, 250.

Substrate 2510 (e.g., a conventional non-superconducting circuitized substrate), which is similar to substrate 1510 in the illustrated embodiment, has first and second opposing surfaces. Substrate 2510 includes a first plurality of interconnect pads (here, interconnect pads 2511, 2511', 2511", 2511''', 2511'''', 2511''''', 2511'''''') and a second plurality of interconnect pads (2512, 2512', 2512", 2512''') which have first and second opposing surfaces. The first plurality of interconnect pads 2511, 2511', 2511", 2511''', 2511'''', 2511''''', 2511'''''' each have a surface disposed over or otherwise coupled to selected portions of the second surface of the substrate 2510. Additionally, the second plurality of interconnect pads 2512, 2512', 2512", 2512''' are each disposed between the first and second surfaces of the substrate 2510.

Interposer 220 of second cryogenic structure 2500 is disposed over and coupled to the substrate 2510 through interconnect structures 261, 262, 263, 264, 265. Additionally, SMCM 230 is disposed over and coupled to interposer 220 through adhesive layer 270 and wire bonding structures 281, 282. Further, superconducting semiconductor structures 240, 250 are disposed over and coupled to SMCM 230 through interconnect structures 291, 292, 293, 294, 295, 296, 297, 298.

Second cryogenic package 2500 is coupled to first cryogenic package 1500 through a coupling means (here, conductive structures 501, 502, 503, 504) to form cryogenic electronic assembly 500. In embodiments, the conductive structures 501, 502, 503, 504 are or include vias.

In particular, cryogenic electronic assembly 500 includes a conductive structure 501 having a first portion (e.g., a first end) that extends through a first selected portion of substrate 1510 of first cryogenic package 1500 and is coupled to interconnect pad 1512 of substrate 1510. The conductive structure 501 also has a second opposing portion (e.g., a second end) that extends through a first selected portion of substrate 2510 of second cryogenic package 2500 and is coupled to interconnect pad 2512''' of substrate 2510.

Cryogenic electronic assembly 500 also includes a conductive structure 502 having a first portion (e.g., a first end) that extends through a second selected portion of substrate 1510 of first cryogenic package 1500 and is coupled to interconnect pad 1512' of substrate 1510. The conductive structure 502 also has a second opposing portion (e.g., a second end) that extends through a second selected portion of substrate 2510 of second cryogenic package 2500 and is coupled to interconnect pad 2512″ of substrate 2510.

Cryogenic electronic assembly 500 additionally includes a conductive structure 503 having a first portion (e.g., a first end) that extends through a third selected portion of substrate 1510 of first cryogenic package 1500 and is coupled to interconnect pad 1512″ of substrate 1510. The conductive structure 503 also has a second opposing portion (e.g., a second end) that extends through a third selected portion of substrate 2510 of second cryogenic package 2500 and is coupled to interconnect pad 2512′ of substrate 2510.

Cryogenic electronic assembly 500 further includes a conductive structure 504 having a first portion (e.g., a first end) that extends through a fourth selected portion of substrate 1510 of first cryogenic package 1500 and is coupled to interconnect pad 1512‴ of substrate 1510. The conductive structure 504 also has a second opposing portion (e.g., a second end) that extends through a fourth selected portion of substrate 2510 of second cryogenic package 2500 and is coupled to interconnect pad 2512 of substrate 2510.

Each of the conductive structures (e.g., 501) may form one or more electrical connections between the first cryogenic package 1500 and the second cryogenic package 2500.

While substrate 1510 of first cryogenic package 1500 and substrate 2510 of second cryogenic package 2500 are shown as separate substrates in the illustrated embodiment, it is understood that in some embodiments the substrates 1510, 1520 make take the form of a single substrate (or other type of semiconductor structure). In embodiments, the single substrate may be provided in either the first cryogenic package 1500 or the second cryogenic package 2500. Additionally, in embodiments, the single substrate may be provided as part of the cryogenic electronic assembly 500, but separate from the first cryogenic package 1500 and the second cryogenic package 2500.

Additionally, while the coupling means takes the form of conductive structures 501, 502, 503, 504 in the illustrated embodiment, it is understood that in some embodiments the coupling means make take other forms. For example, in one embodiment, one or more of the conductive structures 501, 502, 503, 504 may take the form of a connector (e.g., coupling means 210, shown in FIG. 4).

In one embodiment, cryogenic electronic assembly 500 represents a double sided assembly of a circuitized substrate or a superconducting circuitized substrate. In the illustrated embodiment, the circuitized substrate includes a plurality of top pads (e.g., 1511) and a plurality of bottom pads (e.g., 2511) for assembly of the cryogenic electronic assembly. The circuitized substrate also includes respective circuits (e.g., 2510, 1510) and vias (e.g., 2519, 1519, 504). In another embodiment, at least part of the circuitized substrate has pads attachable to a connector of another substrate or board (e.g., backplane board).

Figure 5A:
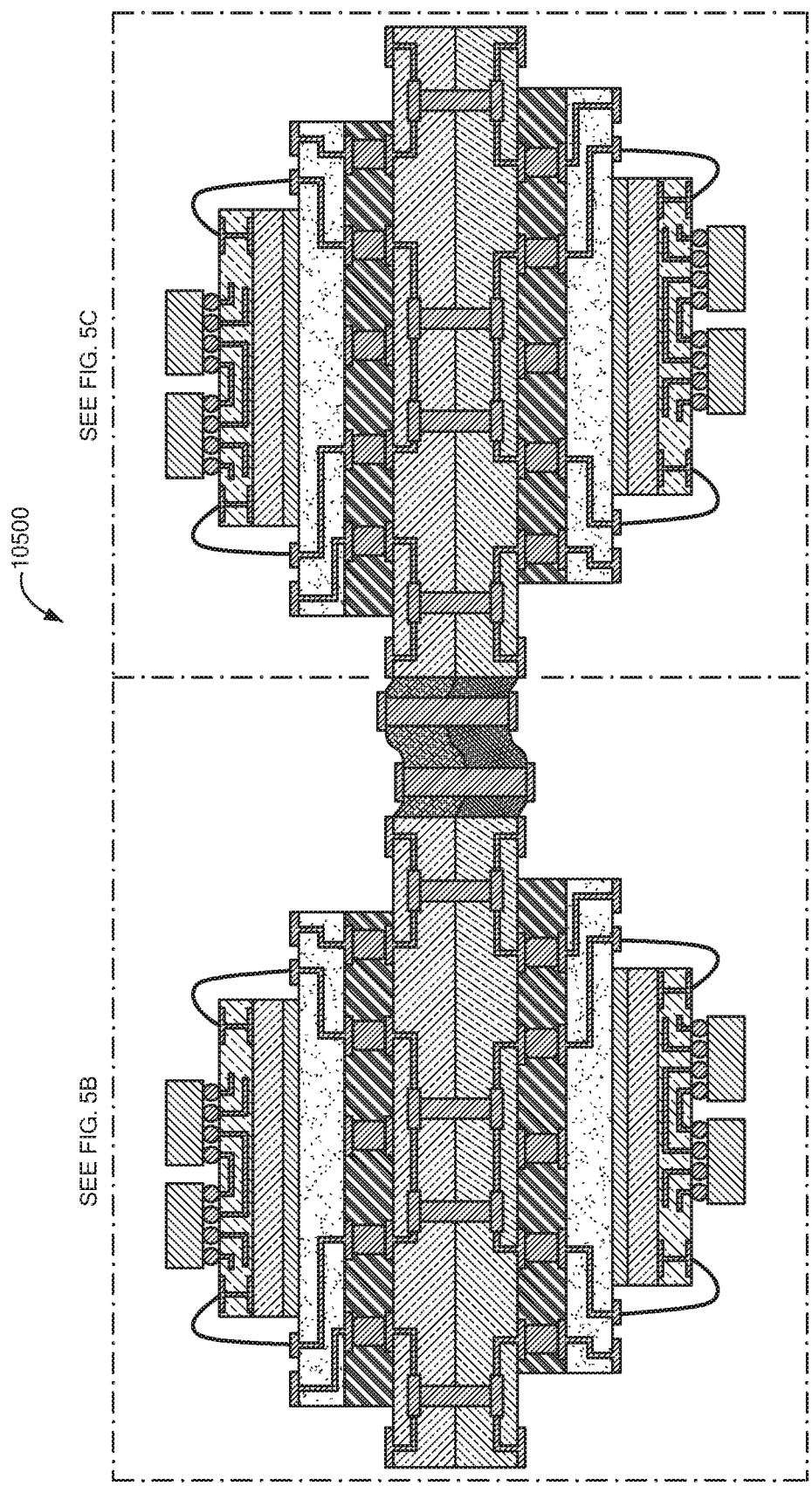
FIGS. 5A-5C are block diagrams of another example cryogenic electronic assembly in accordance with an embodiment of the disclosure.
Figure 5B:
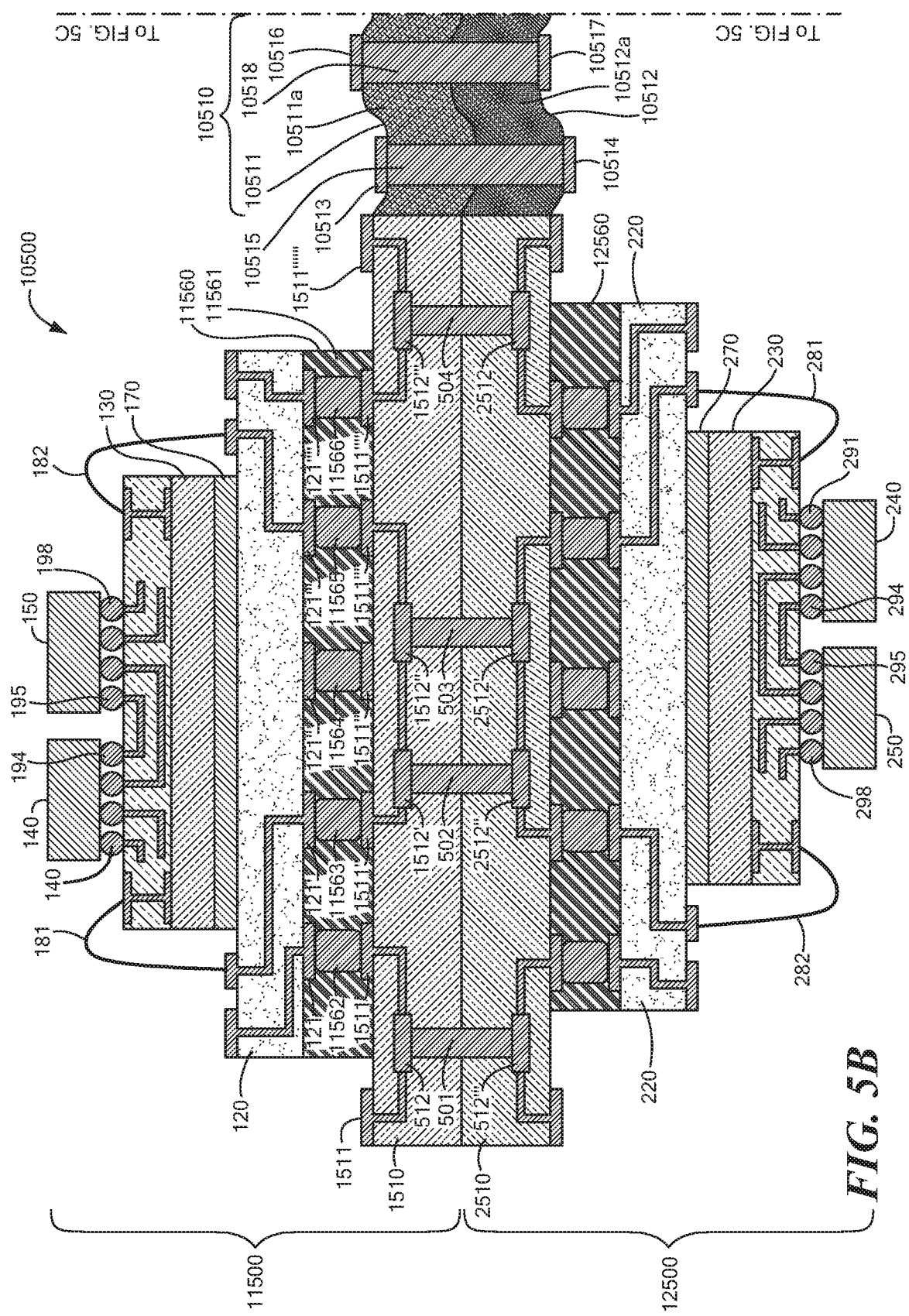
Figure 5C:
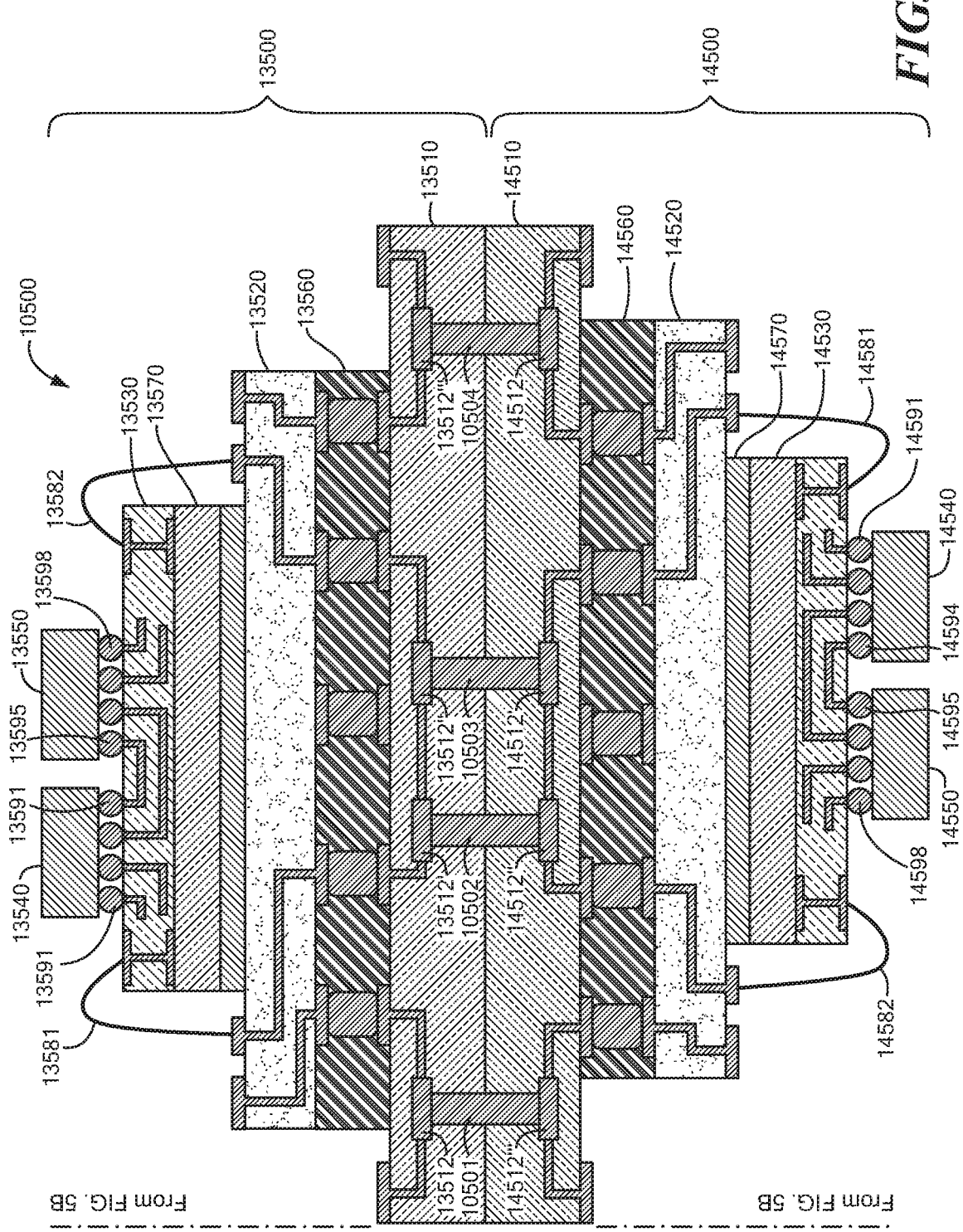

Referring to FIGS. 5A-5C, in which like elements of FIG. 5 are shown having like reference designations, another example cryogenic electronic assembly 10500 includes a plurality of cryogenic electronic packages (here, cryogenic electronic packages 11500, 12500, 13500, 14500). Cryogenic electronic assembly 10500 also includes a first coupling means (here, conductive structures 501, 502, 503, 504) for coupling cryogenic electronic packages 11500, 12500 together. Cryogenic electronic assembly 10500 additionally includes a second coupling means (here, conductive structures 10501, 10502, 10503, 10504) for coupling cryogenic electronic packages 13500, 14500 together. Cryogenic electronic assembly 10500 further includes a third coupling means (here, connector 10510) for coupling the cryogenic electronic packages 11500, 12500 to cryogenic electronic packages 13500, 14500. As indicated in FIG. 5A, a first portion of the cryogenic electronic assembly 10500 is shown in more detail in FIG. 5B. Additionally, as indicated in FIG. 5A, a second portion of cryogenic electronic assembly 10500 is shown in more detail in FIG. 5C.

Referring now to FIG. 5B, cryogenic electronic package 11500 (also sometimes referred to herein as "first cryogenic electronic package 11500"), which is substantially the same as first cryogenic electronic package 1500 of FIG. 5 in the illustrated embodiment (less interconnect structures 161, 162, 163, 164, 165), includes first substrate 1510, first interposer 120, first SMCM 130 and first superconducting semiconductor structures 140, 150. Cryogenic electronic package 11500 also includes a superconducting joint structure 11560, as will be discussed further below.

In the illustrated embodiment, the first superconducting semiconductor structures 140, 150 of first cryogenic electronic package 11500 are disposed over and coupled to first SMCM 130 through interconnect structures 191, 192, 193, 194, 195, 196, 197, 198.

Additionally, in the illustrated embodiment first SMCM 130 is disposed over and coupled to first interposer 120 through adhesive layer 170 and wire bonding structures 181, 182. Further, in the illustrated embodiment first interposer 120 is disposed over and coupled to first substrate 1510 through superconducting joint structure 11560.

Similar to superconducting joint structure 2160 described above in connection with FIG. 1B, superconducting joint structure 11560 has first and second opposing surfaces and includes an organic bonding layer (here, organic bonding layer 11561) and a plurality of superconducting joints (here, superconducting joints 11562, 11563, 11564, 11565, 11566).

In the illustrated embodiment, superconducting joint 11562 has a first portion coupled to a surface (e.g., a first surface) of interconnect pad 1511′ of first substrate 1510. Additionally, superconducting joint 11562 has a second opposing portion coupled to a surface (e.g., a first surface) of interconnect pad 121 of interposer 120. Superconducting joint 11563 has a first portion coupled to a surface (e.g., a first surface) of interconnect pad 1511″ of first substrate 1510. Additionally, superconducting joint 11563 has a second opposing portion coupled to a surface (e.g., a first surface) of interconnect pad 121′ of interposer 120. Superconducting joint 11564 has a first portion coupled to a surface (e.g., a first surface) of interconnect pad 1511‴ of first substrate 1510. Additionally, superconducting joint 11564 has a second opposing portion coupled to a surface (e.g., a first surface) of interconnect pad 121″ of interposer 120.

Superconducting joint 11565 has a first portion coupled to a surface (e.g., a first surface) of interconnect pad 1511⁗ of first substrate 1510. Additionally, superconducting joint 11565 has a second opposing portion coupled to a surface (e.g., a first surface) of interconnect pad 121‴ of interposer 120. Superconducting joint 11566 has a first portion coupled to a surface (e.g., a first surface) of interconnect pad 1511⁗′ of first substrate 1510. Additionally, superconducting joint 11566 has a second opposing portion coupled to a surface (e.g., a first surface) of interconnect pad 121⁗ of interposer 120.

In some embodiments, at least one of the superconducting joints 11562, 11563, 11564, 11565, 11566 is the same as or similar to superconducting joint 3162 described above in connection with FIG. 1C, including a conductive structure (e.g., 3163, shown in FIG. 1C) and a plurality of conductive layers (e.g., 3164, 3165, 3166, 3167, shown in FIG. 1C). As discussed above, a superconducting joint including a conductive structure and a plurality of conductive layers may provide a more robust electrical connection (e.g., between substrate 1510 and interposer 120) than a superconducting joint including a conductive structure and no conductive layers, for example, in some embodiments.

Cryogenic electronic package 12500 (also sometimes referred to herein as "second cryogenic electronic package" 12500), which is substantially the same as cryogenic electronic package 2500 of FIG. 5 in the illustrated embodiment (less interconnect structures 261, 262, 263, 264, 265), includes second substrate 2510, second interposer 220, second SMCM 230 and second superconducting semiconductor structures 240, 250. Cryogenic electronic package 12500 also includes a superconducting joint structure 12560.

In the illustrated embodiment, the second superconducting semiconductor structures 240, 250 of second cryogenic electronic package 12500 are disposed over and coupled to second SMCM 230 through interconnect structures 291, 292, 293, 294, 295, 296, 297, 298. Additionally, in the illustrated embodiment second SMCM 230 is disposed over and coupled to second interposer 120 through adhesive layer 270 and wire bonding structures 281, 282. Further, in the illustrated embodiment second interposer 220 is disposed over and coupled to second substrate 2510 through superconducting joint structure 12560.

Superconducting joint structure 12560 is substantially the same as superconducting joint structure 11560 of first cryogenic electronic package 11500 in the illustrated embodiment and, thus, will not be described in detail herein.

Second cryogenic electronic package 12500 of cryogenic electronic assembly 10500 is coupled to first cryogenic electronic package 11500 of cryogenic electronic assembly 10500 through a first coupling means (here, conductive structures 501, 502, 503, 504) in the example embodiment shown.

In particular, cryogenic electronic assembly 10500 includes a conductive structure 501 (e.g., a via) having a first portion (e.g., a first end) that extends through a first selected portion of substrate 1510 of first cryogenic electronic package 11500 and is coupled to interconnect pad 1512 of substrate 1510. The conductive structure 501 also has a second opposing portion (e.g., a second end) that extends through a first selected portion of substrate 2510 of second cryogenic electronic package 12500 and is coupled to interconnect pad 2512''' of substrate 2510.

Cryogenic electronic assembly 10500 also includes a conductive structure 502 having a first portion (e.g., a first end) that extends through a second selected portion of substrate 1510 of first cryogenic electronic package 11500 and is coupled to interconnect pad 1512' of substrate 1510. The conductive structure 502 also has a second opposing portion (e.g., a second end) that extends through a second selected portion of substrate 2510 of second cryogenic electronic package 12500 and is coupled to interconnect pad 2512'' of substrate 2510.

Cryogenic electronic assembly 10500 additionally includes a conductive structure 503 having a first portion (e.g., a first end) that extends through a third selected portion of substrate 1510 of first cryogenic electronic package 11500 and is coupled to interconnect pad 1512'' of substrate 1510. The conductive structure 503 also has a second opposing portion (e.g., a second end) that extends through a third selected portion of substrate 2510 of second cryogenic electronic package 12500 and is coupled to interconnect pad 2512' of substrate 2510.

Cryogenic electronic assembly 10500 further includes a conductive structure 504 having a first portion (e.g., a first end) that extends through a fourth selected portion of substrate 1510 of first cryogenic electronic package 11500 and is coupled to interconnect pad 1512''' of substrate 1510. The conductive structure 504 also has a second opposing portion (e.g., a second end) that extends through a fourth selected portion of substrate 2510 of second cryogenic electronic package 12500 and is coupled to interconnect pad 2512 of substrate 2510.

Each of the conductive structures (e.g., 501) may form one or more electrical connections between the first cryogenic electronic package 11500 and the second cryogenic electronic package 12500.

Referring also now to FIG. 5C, third cryogenic package 13500, which is substantially the same as the first cryogenic package 11500 in the illustrated embodiment, includes a third substrate 13510, a third interposer 13520, a third SMCM 13530 and third superconducting semiconductor structures 13540, 13550. Third cryogenic package 13500 also includes a superconducting joint structure 13560.

Third substrate 13510 of third cryogenic electronic package 13500 is substantially the same as first substrate 1510 of first cryogenic electronic package 11500 in the illustrated embodiment and, thus, will not be described in detail herein. Additionally, third interposer 13520 of third cryogenic package 13500 is substantially the same as first interposer 120 of first cryogenic package 11500 in the illustrated embodiment and, thus, will not be described in detail herein. Additionally, third SMCM 13530 of third cryogenic package 13500 is substantially the same as first SMCM 130 of first cryogenic package 11500 in the illustrated embodiment and, thus, will not be described in detail herein. Further, superconducting semiconductor structures 13540, 13550 (e.g., SFQ IC's) of third cryogenic package 13500 are substantially the same as superconducting semiconductor structures 140, 150 of first cryogenic package 11500 in the illustrated embodiment and, thus, will not be described in detail herein. Additionally, superconducting joint structure 13560 is substantially the same as superconducting joint structure 11560 of first cryogenic package 11500 in the illustrated embodiment and, thus, will not be described in detail herein.

In the illustrated embodiment, third interposer 13520 of third cryogenic electronic package 13500 is disposed over and coupled to third substrate 13510 through superconducting joint structure 13560. Additionally, in the illustrated embodiment third SMCM 13530 is disposed over and coupled to third interposer 13520 through an adhesive layer 13570 and wire bonding structures 13581, 13582. Further, in the illustrated embodiment third superconducting semiconductor structures 13540, 13550 are disposed over and coupled to third SMCM 13530 through interconnect structures 13591, 13592, 13593, 13594, 13595, 13596, 13597, 13598.

Fourth cryogenic electronic package 14500, which is also substantially the same as first cryogenic electronic package 11500 in the illustrated embodiment, includes a fourth substrate 14510, a fourth interposer 14520 and a fourth SMCM 14530. Fourth cryogenic package 14500 also includes fourth superconducting semiconductor structures 14540, 14550 and a superconducting joint structure 14560.

Fourth substrate 14510 of fourth cryogenic electronic package 14500 is substantially the same as first substrate 1510 of first cryogenic electronic package 11500 in the illustrated embodiment and, thus, will not be described in detail herein. Additionally, fourth interposer 14520 of fourth cryogenic package 14500 is substantially the same as first interposer 120 of first cryogenic package 11500 in the illustrated embodiment and, thus, will not be described in detail herein. Additionally, fourth SMCM 14530 of fourth cryogenic package 14500 is substantially the same as first SMCM 130 of first cryogenic package 11500 in the illustrated embodiment and, thus, will not be described in detail herein. Further, superconducting semiconductor structures 14540, 14550 (e.g., SFQ IC's) of fourth cryogenic package 14500 are substantially the same as superconducting semiconductor structures 140, 150 of first cryogenic package 11500 in the illustrated embodiment and, thus, will not be described in detail herein. Additionally, superconducting joint structure 14560 is substantially the same as superconducting joint structure 11560 of first cryogenic package 11500 in the illustrated embodiment and, thus, will not be described in detail herein.

In the illustrated embodiment, fourth interposer 14520 of fourth cryogenic electronic package 14500 is disposed over and coupled to fourth substrate 14510 through superconducting joint structure 14560. Additionally, in the illustrated embodiment fourth SMCM 14530 is disposed over and coupled to fourth interposer 14520 through an adhesive layer 14570 and wire bonding structures 14581, 14582. Further, in the illustrated embodiment fourth superconducting semiconductor structures 14540, 14550 are disposed over and coupled to fourth SMCM 14530 through interconnect structures 14591, 14592, 14593, 14594, 14595, 14596, 14597, 14598.

Fourth cryogenic package 14500 of cryogenic electronic assembly 10500 is coupled to third cryogenic package 13500 of cryogenic electronic assembly 10500 through a second coupling means (here, conductive structures 10501, 10502, 10503, 10504) in the example embodiment shown.

In particular, cryogenic electronic assembly 10500 includes a conductive structure (e.g., a via) 10501 having a first portion (e.g., a first end) that extends through a first selected portion of substrate 13510 of third cryogenic package 13500 and is coupled to interconnect pad 13512 of substrate 13510. The conductive structure 10501 also has a second opposing portion (e.g., a second end) that extends through a first selected portion of substrate 14510 of fourth cryogenic electronic package 14500 and is coupled to interconnect pad 14512''' of substrate 14510.

Cryogenic electronic assembly 10500 also includes a conductive structure 10502 having a first portion (e.g., a first end) that extends through a second selected portion of substrate 13510 of third cryogenic package 13500 and is coupled to interconnect pad 13512' of substrate 13510. The conductive structure 10502 also has a second opposing portion (e.g., a second end) that extends through a second selected portion of substrate 14510 of fourth cryogenic electronic package 14500 and is coupled to interconnect pad 14512'' of substrate 14510.

Cryogenic electronic assembly 10500 additionally includes a conductive structure 10503 having a first portion (e.g., a first end) that extends through a third selected portion of substrate 13510 of third cryogenic package 13500 and is coupled to interconnect pad 13512'' of substrate 13510. The conductive structure 10503 also has a second opposing portion (e.g., a second end) that extends through a third selected portion of substrate 14510 of fourth cryogenic electronic package 14500 and is coupled to interconnect pad 14512' of substrate 14510.

Cryogenic electronic assembly 10500 further includes a conductive structure 10504 having a first portion (e.g., a first end) that extends through a fourth selected portion of substrate 13510 of third cryogenic package 13500 and is coupled to interconnect pad 13512''' of substrate 13510. The conductive structure 10504 also has a second opposing portion (e.g., a second end) that extends through a fourth selected portion of substrate 14510 of fourth cryogenic electronic package 14500 and is coupled to interconnect pad 14512 of substrate 14510.

Each of the conductive structures (e.g., 10501) may form one or more electrical connections between the third cryogenic package 13500 and the fourth cryogenic package 14500.

In the illustrated embodiment, the first and second cryogenic electronic packages 11500, 12500 are coupled to the third and fourth cryogenic electronic packages 13500, 14500 through a third coupling means (here, a connector 10510).

In particular, connector 10510 (e.g., a flex or ribbon connector) includes a first connector portion 10511 having a first end coupled to the first cryogenic electronic package 11500 and a second opposing end coupled to the third cryogenic electronic package 13500. Additionally, connector 10510 includes a second connector portion 10512 having a first end coupled to the second cryogenic electronic package 12500 and a second opposing end coupled to the fourth cryogenic electronic package 14500. In embodiments, the first connector portion 10511 includes a plurality of wires extending between the first and second ends of the first connector portion 10511 (e.g., for communicating signals or data between the first and second ends of first connector portion 10511). Additionally, in embodiments the second connector portion 10512 includes a plurality of wires extending between the first and second ends of the second connector portion 10512.

Connector 10510 also includes a plurality of interconnect pads (here, interconnect pads 10513, 10514, 10516, 10517) and a plurality of conductive structures (here, conductive structures 10515, 10518). Interconnect pads 10513, 10514, 10516, 10517 each have first and second opposing surfaces. Additionally, conductive structures 10515, 10518 each have first and second opposing portions.

In the illustrated embodiment, conductive structure 10515 has a first portion (e.g., a first end) coupled to a surface (e.g., a first surface) of interconnect pad 10513. Additionally, conductive structure 10515 has a second opposing portion (e.g., a second end) coupled to a surface (e.g., a first surface) of interconnect pad 10514. Conductive structure 10518 has a first portion (e.g., a first end) coupled to a surface (e.g., a first surface) of interconnect pad 10516. Additionally, conductive structure 10518 has a second opposing portion (e.g., a second end) coupled to a surface (e.g., a first surface) of interconnect pad 10517. Conductive structures 10517, 10518 each extend across respective surfaces 10511a, 10512a of the first and second connector portions 10511, 10511. In embodiments, at least one of conductive structure 10515 and conductive structure 10518 is used to electrically couple the first connector portion 10511 to the second connector portion 10512.

In one embodiment, connector 10510 is multilayer flex connector having superconducting interconnects (10515, 10518). In embodiments, each flex layer 10511a and 10512a of the connector includes at least one uncured and/or partially cured and/or cured superconducting paste filled via which is bonded to create superconducting interconnects (10515, 10518). In one embodiment, the multilayer flex connector is made with a LCP bonding film and LCP high temperature core materials. Additionally, in one embodiment it is possible to use polyimide and acrylic adhesives for the multilayer flex connector. It is further possible to use PTFE based materials for the multi-layer flex connector.

While substrate 1510, 2510, 13510, 14510 of cryogenic electronic packages 11500, 12500, 13500, 14500, respectively, are shown and described as separate substrates in the illustrated embodiment, it is understood that in some embodiments substrates 11500, 12500 and substrates 13510, 14510 may take the form of a single substrate (or other type of semiconductor structure). In embodiments, one of the single substrates may be provided in either the third cryogenic package 13500 or the fourth cryogenic package 14500. Additionally, in embodiments, the single substrates may be provided as part of the cryogenic electronic assembly 10500, but separate from cryogenic electronic packages 11500, 12500, 13500, 14500.

Additionally, while the first and second coupling means take the form of conductive structures (e.g., 501, 10501) in the illustrated embodiment, it is understood that in some embodiments the first and/or second coupling means may take other forms. For example, in one embodiment, one or more of the conductive structures (e.g., 501, 10501) may take the form of a connector (e.g., coupling means 210, shown in FIG. 4).

Further, while the third coupling means takes the form of a connector 10510 in the illustrated embodiment, it is understood that the third coupling means may take the form of other types of connectors in some embodiments. For example, in one embodiment cryogenic electronic assembly 10500 is a rigid-flex cryogenic electronic assembly in which connector 10510 is extended and couples cryogenic electronic package 11500 with cryogenic electronic package 12500 and cryogenic electronic package 13500 with cryogenic electronic package 14500. In another embodiment, a structure (or structures) including connector 10510, interposer 120, interposer 220, superconducting joint structure 11560, superconducting joint structure 12560, interposer 13520, interposer 14520, superconducting joint structure 13560 and superconducting joint structure 14560 are fabricated in parallel and bonded together to produce a rigid-flex cryogenic electronic assembly. In some embodiments, all (or substantially all) of the structures can be bonded using a single lamination process where all (or substantially all) interconnects are uncured and/or partially cured bonded together and cured to create superconducting interconnects.

In one embodiment, cryogenic electronic assembly 10500 represents a cryogenic electronic assembly including a plurality of double sided assembly portions of conventional, superconducting or partially superconducting circuitized substrates (here, a first assembly portion including cryogenic electronic packages 11500, 12500, and a second assembly portion including cryogenic electronic package 13500, 14500).

Figure 6:
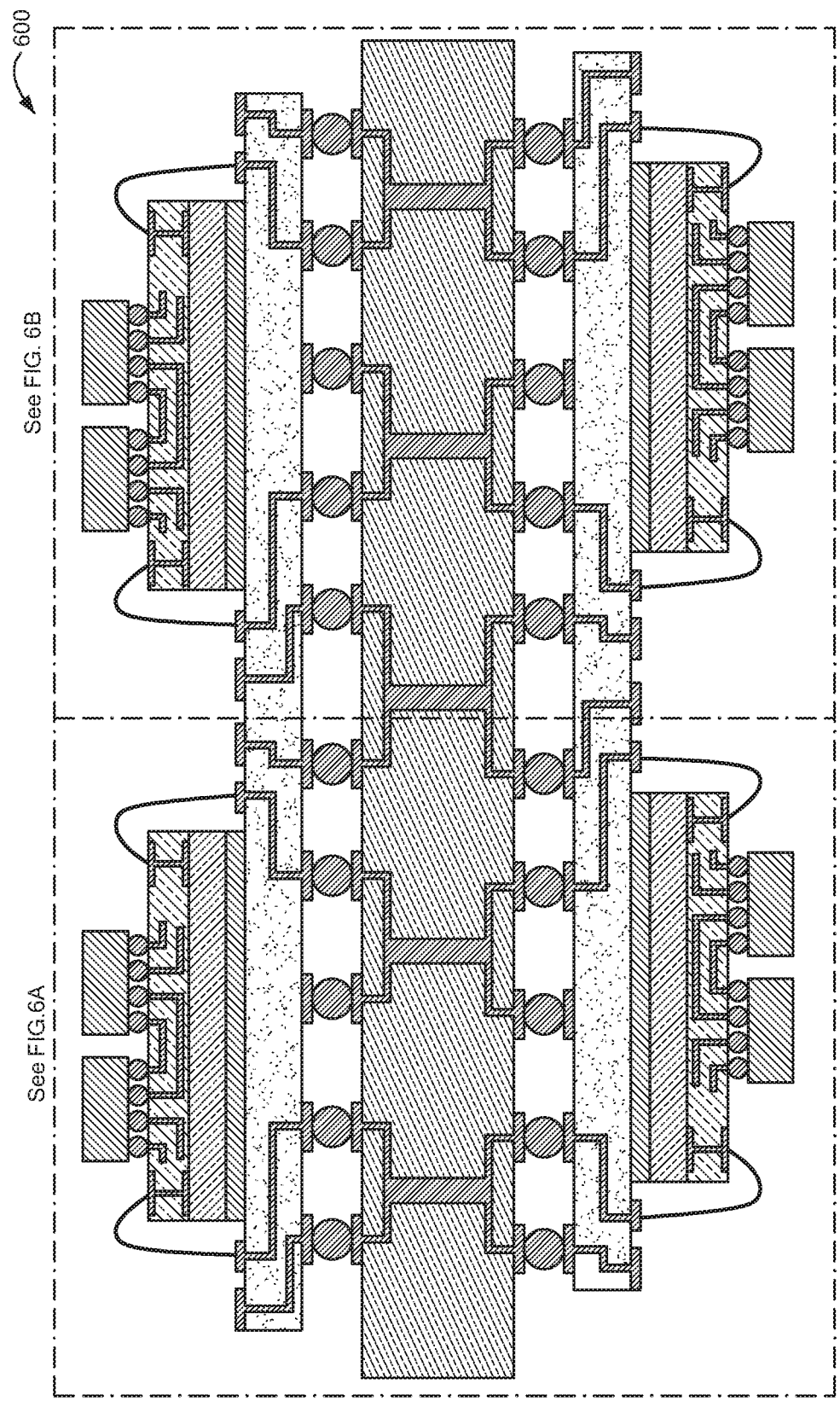
FIGS. 6-6B are block diagrams of further example cryogenic electronic assembly in accordance with an embodiment of the disclosure.
Figure 6A:
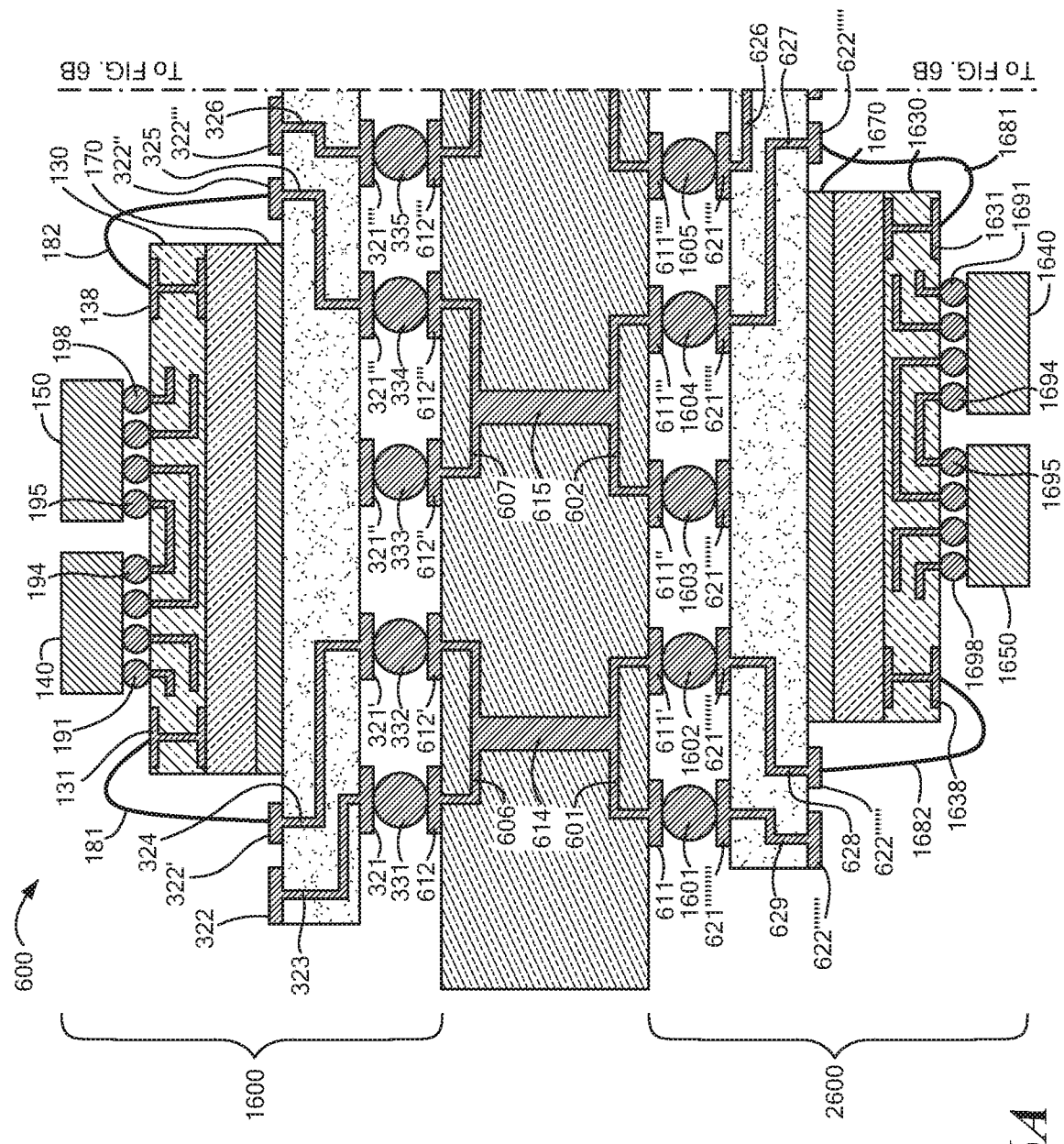
Figure 6B:
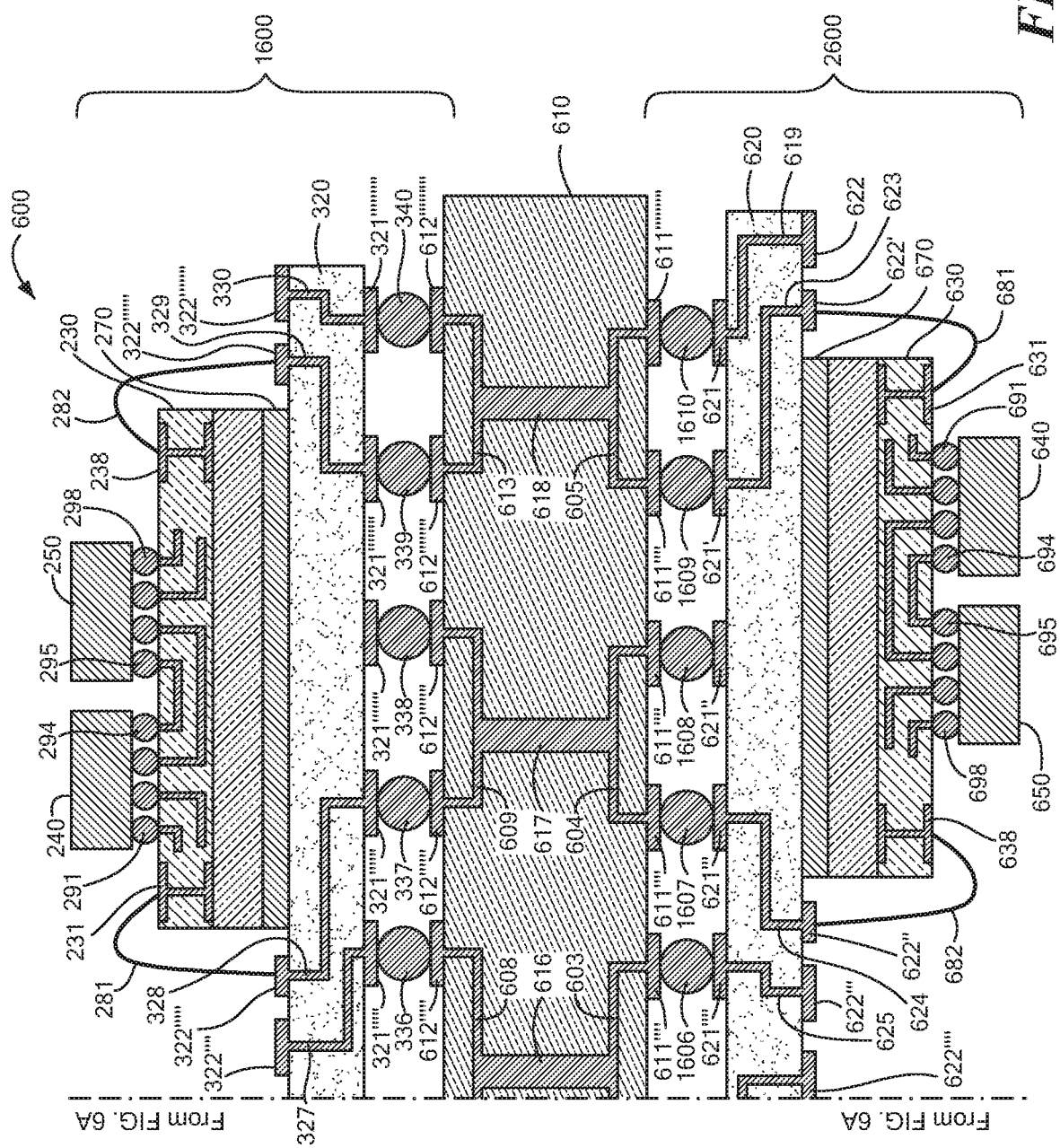

Referring to FIGS. 6-6B, in which like elements of FIG. 3 are shown having like reference designations, another example cryogenic electronic assembly 600 (e.g., a double sided cryogenic electronic assembly with localized SMCM connections) includes a first cryogenic electronic package 1600 and a second cryogenic electronic package 2600. Cryogenic electronic assembly 600 also includes a semiconductor structure 610 (e.g., a substrate) for coupling the first cryogenic electronic package (also referred to herein as "a first cryogenic package") 1600 to the second cryogenic electronic package (also referred to herein as "a second cryogenic package") 2600. As indicated in FIG. 6, a first portion of the cryogenic electronic assembly 600 is shown in more detail in FIG. 6A. Additionally, as indicated in FIG. 6, a second portion of cryogenic electronic assembly 600 is shown in more detail in FIG. 6B.

As illustrated, first cryogenic package 1600 is substantially the same as cryogenic electronic package 300 of FIG. 3 (less substrate 310) and, thus, will not be described in detail again.

Second cryogenic package 2600, which is substantially the same as the first cryogenic package 1600 in the illustrated embodiment, includes a second interposer 620, a third SMCM 630 and third superconducting semiconductor structures 640, 650. Second cryogenic package 2600 additionally includes a fourth SMCM 1630 and fourth superconducting semiconductor structures 1640, 1650.

Second interposer 620 of second cryogenic package 2600 is substantially the same as first interposer 320 of first cryogenic package 1600 in the illustrated embodiment and, thus, will not be described in detail herein. Additionally, third and fourth SMCMs 630, 1630 of second cryogenic package 2600 are substantially the same as first and second SMCMs 130, 230 of first cryogenic package 1600 in the illustrated embodiment and, thus, will not be described in detail herein. Further, superconducting semiconductor structures 640, 650, 1640, 1650 (e.g., SFQ IC's) of second cryogenic package 2600 are substantially the same as superconducting semiconductor structures 140, 150, 240, 250 of first cryogenic package 1600 in the illustrated embodiment and, thus, will not be described in detail herein.

Third SMCM 630 of second cryogenic package 2600 is disposed over and coupled to second interposer 620 through an adhesive layer 670 and wire bonding structures 681, 682. Additionally, third superconducting semiconductor structures 640, 650 are disposed over and coupled to third SMCM 630 through interconnect structures 691, 692, 693, 694, 695, 696, 697, 698.

Additionally, fourth SMCM 1630 of second cryogenic package 2600 is disposed over and coupled to second interposer 620 through an adhesive layer 1670 and wire bonding structures 1681, 1682. Further, fourth superconducting semiconductor structures 1640, 1650 are disposed over and coupled to fourth SMCM 1630 through interconnect structures 1691, 1692, 1693, 1694, 1695, 1696, 1697, 1698.

Second cryogenic package 2600 of cryogenic electronic assembly 600 is coupled to first cryogenic package 1600 of cryogenic electronic assembly 600 through semiconductor structure 610 (e.g., a double sided circuitized substrate). In particular, first cryogenic package 1600 is coupled to a first surface or side of the semiconductor structure 610 (e.g., a conventional, partially superconducting or superconducting circuitized substrate) through interconnect structures 331, 332, 333, 334, 335, 336, 337, 338, 339, 340. Additionally, second cryogenic package 2600 is coupled to a second opposing surface or side of the semiconductor structure 610 through interconnect structures 1601, 1602, 1603, 1604, 1605, 1606, 1607, 1608, 1609, 1610.

The semiconductor structure 610 has first and second opposing surfaces and includes a first plurality of interconnect pads (here, interconnect pads 611, 611', 611", 611''', 611'''', 611''''', 611'''''', 611''''''', 611'''''''', 611''''''''') which are coupled to interconnect structures 1601, 1602, 1603, 1604, 1605, 1606, 1607, 1608, 1609, 1610. Additionally, the semiconductor structure 610 includes a second plurality of interconnect pads (here, interconnect pads 612, 612', 612", 612''', 612'''', 612''''', 612'''''', 612''''''', 612'''''''') which are coupled to interconnect structures 331, 332, 333, 334, 335, 336, 337, 338, 339, 340. The first plurality of interconnect pads 611, 611', 611", 611''', 611'''', 611''''', 611'''''', 611''''''', 611'''''''' each have a surface disposed over or otherwise coupled to selected portions of the first surface of the semiconductor structure 610. Additionally, the second plurality of interconnect pads 612, 612', 612", 612''', 612'''', 612''''', 612'''''', 612''''''', 612'''''''' each have a surface disposed over or otherwise coupled to selected portions of the second surface of the semiconductor structure 610.

In the illustrated embodiment, interconnect pad 611 is electrically coupled to interconnect pad 611' through a conductive structure 601 (e.g., a via), and interconnect pad 611" is electrically coupled to interconnect pad 611''' through a conductive structure 602. Additionally, interconnect pad 611''' is electrically coupled to interconnect pad 611'''' through a conductive structure 603, and interconnect pad 611'''' is electrically coupled to interconnect pad 611''''' through a conductive structure 604. Further, interconnect pad 611'''''' is electrically coupled to interconnect pad 611''''''' through a conductive structure 605.

Additionally, in the illustrated embodiment, interconnect pad 612 is electrically coupled to interconnect pad 612' through a conductive structure 606, and interconnect pad 612" is electrically coupled to interconnect pad 612''' through a conductive structure 607. Additionally, interconnect pad 612''' is electrically coupled to interconnect pad 612'''' through a conductive structure 608, and interconnect pad 612'''' is electrically coupled to interconnect pad 612''''' through a conductive structure 609. Further, interconnect pad 612'''''' is electrically coupled to interconnect pad 612''''''' through a conductive structure 613.

Further, in the illustrated embodiment, conductive structure 601 is coupled to conductive structure 606 through a conductive structure 614, and conductive structure 602 is coupled to conductive structure 607 through a conductive structure 615. Additionally, conductive structure 603 is coupled to conductive structure 608 through a conductive structure 616, and conductive structure 604 is coupled to conductive structure 609 through a conductive structure 617. Further, conductive structure 605 is coupled to conductive structure 613 through a conductive structure 619. In one embodiment, conductive structures 601, 606 are part of single or stacked or staggered vias and/or microvias generated using buildup technology. Additionally, in one embodiment conductive structure 614 can be a through via having a thicker central core than conductive structures 601, 606. In general, conductive structures 601, 606 are smaller than conductive structure 614.

With the above-described arrangement, first and second SMCMs 130, 230 of first cryogenic package 1600 may, for example, be coupled "locally" (i.e., in first cryogenic package 1600) through first interposer 320. Additionally, first superconducting semiconductor structures 140, 150 (e.g., SFQ IC's) may be "locally" coupled to second superconducting semiconductor structures 240, 250 (e.g., SFQ IC's) through first SMCM 130, first interposer 320 and second SMCM 230.

Further, with the above-described arrangement, first and second SMCMs 130, 230 of first cryogenic package 1600 may be coupled to third and fourth SMCMs 630, 1630 of second cryogenic package 2600 through first interposer 320 of first cryogenic package 1600, semiconductor structure 610, and second interposer 620 of second cryogenic structure 2600. Additionally, first superconducting semiconductor structures 140, 150 of first cryogenic package 1600 may be coupled to fourth superconducting semiconductor structures 1640, 1650 (e.g., SFQ IC's) of second cryogenic package 2600 through first interposer 320 and first SMCM 130 of first cryogenic package 1600, semiconductor structure 610, and second interposer 620 and fourth SMCM 630 of second cryogenic package 2600. It is understood that other coupling arrangements are, of course, possible. In one embodiment, semiconductor structure 610 represents a double sided assembly of a circuitized substrate or a superconducting circuitized substrate. In the illustrated embodiment, semiconductor structure 610 (e.g., a circuitized substrate) is larger than interposer 320 and interposer 620. In some embodiments, at least part of the semiconductor structure has pads attachable to a connector of another substrate or board (e.g., a backplane board or mother board).

Figure 7:
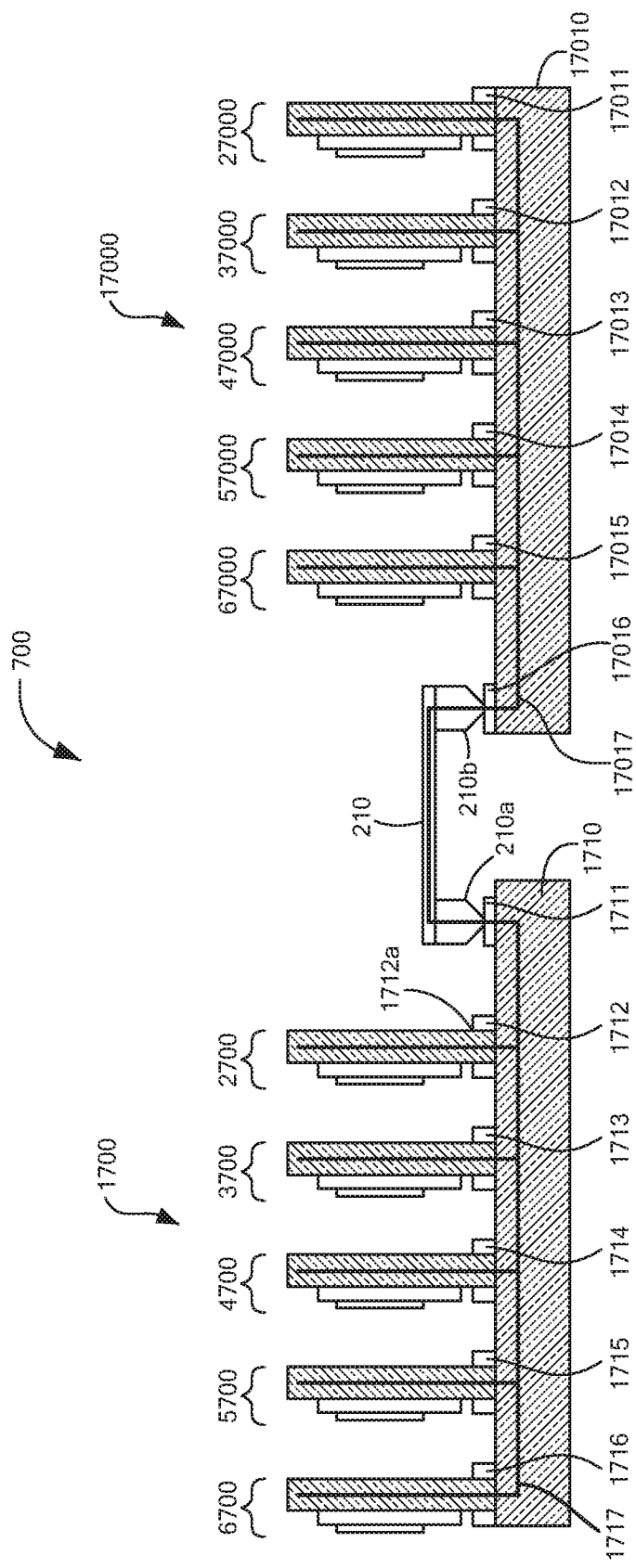
FIGS. 7-7B are block diagrams of further example cryogenic electronic assemblies in accordance with an embodiment of the disclosure.

Referring to FIG. 7, an example cryogenic electronic assembly 700 according to the disclosure is shown. The cryogenic electronic assembly 700 includes a plurality of so-called "vertically assembled package structures" (here, vertically assembled packaged structures 1700, 17000). The cryogenic electronic assembly 700 also includes coupling means 210 for coupling first vertically assembled package structure (also referred to herein as "first sub-assembly or daughter package") 1700 to second vertically assembled package structure (also referred to herein as "second sub-assembly or daughter package") 17000.

First sub-assembly 1700 includes a first semiconductor and/or superconducting and/or conventional metal circuitized substrate structure 1710 (e.g., a PCB or backplane board) and a first plurality of cryogenic electronic packages (here, cryogenic electronic packages 2700, 3700, 4700, 5700, 6700).

The first semiconductor structure 1710 has first and second opposing surfaces and includes an interconnect pad 1711 and a plurality of connectors (here, connectors 1712, 1713, 1714, 1715, 1716) or sockets. The first semiconductor structure 1710 also includes a conductive structure 1717 (e.g., a via) for electrically coupling the interconnect pad 1711 to one or more (here, each) of the connectors 1712, 1713, 1714, 1715, 1716.

Interconnect pad 1711 and connectors 1712, 1713, 1714, 1715, 1716 each have a surface disposed on or otherwise coupled to a surface (e.g., a first surface) of semiconductor structure 1710. Additionally, conductive structure 1717 is disposed between the first and second surfaces of the semiconductor structure 1710 and is electrically coupled to the connectors 1712, 1713, 1714, 1715, 1716 and the interconnect pad 1711.

The connectors 1712, 1713, 1714, 1715, 1716 (e.g., conventional or miniaturized connectors) are each shaped to receive a respective one of the cryogenic electronic structures 2700, 3700, 4700, 5700, 6700, each of which may be the same as or similar to cryogenic electronic structures described above in connection with figures above (e.g., 100, shown in FIG. 1). In the illustrated embodiment, the cryogenic electronic packages 2700, 3700, 4700, 5700, 6700 are each single sided cryogenic electronic packages (e.g., electronic packages having a single sided substrate on which one or more interposers, SMCMs and superconducting semiconductor structures are disposed). Cryogenic electronic package 100 shown in FIG. 1 and cryogenic electronic packages 2700 and/or 67000 shown in FIG. 7 may be substantially the same, for example, in embodiments in which cryogenic electronic package 100 has an additional pad attachable to a connector (e.g., 1712).

The connectors 1712, 1713, 1714, 1715, 1716 are also configured to couple the cryogenic electronic packages 2700, 3700, 4700, 5700, 6700 to conductive structure 1717 (e.g., for sharing of signals or data between the cryogenic electronic packages 2700, 3700, 4700, 5700, 6700).

In the illustrated embodiment, the connectors 1712, 1713, 1714, 1715, 1716 have a cavity or opening (e.g., 1712a)

shaped to receive the cryogenic electronic packages 2700, 3700, 4700, 5700, 6700. Additionally, in the illustrated embodiment, the connectors 1712, 1713, 1714, 1715, 1716 each have a portion coupled to the conductive structure 1717 and to the cryogenic electronic packages 2700, 3700, 4700, 5700, 6700 such that the cryogenic electronic packages 2700, 3700, 4700, 5700, 6700 may be coupled to conductive structure 1717. It is understood that other means for receiving and coupling the cryogenic electronic packages 2700, 3700, 4700, 5700, 6700 to the conductive structure 1717 are, of course, possible.

Second sub-assembly 17000, which is similar to the first sub-assembly 1700 in the illustrated embodiment, includes a second semiconductor structure 17010 (e.g., a PCB) and a second plurality of cryogenic electronic packages (here, cryogenic electronic packages 27000, 37000, 47000, 57000, 67000).

The semiconductor structure 17010 has first and second opposing surfaces and includes an interconnect pad 17011 and a plurality of connectors (here, connectors 17012, 17013, 17014, 17015, 17016). The semiconductor structure 17010 also includes a conductive structure 17017 for electrically coupling the interconnect pad 17016 to one or more (here, each) of the connectors 17011, 17012, 17013, 17014, 17015.

Interconnect pad 17011 and connectors 17011, 17012, 17013, 17014, 17015 each have a surface disposed over or otherwise coupled to a surface (e.g., a first surface) of semiconductor structure 17010. Additionally, conductive structure 17017 is disposed between the first and second surfaces of the semiconductor structure 17010 and is electrically coupled to the connectors 17012, 17013, 17014, 17015, 17016 and the interconnect pad 17011.

The second sub-assembly 17000 is coupled to the first sub-assembly 1700 through coupling means 210 (e.g., to form a daisy chain type cryogenic electronic assembly 700). In particular, coupling means 210 has a first portion 210a (e.g., a first end) coupled to first sub-assembly 1700 (here, interconnect pad 1711 of semiconductor structure 1710). Additionally, coupling means 210 has a second opposing portion 210b (e.g., a second opposing end) coupled to second sub-assembly 17000 (here, interconnect pad 17016 of semiconductor structure 17010).

With the above-described arrangement, one or more of the cryogenic electronic packages (e.g., 2700) of the first sub-assembly 1700 may be electrically coupled to one or more of the cryogenic electronic packages (e.g., 27000) of the second sub-assembly 17000.

While cryogenic electronic assembly 700 is shown as including two sub-assemblies 1700, 17000 in the illustrated embodiment, it is understood that the cryogenic electronic assembly 700 may include more than two sub-assemblies in some embodiments. For example, in some embodiments the cryogenic electronic assembly 700 may include three (or more) sub-assemblies, with the sub-assemblies (and the cryogenic electronic packages of the sub-assemblies) coupled together through a plurality of coupling means (e.g., 210).

Additionally, while semiconductor structure 1710 of cryogenic electronic assembly 700 is shown as substantially flat in the illustrated embodiments, it is understood that the semiconductor structure 1710 can take a variety of shapes and forms. For example, in one embodiment, the semiconductor structure 1710 may have a substantially cylindrical shape (e.g., as may be suitable for the cryogenic electronic chamber in which the cryogenic electronic assembly 700 may be provided).

Further, while cryogenic electronic assembly 700 is shown as including single sided cryogenic electronic packages in the illustrated embodiment, it is understood that cryogenic packaging assemblies according to the disclosure may include single and/or double sided cryogenic electronic packages. An example cryogenic electronic assembly including double sided cryogenic electronic packages is shown in FIG. 7A, for example.

Figure 7A:
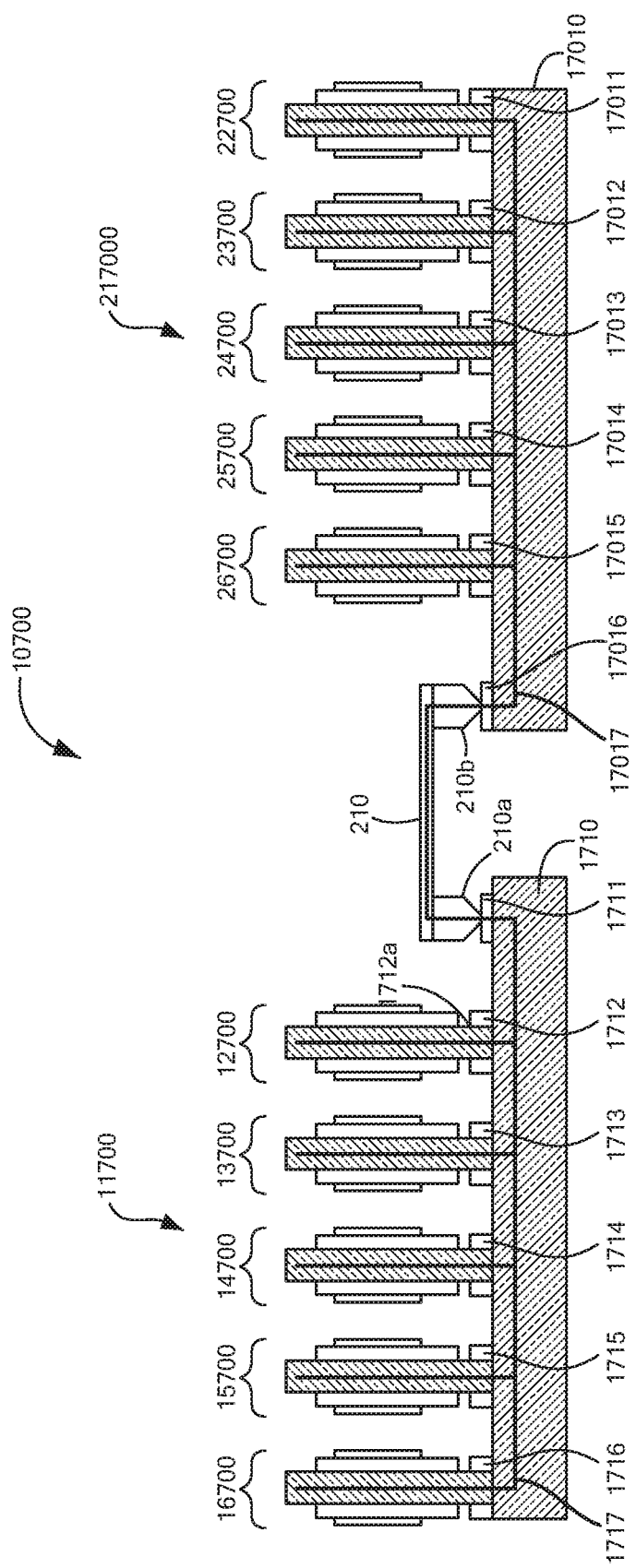

Referring to FIG. 7A, in which like elements of FIG. 7 are shown having like reference designations, another example cryogenic electronic assembly 10700 includes sub-assemblies 11700, 21700. The cryogenic electronic assembly 10700 also includes coupling means 210 for coupling sub-assembly 11700 to sub-assembly 21700.

First sub-assembly 11700 includes first semiconductor structure 1710 and a first plurality of cryogenic electronic packages (here, cryogenic electronic packages 12700, 13700, 14700, 15700, 16700). Each of the cryogenic electronic packages 12700, 13700, 14700, 15700, 16700 is a double sided cryogenic electronic package in the illustrated embodiment (e.g., electronic packages having a double sided substrate on which one or more interposers, SMCMs and superconducting semiconductor structures are disposed). Additionally, each of the cryogenic electronic packages 12700, 13700, 14700, 15700, 16700 is received in a respective connector (e.g., 1712) of the first semiconductor structure 1710.

Additionally, second sub-assembly 21700 includes a second semiconductor structure 17010 and a second plurality of cryogenic electronic structures (here, cryogenic electronic structures 22700, 23700, 24700, 25700, 26700). Each of the cryogenic electronic packages 22700, 23700, 24700, 25700, 26700 is a double sided cryogenic electronic package in the illustrated embodiment. Additionally, each of the cryogenic electronic packages is received in a respective connector (e.g., 17011) of the second semiconductor structure 17010.

Cryogenic electronic packages 12700, 13700, 14700, 15700, 16700 of first sub-assembly 11700 are coupled together through conductive structure 1717. Additionally, cryogenic electronic packages 22700, 23700, 24700, 25700, 26700 of second sub-assembly 21700 are coupled together through conductive structure 17017.

Additionally, second sub-assembly 21710 is coupled to the first sub-assembly 11700 through coupling means 210. Further, one or more of the cryogenic electronic packages 12700, 13700, 14700, 15700, 16700 of first sub-assembly 11700 may be coupled to one or more of the cryogenic electronic packages 22700, 23700, 24700, 25700, 26700 of second sub-assembly 21700 through coupling means 210.

In one embodiment, one part of cryogenic electronic assembly 700 (e.g., sub-assembly 17000) operates at temperatures in a millikelvin temperature zone or range and another part of cryogenic electronic assembly 700 (e.g., sub-assembly 1700) operates at temperatures of about 4.2 kelvin or above. In such embodiment, both part of the cryogenic electronic assembly (e.g., sub-assemblies 1700 & 17000) are connected or otherwise coupled with optical and/or electrical and/or RF cables (e.g., connector 210) that experiences temperature gradients during operation.

In some embodiments, the part of cryogenic electronic assembly 700 (e.g., sub-assembly 17000) which operates at temperatures in a millikelvin temperature zone may include Qubit and/or SFQ and/or CMOS based chips. Additionally, in some embodiment the other part of the cryogenic electronic assembly 700 (e.g., sub-assembly 1700) that operates at temperatures of about 4.2 kelvin or above may include CMOS and/or photonics and/or SFQ based chips.

In another embodiment, cryogenic electronic assembly 700 is a rigidflex structure where sub-assemblies 1700 and 17000 are rigid parts of the cryogenic electronic assembly 700 and structure 1710 of sub-assembly 700 and structure 17010 of sub-assembly 17000 are flex connected rigid parts of the rigidflex structure.

In a further embodiment, one part of cryogenic electronic assembly 700 (e.g., sub-assembly 17000) operates at temperatures of about 4.2 kelvin (e.g., in liquid helium temperature zone(s)) and other parts of cryogenic electronic assembly 700 (e.g., sub-assembly 1700) operates at temperatures below about 77 kelvin (e.g., in liquid nitrogen temperature zone(s)). In such embodiment, both parts of the cryogenic electronic assembly 700 (e.g., sub-assembly 1700 & sub-assembly 17000) may be connected with optical and/or electrical and/or RF cables (e.g., connector 210) that experiences temperature gradients during operation.

In some embodiments, the part of cryogenic electronic assembly 700 (e.g., sub-assembly 17000) which operates at liquid helium temperature zones includes CMOS and/or phonics and/or SFQ based chips and the other part of cryogenic electronic assembly 700 (e.g., sub-assembly 1700) that operates at liquid nitrogen temperature zones includes CMOS and/or photonics chips.

In another embodiment, cryogenic electronic assembly 700 can further include a third part (not shown) which operates at room temperature (RT) and/or above temperature zones of the first and second parts. The third part can connect or otherwise couple with sub-assembly 1700 using an optical and/or electrical and/or RF cable which experience thermal gradients during operation.

In some embodiments, parts of cryogenic electronic assembly 700 (e.g., sub-assembly 17000) which operates at liquid helium temperature zones include CMOS and/or phonics and/or SFQ based chips. Additionally, in some embodiments the other parts of cryogenic electronic assembly 700 (e.g., sub-assembly 1700) that operates at room temperature or above includes CMOS and/or photonics chips. In one embodiment, at least part of cryogenic electronic assembly 700 can be replaced with part of cryogenic electronic assembly 10700 shown in FIG. 7A. It is understood that other combinations of cryogenic electronic assemblies and packages according to the disclosure are also possible combinations.

Figure 7B:
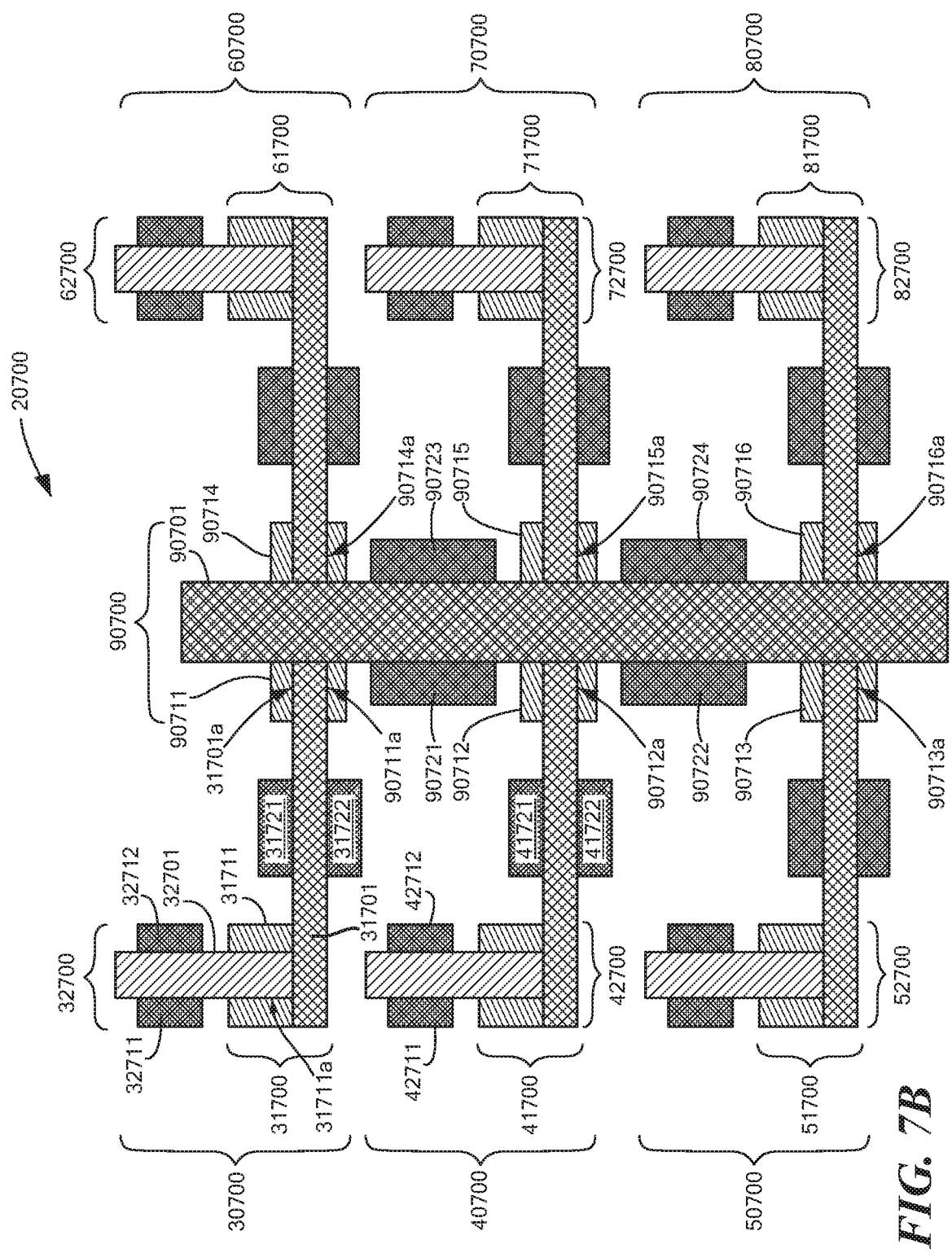

Referring to FIG. 7B, another example cryogenic electronic assembly 20700 includes a plurality of sub-assemblies or daughter packages (here, sub-assemblies 30700, 40700, 50700, 60700, 70700, 80700) and a coupling means (here, a double sided assembled substrate or PCB structure 90700) for coupling selected ones of-the sub-assemblies 30700, 40700, 50700, 60700, 70700, 80700 together.

In the illustrated embodiment, sub-assembly 30700 of cryogenic electronic assembly 20700 includes a superconducting and/or conventional metal semiconductor structure 31700 and a cryogenic electronic package 32700.

Semiconductor structure 31700 of sub-assembly 30700 includes a superconducting and/or conventional metal circuitized substrate 31701 (e.g., a PCB) and a connector or socket 31711. In one embodiment, substrate or PCB 31701 is physically larger than substrate or PCB 32701 and includes a greater number of layers (e.g., substrate or PCB layers) compared to substrate 32701. Semiconductor structure 31700 also includes a plurality of wirebondable or flip-chip components (here, components 31721, 31722). In one embodiment, substrate 90701 (as will be further discussed below) is a back-plane board, substrate 31701 is a mother board and substrate 32701 is a circuit card.

Connector 31711, which may be the same as or similar to connectors described in connection with figures above (e.g., 1716, shown in FIG. 7A) in some embodiments, has a surface disposed over or otherwise coupled to a respective surface or side (e.g., a first surface) of substrate 31701. Additionally, connector 31711 has a cavity or opening 31711a shaped to receive a respective portion (e.g., a connector portion) of cryogenic electronic package 32700 of sub-assembly 30700.

Component 31721 (e.g., an SMCM) has a surface disposed over a first respective surface (e.g., a first surface) of the substrate 31701. Additionally, component 31722 has a surface disposed over a second respective surface (e.g., a second opposing surface) of the substrate 31701.

In some embodiments, components 31721, 31722 (and components 32711, 32712, 90721, 90721, 90722, 90723, 90724, etc. discussed below) include one or more interposers, SMCMs and/or superconducting semiconductor structures similar to interposer 120, SMCM 130 and superconducting semiconductor structures 140, 150 shown in FIG. 5A, for example. An example advantage of using these types of structures is to increase system complexity while at the same time maintaining reworkability and repairability. Another example advantage is to increase system complexity while at the same time allowing liquid helium or exchange gases to flow in cryogenic electronic assembly 20700 and maintain temperatures of about 4K for the superconducting components (sometimes, all or substantially all of the superconducting components) during system operation.

Cryogenic electronic package 32700 of sub-assembly 30700, which may be the same as or similar to cryogenic electronic packages described in connection with figures above (e.g., 100, shown in FIG. 1) in some embodiments, is a double sided cryogenic electronic package in the illustrated embodiment. Cryogenic electronic package 32700 includes a substrate 32701 (e.g., a PCB) and one or more first wirebondable or flip-chip components 32711 (e.g., SMCMs) disposed over a first side or surface of the substrate 32701. Additionally, cryogenic electronic package 32700 includes one or more second wirebondable or flip-chip components 32712 (e.g., SMCMs) disposed over a second opposing side or surface of the substrate 32701.

In some embodiments, substrate 31701 of sub-assembly 30700 includes one or more conductive structures (e.g., vias) (not shown) disposed between the first and second surfaces of the substrate 31701. The conductive structures, which may be similar to conductive structure 1717 shown in FIG. 7A, for example, may be electrically coupled to the connector 31711 and to the components 31721, 31722 disposed over the respective surfaces of the substrate 31701. In embodiments, the conductive structures may be used to electrically couple one or more portions of cryogenic electronic package 32700 (e.g., component 32711 of cryogenic electronic package 32700) to at least one of components 31721, 31722. Additionally, in embodiments the conductive structures may be used to electrically couple one or more portions of cryogenic electronic package 32700 (e.g., component 32711 of cryogenic electronic package 32700) and/or at least one of components 31721, 31722 of sub-assembly 30700 to substrate structure 90700.

Sub-assemblies 40700, 50700, 60700, 70700, 80700, which are substantially the same as sub-assembly 30700 in the illustrated embodiment, each include a respective superconducting and/or conventional metal semiconductor structure (here, semiconductor structures 41700, 51700, 61700, 71700, 81700, respectively). Additionally, sub-assemblies

40700, 50700, 60700, 70700, 80700 each include a respective cryogenic electronic package (here, cryogenic electronic packages 42700, 52700, 62700, 72700, 82700, respectively).

Semiconductor structures 41700, 51700, 61700, 71700, 81700 of sub-assemblies 40700, 50700, 60700, 70700, 80700 are substantially the same as semiconductor structure 31700 of sub-assembly 30700 in the illustrated embodiment and, thus, will not be described in detail herein. Additionally, cryogenic electronic packages 42700, 52700, 62700, 72700, 82700 of sub-assemblies 40700, 50700, 60700, 70700, 80700 are substantially the same as cryogenic electronic package 32700 of sub-assembly 30700 in the illustrated embodiment and, thus, will not be described in detail herein.

Substrate structure 90700 of cryogenic electronic assembly 20700 includes a conventional and/or superconducting circuitized substrate 90701 (e.g., a PCB) and a plurality of connectors (here, connectors 90711, 90712, 90713, 90714, 90715, 90716). In the illustrated embodiment, connectors 90711, 90712, 90713 each have a surface disposed on or otherwise coupled to a first respective surface (e.g., a first surface) of the substrate 90701. Additionally, in the illustrated embodiment connectors 90714, 90715, 90716 each have a surface disposed on or otherwise coupled to a second respective surface (e.g., a second opposing surface) of the substrate 90701. Similar to connector 31711 of sub-assembly 30700, connectors 90711, 90712, 90713, 90714, 90715, 90716 of substrate structure 90700 each have a respective cavity or opening (here, openings 90711a, 90712a, 90713a, 90714a, 90715a, 90716a). Here, however, the openings 90711a, 90712a, 90713a, 90714a, 90715a, 90716a are each shaped to receive a respective portion (e.g., a connector portion) of a sub-assembly (e.g., sub-assembly 32700).

In embodiments, connectors 90711, 90712, 90713, 90714, 90715, 90716 of substrate structure 90700 (and connectors of structures described in figures above and below) are spaced apart from each other by a predetermined distance (or predetermined distances). The predetermined distance(s) of the spaces between the connectors (e.g., 90711, 90712) may be selected, for example, to maintain cryogenic temperatures among superconducting circuits (sometimes, all or substantially all superconducting circuits) of cryogenic electronic assembly 20700. Additionally, the predetermined distance(s) of the spaces may be selected to allow for exchange gas flow within the circuits and maintain temperatures of about 4K among the circuits.

Substrate structure 90700 also includes a plurality of wirebondable or flip-chip components (here, components 90721, 90722, 90723, 90724) disposed over selected portions or surfaces (e.g., first and/or second surfaces) of the Substrate structure 90700. In some embodiments, components 90721, 90722, 90723, 90724 may be the same as or similar to components 32711, 32712 of sub-assembly 30700, for example.

In the illustrated embodiment, sub-assemblies 30700, 40700, 50700, 60700, 70700, 80700 (e.g., connector portions of the sub-assemblies) are each received in and coupled (e.g., removably or fixedly coupled) to a respective one of the substrate structure connectors 90711, 90712, 90713, 90714, 90715, 90716.

With the above-described arrangement, substrate structure 90700 may couple selected ones of the sub-assemblies 30700, 40700, 50700, 60700, 70700, 80700 together. Additionally, with the above-described arrangement, substrate structure 90700 may couple selected portions of the sub-assemblies 30700, 40700, 50700, 60700, 70700, 80700 together. For example, in the illustrated embodiment substrate structure 90700 may couple selected cryogenic electronic packages (e.g., 32700, 42700) of the sub-assemblies (e.g., 30700, 40700) together (e.g., for sharing of signals or data between the cryogenic electronic packages). Additionally, in the illustrated embodiment substrate structure 90700 may couple selected wirebondable or flip-chip components (e.g., 31721, 41721) of the sub-assemblies (e.g., 30700, 40700) together (e.g., for sharing of signals or data between the components).

While sub-assemblies 30700, 40700, 50700, 60700, 70700, 80700 are shown and described as including one cryogenic electronic package (e.g., cryogenic electronic package 32700) in the illustrated embodiment, it should be appreciated that at least one of the sub-assemblies 30700, 40700, 50700, 60700, 70700, 80700 may include more than one cryogenic electronic package in some embodiments. For example, in one embodiment sub-assembly 30700 may include five sub-assemblies, similar to sub-assembly 11700 described above in connection with FIG. 7A.

Additionally, while sub-assemblies 30700, 40700, 50700, 60700, 70700, 80700 are shown and described as being substantially the same in the illustrated embodiment, it should be appreciated that sub-assemblies 30700, 40700, 50700, 60700, 70700, 80700 may be different from each other in some embodiments. For example, in one embodiment sub-assembly 30700 may be different from sub-assembly 40700. As one example, sub-assembly 30700 may include double sided cryogenic electronic packages (e.g., 32700, shown in FIG. 7B) while sub-assembly 40700 includes single sided cryogenic electronic packages (e.g., 6700, shown in FIG. 7).

In one embodiment, cryogenic electronic assembly 20700 shows a concept of breaking a relatively cold (e.g., liquid He) portion of a superconducting computing system into a large SMCM plus a high-density circuit card-high density interconnect (HDI) board and backplane board construction. This configuration offers many advantages. For example, in embodiments microbumps are fabricated on superconducting MCMs in the cryogenic electronic assembly, allowing assemblers of the SMCMs to select the best possible superconducting die and components from various suppliers. Additionally, there is potential for testing each superconducting SMCM before and after final assembly to the circuit card. In embodiments, only "known good" SMCM and circuit cards are used in the final assembly of the cryogenic electronic assembly 20700. Additionally, in embodiments it is possible to replace individual superconducting chips and at least one of the SMCMs. The technique is particularly well suited to high-end products where components, dies, and packaging are expensive and repair or rework is economically viable. Part of the cryogenic electronic assembly or package, if necessary, can be replaced or repaired, or even upgraded without compromising the overall electrical performance. In one aspect of the disclosure, such illustrates that the described approaches will be economical for exascale electronics, since a damaged, non-functional part of the assembly or package can be selectively removed and replaced.

Additionally, in embodiments smaller pitch cryogenic assemblies and packages are attainable using microbumps, for example. Space saving is one of the important advantages when a system operates at cryogenic temperatures. In some embodiments, PCBs or substrates 32701, 31701 and 90701, for example, can be HDI boards. Using fan-out approaches, the substrates 32701, 31701 and 90701 can accommodate a large number of SMCMs and components. For example, a double sided component assembly has been found to save up to 50% of HDI board space. An HDI board combined with rigid-flex technology can remove additional connectors and minimize the number of individual isolated wires at the cryostat interface to connect with the next level of semiconducting electronics. Vertical assembly of a high density circuit cards (e.g., 32701) may provide spacing between two assembled HDI boards (e.g., 30700 and 40700 or 40700 and 50700) for liquid helium flow during system operation.

In one embodiment, all (or substantially all) of the above-described components (e.g., 31721, 32711, 32712, 90721, 90721, 90722, 90723, 90724) of cryogenic electronic assembly 20700 include one or more interposers, SMCMs, and/or superconducting semiconductor structures. Additionally, in one embodiment all (or substantially all) of the above-described components of cryogenic electronic assembly 20700 use connectors (e.g., 31711, 90711, 90712, 90713, 90714, 90715, etc.) to replace and/or repair individual components, circuit cards and/or high density interconnect (HDI) boards. In one embodiment, the connectors can be through hole connectors and/or surface mount connectors. An example advantage of using these types of structures is to increase system complexity while at the same time maintaining reworkability, repairability, and upgradability. Another example advantage of using these types of structures is to increase system complexity while at the same time allowing liquid helium or exchange gases to flow and maintain temperatures of about 4 k for the superconducting components (sometimes, all of the superconducting components) during system operation.

Figure 8:
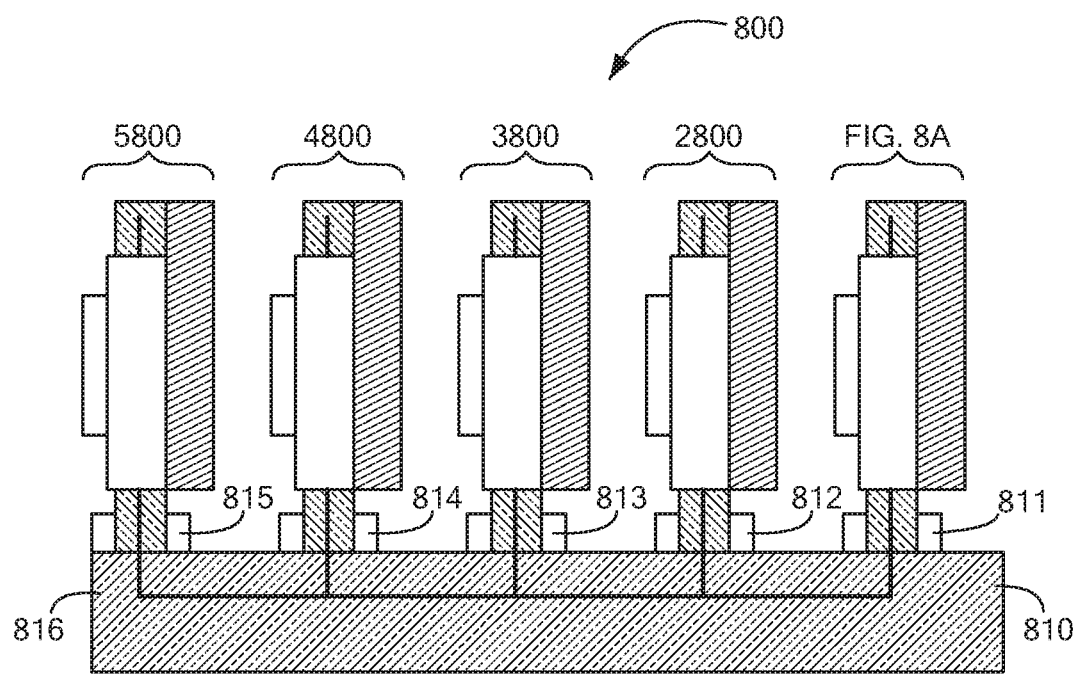
FIG. 8 is a block diagram of further example cryogenic electronic assembly in accordance with an embodiment of the disclosure.

Referring to FIG. 8, a further example cryogenic electronic assembly 800 takes the form of a sub-assembly and includes a semiconductor structure 810 and a plurality of cryogenic electronic packages (here, cryogenic electronic packages 1800, 2800, 3800, 4800, 5800) in the illustrated embodiment.

The semiconductor structure 810 (e.g., a PCB or backplane board) has first and second opposing surfaces and includes a plurality of connectors (here, connectors 811, 812, 813, 814, 815). The semiconductor structure 810 also includes a conductive structure 816 (e.g., a via) for electrically coupling the connectors 811, 812, 813, 814, 815 to each other. In embodiments, the connectors 811, 812, 813, 814, 815 and the conductive structure 816 are the same as or similar to connectors 1712, 1713, 1714, 1715, 1716 and conductive structure 1717 shown in FIG. 7, for example.

The connectors 811, 812, 813, 814, 815 are each disposed on the first surface of the semiconductor structure 810 and shaped to receive a respective one of the cryogenic electronic packages 1800, 2800, 3800, 4800, 5800.

Figure 8A:
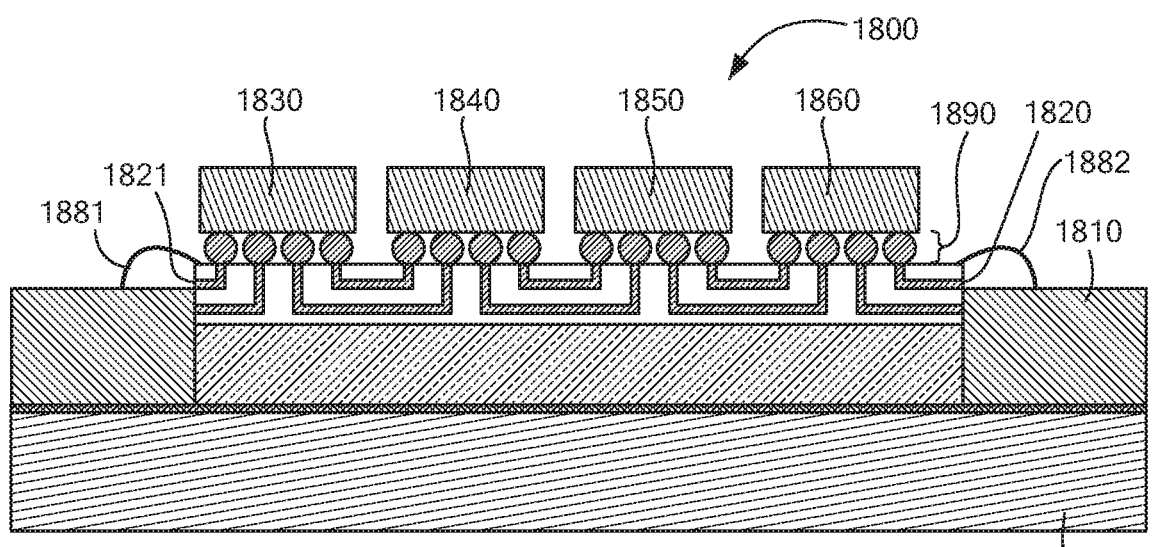
FIG. 8A is a block diagram of an example cryogenic electronic package that may be used in the cryogenic electronic assembly of FIG. 8, for example.

Referring also to FIG. 8A, an example cryogenic electronic package 1800 that may be used in the cryogenic electronic assembly 800 of FIG. 8, for example, includes a substrate 1810 and an SMCM 1820. Cryogenic electronic package 1800 also includes a plurality of superconducting semiconductor structures (here, superconducting semiconductor structures 1830, 1840, 1850, 1860) and a heat dissipation structure 1870.

Substrate 1810 (e.g., a conventional non-superconducting circuitized substrate) has first and second opposing surfaces and includes one or more electrical connections disposed between the first and second surfaces. Additionally, SMCM 1820 has first and second opposing surfaces and includes one or more electrical connections (e.g., 1821) disposed between the first and second surfaces. SMCM 1820 is embedded in a selected portion of substrate 1810 in the illustrated embodiment. In embodiments, SMCM 1820 is attached or otherwise coupled to heat dissipation structure 1870. For example, in one embodiment circuitized substrate or superconducting circuitized substrate 1810 of structure 1800 has a thermal through filled or unfilled via attached or otherwise coupled to the heat dissipation structure 1870, and SMCM 1820 is coupled to the heat dissipation structure 1870 through the substrate 1810.

Superconducting semiconductor structures 1830, 1840, 1850, 1860 (e.g., SFQ ICs) each have first and second opposing surfaces, with the first surfaces of the semiconductor structures 1830, 1840, 1850, 1860 disposed over the second surface of SMCM 1820.

In the illustrated embodiment, SMCM 1820 is coupled to substrate 1810 through wire bonding structures 1881, 1882. Additionally, superconducting semiconductor structures 1830, 1840, 1850, 1860 are coupled to SMCM 1820 through interconnect structures 1890. Each of the interconnect structures 1890 is coupled to a respective one of the electrical connections (e.g., 1821) provided in the second semiconductor structure 1820. In embodiments, the wire bonding structures 1881, 1882 are superconducting wire bonding structures. Additionally, in embodiments, the interconnect structures 1890 are superconducting interconnect structures.

Heat dissipation structure 1870 (e.g., a heat sink device or cold pate), which may be the same as or similar to heat dissipation structure 1220 of FIG. 2, for example, has a surface (e.g., a second surface) which is disposed beneath and thermally coupled to the first surface of substrate 1810. In some embodiments, the heat dissipation structure 1870 is directly coupled to the substrate 1810, as shown. In other embodiments, a thermal interface structure or material, which may be the same as or similar to thermal interface structure 1230 of FIG. 2, may be disposed between the heat dissipation structure 1870 and the first surface of substrate 1810. In some embodiments, SMCM 1820 is substantially directly attached or otherwise coupled to heat dissipation structure 1870 or SMCM 1820 is coupled to heat dissipation structure 1870 using cryogenically stable thermal interface materials. Such coupling arrangements may enhance cooling efficiency of SMCM 1820 through the heat dissipation structure 1870. Furthermore, in some embodiments by disposing SMCM 1820 within a circuitized substrate 1810 opening, as illustrated, mechanical stability of SMCM 1820 may be improved during system operation.

In the illustrated embodiment, superconducting semiconductor structures 1830, 1840 are shown as SFQ ICs. Additionally, superconducting semiconductor structures 1850, 1860 are shown as CMOS ICs. However, it is understood that the superconducting semiconductor structures 1830, 1840, 1850, 1860 may take the form of other types of superconducting semiconductor structures than that which are shown. For example, in embodiments superconducting semiconductor structures 1830, 1840, 1850, 1860 can be qubit ICs and/or photonic ICs. It is further possible for superconducting semiconductor structures 1830, 1840, 1850, 1860 to include a combination of superconducting chips and optical chips having electrical and optical connections. In one embodiment, superconducting semiconductor structures 1830, 1840, 1850, 1860 include IGBT chips and optical chips having electrical and optical connections.

In embodiments, it may also be possible to integrate multiple systems/devices requiring deferent operating environments. In one embodiment, superconducting semiconductor structures 1830, 1840, 1850, 1860 can be integrated with room temperate sensors (or other active devices) using one or more electrical and/or optical interconnects. Optical interconnects may provide for performance improvements in relatively high density circuits, for example.

Returning to FIG. 8, connectors 811, 812, 813, 814, 815 on semiconductor structure 810 are configured to receive and couple (or otherwise attach) the cryogenic electronic packages 1800, 2800, 3800, 4800, 5800 to conductive structure 816 (e.g., for sharing of signals or data between the cryogenic electronic packages 1800, 2800, 3800, 4800, 5800).

In some embodiments, cryogenic electronic packages 2800, 3800, 4800, 5800 are the same as or similar to cryogenic electronic package 1800 shown in FIG. 8A, e.g., including heat dissipation structures (e.g., 1870) for efficient heat dissipation. In other embodiments, at least one of cryogenic electronic packages 2800, 3800, 4800, 5800 may are different from cryogenic electronic package 1800. For example, at least one of cryogenic electronic packages 2800, 3800, 4800, 5800 may be a single sided cryogenic electronic package, while remaining ones of the cryogenic electronic packages 2800, 3800, 4800, 5800 may be double sided cryogenic electronic packages.

As described above and as will be appreciated by those of ordinary skill in the art, embodiments of the disclosure herein may be configured as a system, method, or combination thereof. Accordingly, embodiments of the present disclosure may be comprised of various means including hardware, software, firmware or any combination thereof.

Having described preferred embodiments, which serve to illustrate various concepts, structures and techniques, which are the subject of this patent, it will now become apparent to those of ordinary skill in the art that other embodiments incorporating these concepts, structures and techniques may be used. Additionally, elements of different embodiments described herein may be combined to form other embodiments not specifically set forth above.

Accordingly, it is submitted that that scope of the patent should not be limited to the described embodiments but rather should be limited only by the spirit and scope of the following claims.

What is claimed is:

1. A cryogenic electronic package, comprising:
a conventional and/or superconducting circuitized substrate having first and second opposing surfaces and including one or more interconnect pads disposed on at least one of the first and second surfaces;
an interposer having first and second opposing surfaces and including one or more interconnect pads disposed on at least one of the first and second surfaces, wherein the first surface of the interposed is disposed over and coupled to the second surface of the substrate;
a first superconducting multichip module (SMCM) having first and second opposing surfaces, wherein the first surface of the first SMCM is disposed directly on the second surface of the interposer and the second surface of the first SMCM is electrically coupled to the second surface of the interposer;
at least one first superconducting semiconductor structure having first and second opposing surfaces, wherein the first surface of the at least one first superconducting semiconductor structure is disposed over and coupled to the second surface of the first SMCM, and the first SMCM and the at least one first superconducting semiconductor structure are electrically coupled to the substrate through the interposer, wherein the interposer redistributes wirings of the first SMCM such that the interposer is capable of utilizing substantially all real estate of the circuitized substrate below the first surface of the first SMCM in order to miniaturize the cryogenic electronic package;
one or more first interconnect structures disposed between the second surface of the substrate and the first surface of the interposer and coupled to respective ones of the interconnect pads provided on the substrate and the interposer to form one or more electrical connections between the interposer and the substrate;
one or more second interconnect structures disposed between the second surface of the first SMCM and the first surface of the at least one first superconducting semiconductor structure and coupled to form one or more electrical connections between the at least one first superconducting semiconductor structure and the first SMCM;
an adhesive layer disposed between the second surface of the interposer and the first surface of the first SMCM; and
one or more conventional and/or superconducting wire bonding and/or ribbon bonding and/or spring bonding structures, wherein at least one of the bonding structures has a first portion electrically coupled to the second surface of the interposer, and a second opposing portion electrically coupled to the second surface of the first SMCM to form one or more electrical connections between the interposer and the first SMCM.

2. The cryogenic electronic package of claim 1 wherein at least one of the first and second interconnect structures includes at least one superconducting and/or a partially superconducting material.

3. The cryogenic electronic package of claim 1, further comprising:
a heat dissipation structure disposed beneath and coupled to the first surface of the substrate; and
a thermal interface structure or material disposed between the heat dissipation structure and the first surface of the substrate.

4. The cryogenic electronic package of claim 1 further comprising:
one or more third interconnect structures disposed between the second surface of the second SMCM and the first surface of the at least one second superconducting semiconductor structure and coupled to form one or more electrical connections between the at least one second superconducting semiconductor structure and the second SMCM.

5. The cryogenic electronic package of claim 4 wherein the interposer comprises a multi-layer high density superconducting and/or conventional circuitized substrate, and the first and second SMCMs both comprise silicon (Si) based SMCMs.

6. The cryogenic electronic package of claim 5 wherein the at least one first superconducting semiconductor structure and the at least one second superconducting semiconductor structure each comprise a plurality of single-flux-quantum (SFQ) integrated circuits (ICs).

7. A cryogenic electronic assembly, comprising:
a plurality of cryogenic electronic packages, each comprising:
a substrate having first and second opposing and including one or more interconnect pads disposed on at least one of the first and second surfaces
an interposer having first and second opposing surfaces and including one or more interconnect pads disposed on at least one of the first and second surfaces;

a superconducting multichip module (SMCM) having first and second opposing surfaces;

at least one superconducting semiconductor structure having first and second opposing surfaces;

one or more first interconnect structures, each of the first interconnect structures disposed between the substrate and the interposer and coupled to respective ones of the interconnected pads disposed on the substrate and the interposer; and one or more second interconnect structures disposed between the second surface of the SMCM and the first surface of the at least one superconducting semiconductor structure and coupled to form one or more electrical connections between the at least one superconducting semiconductor structure and the SMCM;

one or more third interconnect structures disposed directly on the second surface of the SMCM and the second surface of the interposer and coupled to form one or more electrical connections between the interposer and the SMCM, wherein the at least one superconducting semiconductor structure and the SMCM are electrically coupled to the substrate through the interposer;

means for electrically coupling the cryogenic electronic packages together through the first surface of the superconducting semiconductor structure, the second surface of the SMCM, the second surface of the interposer, the first surface of the interposer, and the second surface of the substrate;

wherein the means for electrically coupling the cryogenic electronic packages together comprises at least one connector having a first and second opposing portions, wherein the first portion of the at least one connector is coupled to a selected one of the interconnect pads provided on the substrate of a first selected one of the cryogenic electronic packages, and the second portion of the at least one connector is coupled to a selected one of the interconnect pads provided on the substrate of a second selected one of second cryogenic electronic packages, wherein the at least one connector comprise at least one of a flex connector, a ribbon connector, a coaxial connector, an optical connector or an optoelectronic connector;

an adhesive layer disposed between the second surface of the interposer and the first surface of the SMCM; and one or more wire bonding structures, wherein at least one of the wire bonding structures has a first portion electrically coupled to the second surface of the interposer, and a second opposing portion electrically coupled to the second surface of the SMCM to form one or more electrical connections between the interposer and the SMCM.

8. The cryogenic electronic assembly of claim 7 wherein the cryogenic electronic packages each further comprise:

a heat dissipation structure disposed beneath and coupled to the first surface of the substrate; and a thermal interface structure or material disposed between the heat dissipation structure and the first surface of the substrate.

9. The cryogenic electronic assembly of claim 7, wherein the plurality of cryogenic electronic packages includes four cryogenic electronic packages, wherein the first surface of the substrate of a first one of the cryogenic electronic packages is disposed over and coupled to the first surface of the substrate of a second one of the cryogenic electronic packages, and the first surface of the substrate of a third one of the cryogenic electronic packages is disposed over and coupled to the first surface of the substrate of a fourth one of the cryogenic electronic packages.

10. The cryogenic electronic assembly of claim 9, wherein the means for coupling the cryogenic electronic packages together comprises: a first plurality of conductive structures for coupling the first one of the cryogenic electronic packages to the second one of the cryogenic electronic packages, a second plurality of conductive structures for coupling the third one of the cryogenic electronic packages to the fourth one of the cryogenic electronic packages, and a connector for coupling the first and second ones of the cryogenic electronic packages to the third and fourth ones of the cryogenic electronic packages.

\* \* \* \* \*